US006753108B1

(12) United States Patent
Hampden-Smith et al.

(10) Patent No.: US 6,753,108 B1
(45) Date of Patent: Jun. 22, 2004

(54) ENERGY DEVICES AND METHODS FOR THE FABRICATION OF ENERGY DEVICES

(75) Inventors: Mark J. Hampden-Smith, Albuquerque, NM (US); Toivo T. Kodas, Albuquerque, NM (US); Plamen Atanassov, Albuquerque, NM (US); Paolina Atanassova, Albuquerque, NM (US); Klaus Kunze, Albuquerque, NM (US); Paul Napolitano, Albuquerque, NM (US); David Dericotte, Albuquerque, NM (US); Rimple Bhatia, Albuquerque, NM (US)

(73) Assignee: Superior MicroPowders, LLC, Albuquerque, NM (US)

( * ) Notice: Subject to any disclaimer, the term of this patent is extended or adjusted under 35 U.S.C. 154(b) by 0 days.

(21) Appl. No.: 09/589,710

(22) Filed: Jun. 8, 2000

Related U.S. Application Data

(63) Continuation-in-part of application No. 09/532,917, filed on Mar. 22, 2000, which is a continuation-in-part of application No. 09/141,397, filed on Aug. 27, 1998, which is a continuation-in-part of application No. 09/028,029, filed on Feb. 24, 1998, now abandoned, which is a continuation-in-part of application No. 09/028,277, filed on Feb. 24, 1998, now Pat. No. 6,277,169, which is a continuation-in-part of application No. 09/030,057, filed on Feb. 24, 1998, now Pat. No. 6,338,809.

(51) Int. Cl.[7] .......................... H01M 4/86; H01M 4/90; H01M 4/96; H01M 4/00
(52) U.S. Cl. ........................ 429/44; 429/27; 429/40; 429/42
(58) Field of Search ........................ 429/27, 40, 42, 429/44

(56) References Cited

U.S. PATENT DOCUMENTS

| 3,803,708 A | | 4/1974 | Wada et al. .................. 29/620 |
|---|---|---|---|
| 3,816,097 A | | 6/1974 | Daiga ........................... 75/0.5 |
| 3,956,014 A | * | 5/1976 | Landsman et al. ............ 429/42 |
| 3,961,987 A | | 6/1976 | Mund et al. ................... 136/86 |
| 4,052,336 A | | 10/1977 | van Montfoort et al. ... 252/447 |
| 4,113,921 A | | 9/1978 | Goldstein et al. ............. 429/27 |
| 4,130,506 A | | 12/1978 | Collier et al. ............... 252/438 |
| 4,136,059 A | | 1/1979 | Jalan et al. .................. 252/447 |
| 4,140,817 A | | 2/1979 | Brown ......................... 427/96 |
| 4,172,733 A | | 10/1979 | Moritsu et al. ............ 106/1.15 |
| 4,177,159 A | | 12/1979 | Singer ........................ 252/428 |
| 4,185,145 A | * | 1/1980 | Breault ........................ 429/34 |
| 4,233,181 A | | 11/1980 | Goller et al. ............. 252/425.3 |
| 4,266,977 A | | 5/1981 | Steiger ......................... 106/43 |
| 4,352,866 A | | 10/1982 | Klinedinst et al. .......... 429/101 |
| 4,391,844 A | * | 7/1983 | Baczek et al. ................ 427/44 |
| 4,395,279 A | | 7/1983 | Houck ........................... 75/0.5 |
| 4,444,852 A | * | 4/1984 | Liu et al. ...................... 429/29 |
| 4,476,002 A | * | 10/1984 | Howard et al. ............. 204/283 |
| 4,482,641 A | | 11/1984 | Wennerberg ................ 502/182 |
| 4,524,114 A | * | 6/1985 | Samuels et al. ............. 429/42 |
| 4,569,924 A | | 2/1986 | Ozin et al. .................. 502/184 |

(List continued on next page.)

FOREIGN PATENT DOCUMENTS

EP     0 331 009     2/1989

*Primary Examiner*—Patrick Ryan
*Assistant Examiner*—Julian Mercado
(74) *Attorney, Agent, or Firm*—Marsh Fischmann & Breyfogle LLP

(57) ABSTRACT

Energy devices such as batteries and methods for fabricating the energy devices. The devices are small, thin and lightweight, yet provide sufficient power for many handheld electronics.

33 Claims, 54 Drawing Sheets

U.S. PATENT DOCUMENTS

| | | | |
|---|---|---|---|
| 4,649,061 A | 3/1987 | Rangachar | 427/78 |
| 4,652,537 A | 3/1987 | Tamura et al. | 502/5 |
| 4,752,456 A | 6/1988 | Yoda et al. | 423/291 |
| 4,781,995 A * | 11/1988 | Giner | 429/13 |
| 4,787,964 A * | 11/1988 | Gordon et al. | 204/282 |
| 4,822,410 A | 4/1989 | Matovich | 75/0.5 |
| 4,970,128 A | 11/1990 | Itoh et al. | 429/42 |
| 4,970,189 A | 11/1990 | Tachibana | 502/183 |
| 5,032,242 A | 7/1991 | Knudsen et al. | 204/157.41 |
| 5,068,161 A | 11/1991 | Keck et al. | 429/44 |
| 5,120,699 A | 6/1992 | Weiss et al. | 502/185 |
| 5,158,843 A | 10/1992 | Batson et al. | 429/218 |
| 5,264,201 A | 11/1993 | Dahn et al. | 423/594 |
| 5,294,499 A | 3/1994 | Furukawa et al. | 429/164 |
| 5,318,797 A | 6/1994 | Matijevic et al. | 427/213.31 |
| 5,338,330 A | 8/1994 | Polizzotti et al. | 75/228 |
| 5,421,854 A | 6/1995 | Kodas et al. | 75/355 |
| 5,429,657 A | 7/1995 | Glicksman et al. | 75/351 |
| 5,432,022 A * | 7/1995 | Cheiky | 429/27 |
| 5,439,502 A | 8/1995 | Kodas et al. | 75/365 |
| 5,453,169 A | 9/1995 | Callstrom et al. | 204/242 |
| 5,501,915 A | 3/1996 | Hards et al. | 429/42 |
| 5,561,000 A * | 10/1996 | Dirven et al. | 429/42 |
| 5,567,662 A | 10/1996 | Dunmead et al. | 501/87 |
| 5,589,300 A | 12/1996 | Fauteux et al. | 429/218 |
| 5,636,437 A | 6/1997 | Kaschmitter et al. | 29/825 |
| 5,767,036 A | 6/1998 | Freund et al. | 502/185 |
| 5,876,867 A | 3/1999 | Itoh et al. | 429/44 |
| 5,972,525 A | 10/1999 | Mori et al. | 428/632 |
| 6,069,107 A | 5/2000 | Kuznetsov et al. | 502/101 |

(List continued on next page.)

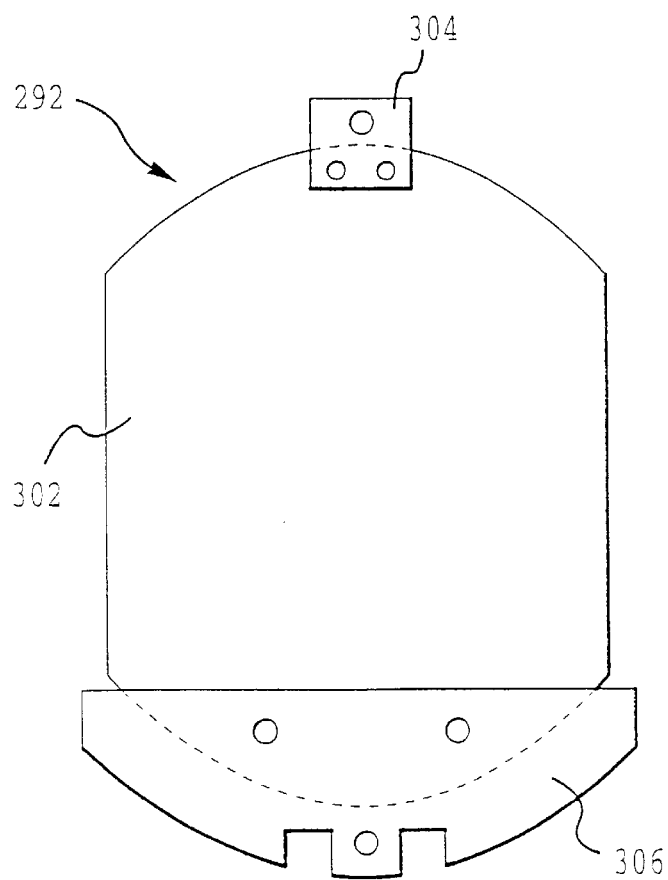 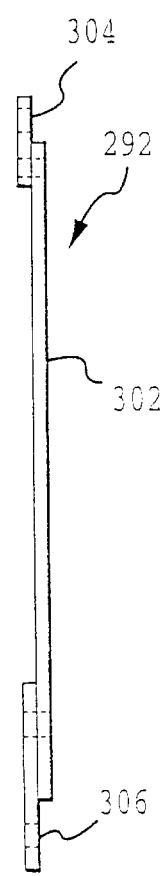
Fig. 28                    Fig. 29

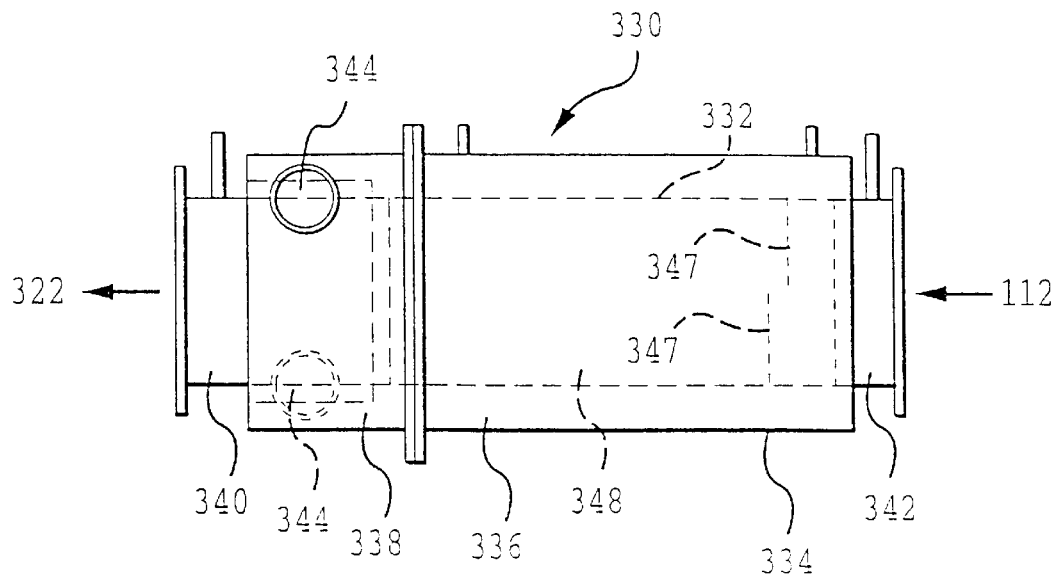
Fig. 31
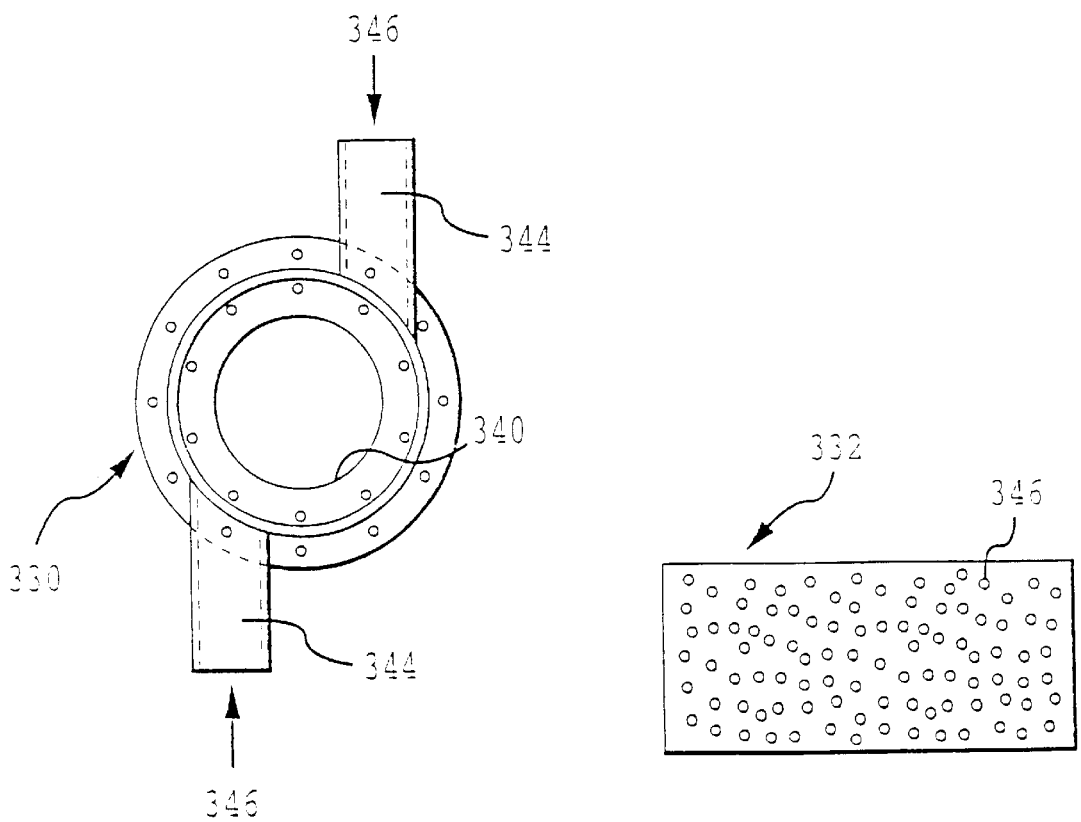
Fig. 32
Fig. 33

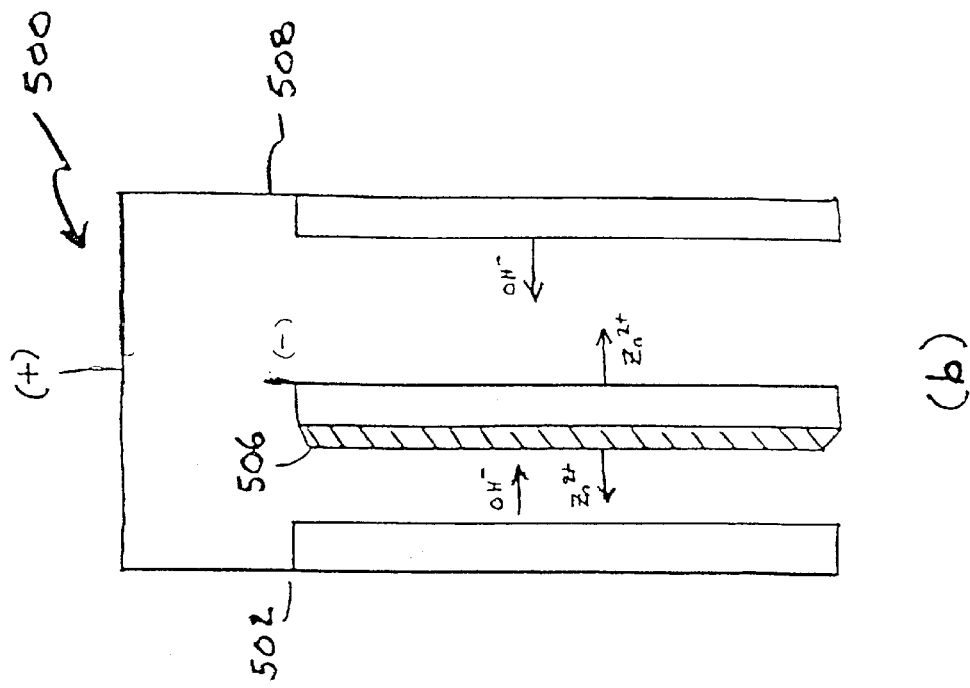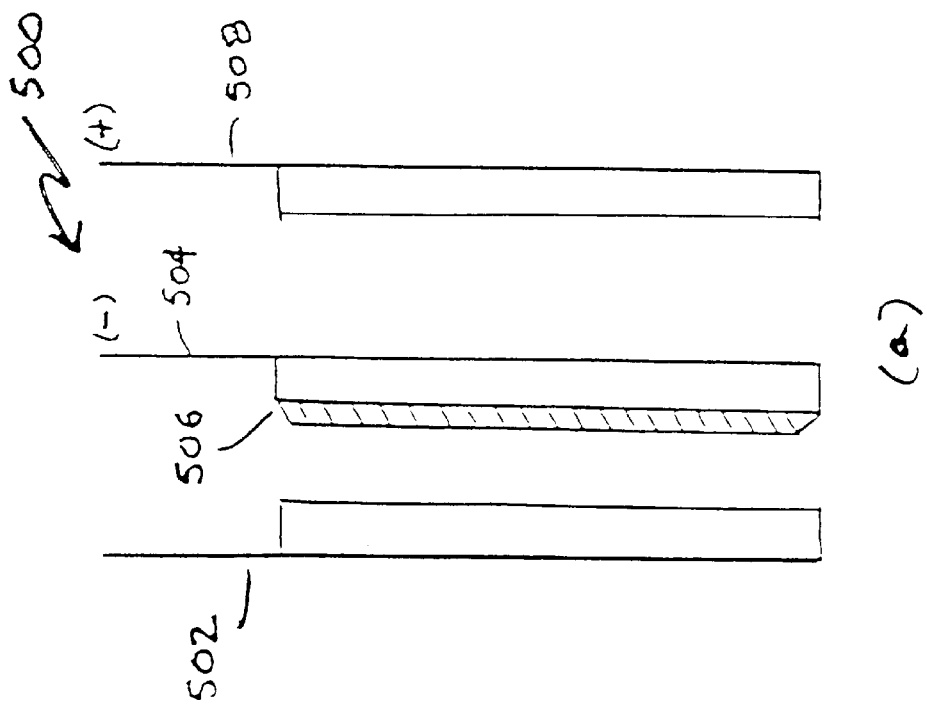
Fig. 48

ENERGY DEVICES AND METHODS FOR THE FABRICATION OF ENERGY DEVICES

CROSS-REFERENCE TO RELATED APPLICATIONS

This is a continuation-in-part application of U.S. patent application Ser. No. 09/532,917 filed on Mar, 22, 2000, which is a continuation-in-part application of U.S. patent application Ser. No. 09/141,397, filed Aug. 27,1998 which in turn is a continuation-in-part application of U.S. patent application Ser. No. 09/028,029, now abandoned, Ser. No. 09/028,277, now U.S. Pat. No. 6,277,169 and Ser. No. 09/030,057, now U.S. Pat. No. 6,338,809, each filed on Feb. 24, 1998.

STATEMENT REGARDING FEDERALLY FUNDED RESEARCH

This invention was made with United States Government support under Cooperative Agreement No. 70NANB8H4045 awarded by the National Institute for Standards and Technology (NIST).

BACKGROUND OF THE INVENTION

1. Field of the Invention

The present invention relates to energy devices such as batteries and fuel cells and also relates to methods for the fabrication of such devices. Specifically, the present invention is directed to energy devices having a reduced thickness that can be fabricated using traditional or non-traditional methods to form thin layers within the device.

2. Description of Related Art

With the advent of portable and hand-held electronic devices and an increasing demand for electric automobiles due to the increased strain on non-renewable natural resources, there is a need for the rapid development of high performance, economical power systems, for example batteries and fuel cells, that have a reduced size and weight.

The further size reduction of portable electronic devices is limited by the inability to provide sufficient power without adding substantial bulk to the device. For example, most of the volume and weight of a typical cellular telephone resides not in the telephone electronics but in the battery required to power the telephone. Small computing devices such as laptop computers and personal digital assistants (PDA's) would also benefit from smaller, lighter batteries. Other potential uses for small, lightweight batteries include global positioning system (GPS) transceivers.

Batteries can be divided into primary (non-rechargeable) and secondary (rechargeable) batteries. Common types of primary batteries include metal-air batteries such as Zn-air, Li-air and Al-air, alkaline batteries and lithium batteries. Common types of secondary batteries include nickel-cadmium, nickel metal hydride and lithium ion batteries.

One type of metal-air battery which offers many competitive advantages is the zinc-air battery, which relies upon the redox couples of oxygen and zinc to produce energy. Zinc-air batteries operate by adsorbing oxygen from the surrounding air and reducing the oxygen using an oxygen reduction catalyst at the air electrode (cathode). As the oxygen is reduced, zinc metal is oxidized. The reactions of a zinc-air alkaline battery during discharge are:

Cathode: $O_2 + 2H_2O + 4e^- \rightarrow 4OH^-$

Anode: $2Zn \rightarrow 2Zn^{2+} + 4e^-$

Overall: $2Zn + O_2 + 2H_2O \rightarrow 2Zn(OH)_2$

Typically, air electrodes are alternatively stacked with zinc electrodes and are packaged in a container that is open to the air. When the battery cell discharges, oxygen is reduced to $O^{2-}$ at the cathode while zinc metal is oxidized to $Zn^{2+}$ at the anode. Since Zn can be electrodeposited from aqueous electrolytes to replenish the anode, zinc-air batteries can be secondary batteries as well as primary batteries.

Among the advantages of secondary zinc-air batteries over other rechargeable battery systems are safety, long run time and light weight. The batteries contain no toxic materials and operate at one atmosphere of pressure. They can operate as long as 10 to 14 hours, compared to 2 to 4 hours for most rechargeable lithium-ion batteries and can be stored for long periods of time without losing their charge. The light weight of zinc-air batteries leads to good power density (power per unit of weight or volume), which is ideal for portable applications.

The two major problems associated with secondary zinc-air batteries, however, are limited total power and poor rechargeability/cycle lifetime. Increased power is becoming a major area of attention for battery manufacturers trying to meet the increased demands of modern electronics. Current zinc-air batteries can deliver from about 200 to 450 W/kg which may enable the batteries to be used in certain low-power laptops and other portable devices that have relatively low power requirements. Most laptops and other portable electronic devices, however, require batteries that are able to provide a level of power that is higher than the capabilities of current zinc-air batteries. The main reason for the low power of zinc-air batteries is believed to be related to the inefficiency of the catalytic reaction to reduce oxygen in the air electrodes. Poor accessibility of the catalyst and the local microstructural environment around the catalyst and adjoining carbon reduces the efficiency of the oxygen reduction. See, for example, P. N. Ross et al., *Journal of the Electrochemical Society*, Vol. 131, pg. 1742 (1984).

Rechargeability is also a problem with zinc-air batteries. The batteries have a short cycle life, degrading significantly in performance after about 200 recharging cycles or less. The short cycle life of zinc-air batteries is also believed to be related to the catalyst used in the air electrodes. Specifically, it is believed that corrosion of the carbon used for the electrocatalyst in these systems leads to a loss in capacity and a decreased discharge time.

Primary (non-rechargeable) alkaline zinc-air batteries are currently used to power hearing aids and other devices that require low current densities over long periods of time. Zinc-air hearing aid batteries also include an air cathode and a zinc-based anode. The electrocatalyst powder is formed into a layer for the air cathode which catalytically converts oxygen in the air into hydroxide ion. The hydroxide ion is then transported in an alkaline electrolyte through a separator to the anode where it reacts with zinc to form zincate ion ($Zn(OH)_4^{2-}$) and zinc ion ($Zn^{2+}$) and liberates electrons. Improved electrocatalytic layers at the air cathode would advantageously extend the life of such primary batteries.

In addition to improvements in energy storage, there is a need for improvements in environmentally friendly and economical energy production. Fuel cells are electrochemical devices which are capable of converting the energy of a chemical reaction into electrical energy without combustion and with virtually no pollution. Fuel cells are unlike batteries because fuel cells convert chemical energy to electrical energy as the chemical reactants are continuously delivered to the fuel cell. When the fuel cell is off, it has zero electrical potential. As a result, fuel cells are typically used to produce a continuous source of electrical energy and compete with other forms of continuous electrical energy production such as the combustion engine, nuclear power stations and coal-fired power stations. The different types of fuel cells are categorized by the electrolyte used in the fuel cell. The five main types of fuel cells are alkaline, molten carbonate, phosphoric acid, solid oxide and proton exchange membrane (PEM) or solid polymer.

One of the critical requirements for these energy devices is the efficient catalytic conversion of the reactants and a significant obstacle to the wide-scale commercialization of such devices is the need for highly efficient electrocatalytic layers for this conversion process.

One example of a fuel cell utilizing electrocatalytic layers for the chemical reactions is a PEM fuel cell. A PEM fuel cell stack includes hundreds of membrane electrode assemblies (MEA's) each including a cathode and anode constructed from, for example, carbon cloth. The anode and cathode sandwich a proton exchange membrane which has a catalyst layer on each side of the membrane. Power is generated when hydrogen is fed into the anode and oxygen (air) is fed into the cathode. In a reaction typically catalyzed by a platinum-based catalyst in the catalyst layer of the anode, the hydrogen ionizes to form protons and electrons. The protons are transported through the proton exchange membrane to a catalyst layer on the opposite side of the membrane (the cathode) where another catalyst, typically platinum or a platinum alloy, catalyzes the reaction of the protons with oxygen to form water. The reactions can be written as follows:

Anode: $2H_2 \rightarrow 4H^+ + 4e^-$

Cathode: $4H^+ + 4e^- + O_2 \rightarrow 2H_2O$

Overall: $2H_2 + O_2 \rightarrow 2H_2O$

The electrons formed at the anode are routed to the cathode through an electrical circuit which provides the electrical power.

The critical issues that must be addressed for the successful commercialization of fuel cells are cell cost, cell performance and operating lifetime. With respect to cell performance, improved power density is critical for automotive applications whereas higher voltage efficiencies are necessary for stationary applications. In terms of fuel cell cost, current fuel cell stacks employ MEA's that include platinum electrocatalysts with a loading of about 4 milligrams of platinum per square centimeter on each of the anode and cathode. At a typical cell performance of 0.42 watts per square centimeter, about 19 grams of platinum per kilowatt is required (8 mg Pt per $cm^2$ divided by 0.42 watts per $cm^2$). Platinum metal is very expensive and a significant cost reduction in the electrocatalyst is necessary for these cells to become economically viable. However, reducing the amount of precious metal is not a suitable solution because there is also a strong demand for improved cell performance which relies on the presence of a sufficient amount of platinum electrocatalyst.

The major technical challenge is improving the performance of the cathode with air as the oxidant. Platinum metal electrocatalysts for oxygen reduction are used in both alkaline and acid electrolyte media and are used in many types of fuel cells including PEM fuel cells, alkaline fuel cells and hybrid fuel cells.

The miniaturization of such devices while providing sufficient electrical energy to power electronic devices has only been moderately successful. Among the reasons for the difficulty in fabricating such devices is the lack of adequate materials and a manufacturing method for forming very thin layers having good electrical properties including high electrocatalytic activity.

The conventional synthesis of electrocatalyst powders that include an active species on a support material involves several steps. First, an appropriate high surface area catalyst support (e.g., alumina, titania, silica or carbon) is impregnated with a solution containing a precursor to the active species. Sufficient contact time is maintained for the adsorption of the active species precursor to occur and to achieve a uniform deposition of the precursor on the support surface. The catalyst is then dried to remove the solvent, for example at temperatures of 100° C. to 120° C. for about 2 to 12 hours. The catalyst is then heated to elevated temperatures, typically 400° C. to 600° C. in air, so that the precursor is converted to the active species. Typically, oxide catalysts do not require further treatment.

The foregoing method generally results in poor control over the composition and microstructure of the composite electrocatalyst powders. The morphology and surface area of the electrocatalyst powders are characteristics that have a critical impact on the performance of the catalyst. The morphology determines the packing density and the surface area determines the type and number of surface adsorption centers where the active species are formed during synthesis of the electrocatalyst. The inability to control the fundamental electrocatalyst powder characteristics is a major obstacle for the future development of improved energy storage and energy production devices, particularly those having a reduced size.

BRIEF DESCRIPTION OF THE DRAWINGS

FIG. 28 is a front view of an impactor plate assembly of the impactor shown in FIG. 25.

FIG. 29 is a side view of the impactor plate assembly shown in FIG. 28.

FIG. 30 is a process block diagram of one embodiment of the present invention including a particle cooler.

FIG. 31 is a top view of a gas quench cooler of the present invention.

FIG. 32 is an end view of the gas quench cooler shown in FIG. 31.

FIG. 33 is a side view of a perforated conduit of the quench cooler shown in FIG. 31.

FIG. 34 is a side view showing one embodiment of a gas quench cooler of the present invention connected with a cyclone.

FIG. 35 is a block diagram of one embodiment of the present invention including a particle modifier.

FIG. 36 illustrates an SEM photomicrograph of TEFLON-coated carbon particles according to an embodiment of the present invention.

FIG. 37 illustrates an SEM photomicrograph of electrocatalyst particles according to an embodiment of the present invention.

FIGS. 38(*a*) and (*b*) illustrate direct-write deposition methods according to the present invention.

FIG. 39 illustrates the 3-phase boundary an air cathode of a metal/air battery.

FIG. 40 illustrates an air cathode according to an embodiment of the present invention.

FIG. 41 illustrates a photomicrograph of a current collector according to an embodiment of the present invention.

FIG. 42 illustrates an air cathode according to another embodiment of the present invention.

FIG. 43 illustrates an air cathode according to another embodiment of the present invention.

FIG. 44 illustrates an air cathode according to another embodiment of the present invention.

FIG. 45 illustrates an air cathode according to another embodiment of the present invention.

FIG. 46 illustrates an air cathode according to an embodiment of the present invention including a plurality of monolayers constituting the electrode.

FIGS. 47(*a*) and (*b*) illustrate the incorporation of a carbon dioxide reduction layer into an air cathode according to the present invention.

FIGS. 48(*a*) and (*b*) illustrate a zinc-air battery according to an embodiment of the present invention.

FIG. 49 illustrates a metal/air battery according to an embodiment of the present invention.

FIG. 50 illustrates a metal/air battery according to an embodiment of the present invention.

FIG. 51 illustrates a membrane electrode assembly according to an embodiment of the present invention.

FIG. 52 illustrates an SEM photomicrograph of an ultrasonically generated electrocatalyst powder according to an embodiment of the present invention.

FIG. 53 illustrates a TEM photomicrograph of an ultrasonically generated electrocatalyst powder according to an embodiment of the present invention.

FIG. 54 illustrates the particle size distribution of an ultrasonically generated electrocatalyst powder according to an embodiment of the present invention.

FIG. 55 illustrates the particle size distribution of an ultrasonically generated electrocatalyst powder according to an embodiment of the present invention.

FIG. 56 illustrates an SEM photomicrograph of a spray dried electrocatalyst powder according to an embodiment of the present invention.

FIG. 57 illustrates the particle size distribution of a spray dried electrocatalyst powder according to an embodiment of the present invention.

FIG. 58 illustrates the dependence of electrocatalytic activity on $MnO_x$ duster size for an electrocatalyst powder according to an embodiment of the present invention.

FIG. 59 illustrates the dependence of electrocatalytic activity on the relative intensity of XPS peaks for an electrocatalyst powder according to the present invention.

FIG. 60 illustrates the effect of increasing manganese concentration on surface area for a high surface area electrocatalyst powder according to an embodiment of the present invention.

FIG. 61 illustrates the effect of increasing manganese concentration on surface area for a high surface area electrocatalyst powder according to an embodiment of the present invention.

FIG. 62 illustrates the effect of manganese concentration on the dispersion of the active species on a high surface area electrocatalyst powder according to the present invention.

FIG. 63 illustrates the effect of manganese concentration on the dispersion of the active species on a high surface area electrocatalyst powder according to the present invention.

FIG. 64 illustrates the efficiency of a bi-functional electrocatalyst powder according to the present invention when applied for oxygen reduction reaction.

FIG. 65 illustrates the efficiency of a bi-functional electrocatalyst powder according to the present invention when applied for oxygen evolution reaction.

DETAILED DESCRIPTION OF THE INVENTION

Figure 1:
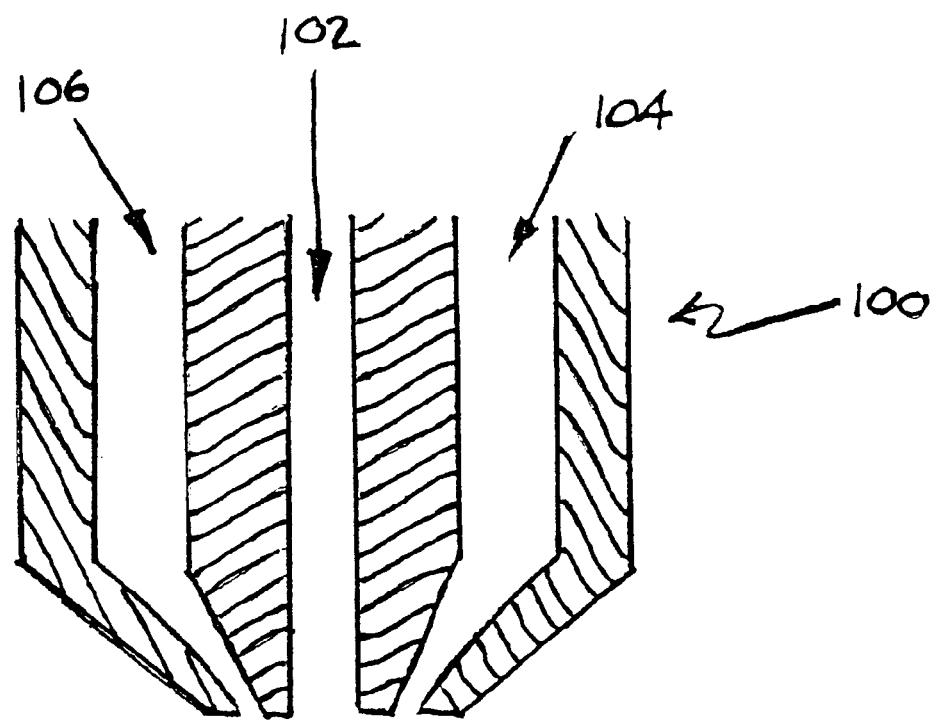
FIG. 1 illustrates a two-fluid nozzle that is useful for the production of powders according to the present invention.
Figure 2:
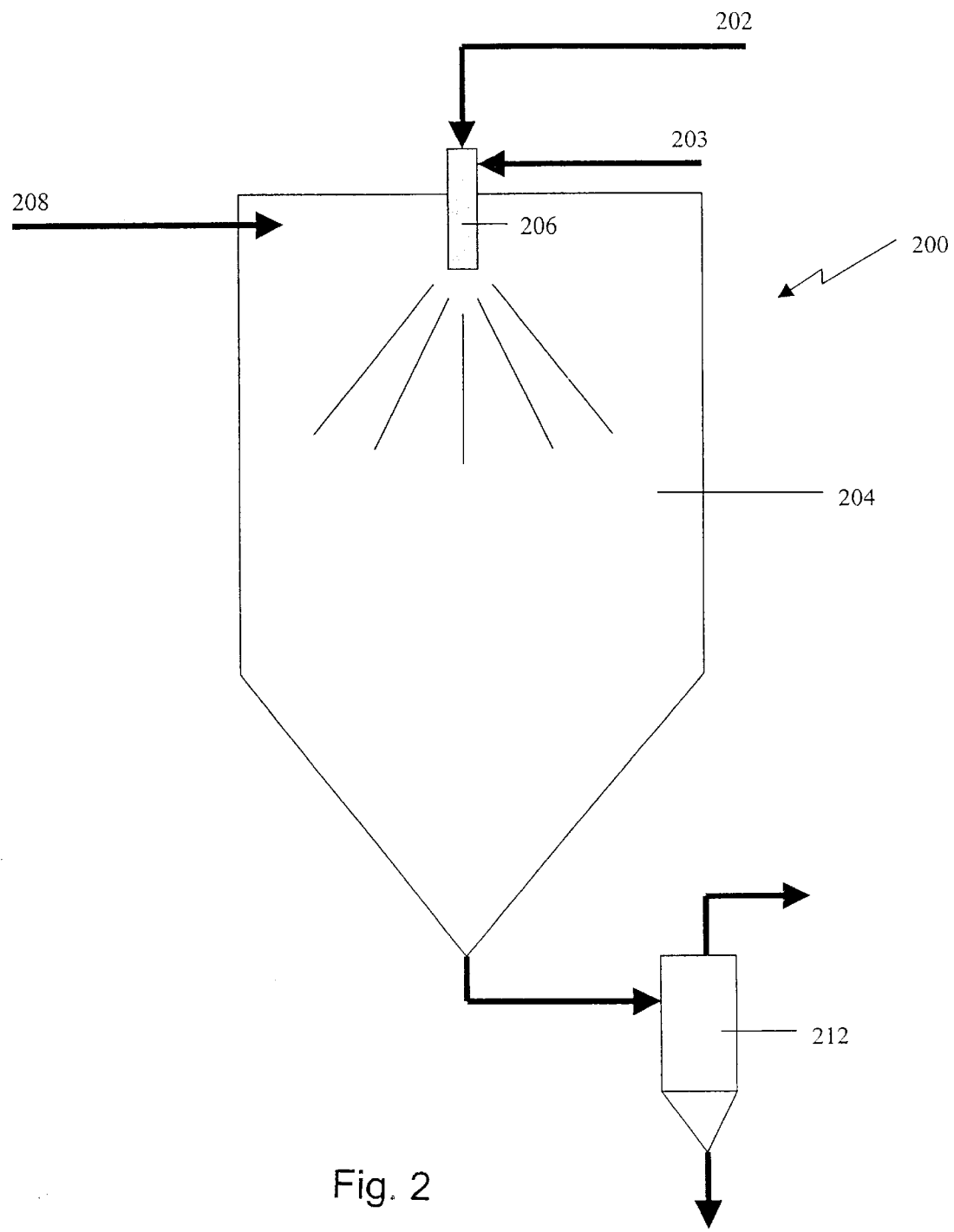
FIG. 2 illustrates a spray dryer that is useful for the production of powder according to the present invention.
Figure 3:
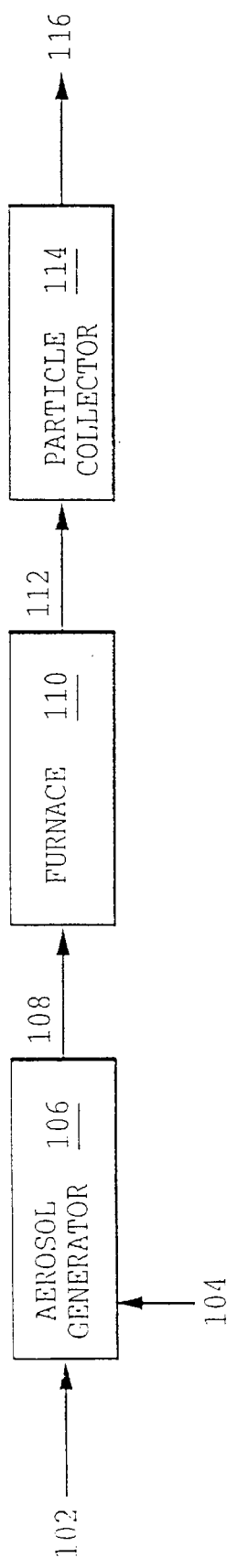
FIG. 3 is a process block diagram showing one embodiment of the process of the present invention.

The present invention is directed to energy devices such as primary batteries, secondary batteries and fuel cells that are fabricated using fine particles that have unique chemical and physical characteristics, resulting in devices having improved efficiency. The fine particles can advantageously have controlled chemistry, a small size and a spherical morphology. The buoyancy of the particles in a liquid suspension can also be controlled so that the particles can be adequately suspended in a liquid vehicle for deposition using a direct-write tool. In one embodiment, the energy devices include components such as electrodes that are finer and/or thinner than those fabricated by conventional routes, enabling the formation of devices having a reduced thickness. The electrodes can be fabricated so that the multiple layers typically associated with an electrode are combined into a multi-functional layer, such as a layer having a compositional gradient through the thickness of the layer.

The terms fine powder or fine particles, as used herein, encompass essentially any particulate element or compound having the physical particle characteristics described hereinbelow. Preferred fine powders for the fabrication of primary batteries, secondary batteries and fuel cells include electrocatalyst powders and other electrically useful powders, as is discussed below.

Particularly preferred according to the present invention are composite electrocatalyst powders. As used herein, composite electrocatalyst powders or particles are those that include within the individual particles at least a first active species phase, such as a metal or a metal oxide, that is dispersed on a support phase, such as carbon or a metal oxide. The composite powder batches of the present invention are not mere physical admixtures of compositionally different particles, but are comprised of particles that include both an active species phase and a support phase. The compositions of the particle components can be varied independently and various combinations of carbon, metals, metal alloys, metal oxides, mixed metal oxides, organometallic compounds and their partial pyrolysis products can be produced as may be required for a particular application. Two or more different materials can be utilized as the active species phase. As an example, combinations of Ag and $MnO_x$ on a carbon support phase can be useful for some electrocatalytic applications. Other examples of multiple active species are mixtures of porphyrins, partially decomposed porphyrins, Co and CoO. Although carbon is a preferred material for the support phase, other materials such as metal oxides can also be useful as the support phase.

In one preferred embodiment, the electrocatalyst powder can include composite metal-carbon electrocatalyst particles. Composite metal-carbon electrocatalyst particles include an active species of at least a first metallic phase dispersed on a carbon support phase. The metallic phase can include any metal and the particularly preferred metal will depend upon the application of the powder. The metallic phase can be metal alloy wherein a first metal is alloyed with one or more alloying elements. As used herein, the term metal alloy includes intermetallic compounds between two or more metals. The composite metal-carbon electrocatalyst powders can also include two or more metals dispersed on the carbon support as separate phases.

Preferred metals for the electrocatalytically active species include the platinum group metals and noble metals, particularly Pt, Ag, Pd, Ru, Os and their alloys. The active species phase can also include a metal selected from the group consisting of Ni, Rh, Ir, Co, Cr, Mo, W, V, Nb, Al, Ta, Ti, Zr, Hf, Zn, Fe, Cu, Ga, In, Si, Ge, Sn, Y, lanthanide metals and combinations or alloys of these metals. Preferred metal alloys for use according to the present invention include alloys of Pt with other metals, such as Ru, Os, Cr, Ni, Mn and Co. Particularly preferred among these is Pt/Ru for use in hydrogen anodes and Pt/Cr/Co for use in oxygen cathodes.

Another preferred embodiment of the present invention is directed to metal oxide-carbon composites that include an active metal oxide species dispersed on a carbon support phase. The metal oxide active species phase can be selected from the oxides of transition metals, preferably those existing in oxides of variable oxidation states, and preferably from those having an oxygen deficiency in their crystalline structure.

For example, the dispersed metal oxide can be an oxide of a metal selected from the group consisting of Au, Ag, Pt, Pd, Ni, Co, Rh, Ru, Fe, Mn, Cr, Mo, Re, W, Ta, Nb, V, Hf, Zr, Ti and Al. A particularly preferred metal oxide according to the present invention is manganese oxide ($MnO_x$, where x has a value from 1 to 2). The dispersed metal oxide active phase can include a mixture of different metal oxides, solid solutions of two or more different metal oxides or double oxides. The metal oxides can be stoichiometric or non-stoichiometric and can be a mixture of one metal oxide having different oxidation states. The metal oxides can also be amorphous.

For some applications such as secondary metal-air batteries, examples of electrocatalyst particles that can be used to catalyze the reduction and oxidation reactions according to the present invention include oxygen deficient metal oxides and metal oxides capable of undergoing reduction/oxidation reactions due to variations in the oxidation states of the metals contained in the metal oxide. Some compounds are multi-functional, providing numerous attributes in one compound. Such oxides do not necessarily have to be dispersed on a support phase.

For example, perovskite phase oxides can be used for electrocatalysts wherein the oxides provide electrocatalytic activity, a high surface area and electrical conductivity. Specific examples of such perovskite phase oxides include $La_{1-x}Sr_xFe_{0.6}CoO_{0.4}O_3$ (where x is from 0 to 1) and $La_{1-x}Ca_xCoO_3$ (where x is from 0 to 1). One particularly preferred metal oxide electrocatalyst according to the present invention is an oxygen-deficient cobalt-nickel oxide, Co—Ni—O, which is useful for electrodes in metal hydride batteries. Although the crystalline phase is nominally $NiCo_2O_4$, the crystalline phase and hence the electrocatalytic activity can be well controlled. Other metal oxides within this category include spinels of the general formula $AB_2O_4$ where A is selected from a divalent metal such as Mg, Ca, Sr, Ba, Fe, Ru, Co, Ni, Cu, Pd, Pt, Eu, Sm, Sn, Zn, Cd, Hg or combinations thereof and B is selected from trivalent metals such as Co, Mn, Re, Al, Ga, In, Fe, Ru, Os, Cr, Mo, W, Y, Sc, lanthanide metals or combinations thereof. Other useful metal oxides include the oxides of Ni, Co, Fe, Ti, Zr, Zn, In, In—Sn, Ga, Ru, Cr, Mo, W, Cu, Va, Ng and Ta metal gallates, metal ruthenates, and copper containing perovskite phase metal oxides.

A further class of catalysts that can be useful according to the present invention are those derived from molecular compounds that are either dispersed on a support phase or that have no support phase. Examples of such materials are metal porphyrin complexes which catalyze the reduction Of $O_2$ to $OH^-$ but are oxidized during the oxidation of $OH^-$. These species are suitable for primary batteries and fuel cells such as alkaline fuel cells. Included in this group are metal porphyrin complexes of Co, Fe, Zn, Ni, Cu, Pd, Pt, Sn, Mo, Mn, Os, Ir and Ru. Other metal ligand complexes can be active in these catalytic oxidation and reduction reactions and can be formed by the methods described herein. Such metal ligands can be selected from the class of N4-metal chelates, represented by porphyrins, tetraazaanulens, phtalocyanines and other chelating agents. In some cases the organic ligands are active in catalyzing reduction and oxidation reactions and in some cases the ligands are active when they remain intact, as might be the case for an intact porphyrin ring system, or they might be partially reacted during thermal processing to form a different species that could also be active in the catalytic reactions. An example is the reaction product derived from porphyrins or other organic compounds.

Carbon is required for the reduction of $O_2$ to $OH^-$ and is believed to be involved in the reduction of peroxide to hydroxide ion. Other carbon-based active species include homo- and hetero-fullerene and carbon nanotube based materials.

With respect to the composite electrocatalyst particles, the characteristics of the secondary support phase, the primary particles constituting the support phase and the active species can be independently controlled to yield different performance characteristics for a particular application.

Many primary and secondary batteries utilize lithium-based fine powders for an electrode material and the present invention is also applicable to fine powders of $LiCoO_2$, $LiNiO_2$ and $LiMn_2O_4$, as well as other lithium-based compounds.

Powders of metals and metal alloys (including intermetallic compounds) are also useful for electrodes, particularly anodes in certain battery cells. Examples of such metal compounds include $LaNi_5$, La—Ni—Co—Al, Nd—Ce—Ni—Co—Al and V—Ti—Zr—Ni.

In addition to the electrocatalytic powders, other fine powders are useful for fabricating energy device components according to the present invention. Among these are the supporting materials, hydrophobic materials, electroconductive materials and insulator materials such as dielectrics for separating membranes. For example, metals such as silver (Ag) and nickel (Ni) are useful for the current collectors in battery cells.

According to one embodiment of the present invention, carbon particles are "Teflonized" by coating the carbon particles with a tetrafluoroethylene (TFE) fluorocarbon polymer such as TEFLON (E.I. du Pont de Nemours, Wilmington, Del.). These Teflonized carbon particles can be used to form hydrophobic layers in an energy device, as is discussed below. The hydrophobicity can be controlled by controlling the ratio of TEFLON to carbon. For some applications, TEFLON can also be deposited on electrocatalyst particles.

As is discussed above, the composite electrocatalyst powders include a secondary support phase typically consisting of agglomerates of smaller primary particles such as carbon or a metal oxide which supports the active species. Two or more types of primary particles can be mixed to form the secondary support phase. As an example, two or more types of particulate carbon (e.g., amorphous and graphitic) can be combined to form the secondary support phase. The two types of particulate carbon can have different performance characteristics that combine to enhance the performance of the catalyst.

It is an advantage of the present invention that the composition of the electrocatalyst particles can be homogeneous. A degree of homogeneity in materials is often not obtainable by traditional forming methods such as liquid precipitation. However, it is also possible according to the present invention to provide compositional gradients within the electrocatalyst particles. For example, the active species concentration in a composite particle can be higher or lower at the surface of the support phase than near the center and gradients corresponding to compositional changes of 10 to 100 weight percent can be obtained. When the particles are deposited by direct-write deposition, the particles retain their structural morphology and therefore the functionality of the compositional gradient can be exploited.

The preferred form of carbon for crystalline supported materials are those which are amorphous. The preferred carbons for supported metals like Pt are carbons that are crystalline since Pt dispersion is favored by reduced carbon surfaces since such surfaces have substantially no surface hydroxyls. For supported $MnO_x$, it is preferred to have a crystalline carbon support. Preferably, the crystallinity of the primary particles constituting the support phase is controlled through the proper selection of precursor materials. Graphitic carbon is preferred for long term operational stability of fuel cells and batteries. Amorphous carbon is preferred when a smaller crystallite size is desired for the supported active species.

The overall density of the secondary support phase is related to the porosity of the support phase. It is preferred that the accessible (e.g., open) porosity in the composite electrocatalyst particles is at least about 5 percent and more preferably is at least about 40 percent. The pore size and size distribution in the secondary support phase can also be controlled and the average pore size is preferably from about 10 to 100 nanometers. High porosity is advantageous for rapid transport of species into and out of the secondary structures. Lower particle densities also permit the particles to be suspended in a liquid vehicle for use in printing techniques such as ink jet deposition where suspension of particles for long periods is required. As an example, an aerogel carbon or metal oxide can have a density much lower than 1 g/cm$^3$.

Agglomeration of the electrocatalyst particles can affect the properties of the particles such as dispersion into liquids used to deposit the particles. It is therefore preferred that minimal agglomeration of the particles exist in the powder batch.

It is also an advantage of the present invention that the fine particles are substantially spherical in shape. That is, the particles are preferably not jagged or irregular in shape. Spherical particles can advantageously be deposited using a variety of techniques, including direct-write deposition, and can form smooth, thin layers that have a high packing density.

In addition, the composite electrocatalyst powders according to the present invention have a surface area of at least about 25 m$^2$/g, more preferably at least about 90 m$^2$/g and even more preferably at least about 600 m$^2$/g. Surface area is typically measured using the BET nitrogen adsorption method which is indicative of the surface area of the powder, including the surface area of accessible pores on the surface of the particles. High surface area generally leads to increased catalytic activity.

The composite electrocatalyst particles preferably include a carbon support with at least about 10 weight percent and more preferably at least about 20 weight percent of the catalytically active species dispersed on the support surface. The particles preferably include not greater than about 90 weight percent, more preferably not greater than about 80 weight percent carbon. In one embodiment, the composite particles include from about 20 to about 40 weight percent of the active species phase. It has been found that such compositional levels give rise to the most advantageous electrocatalyst properties. However, the preferred level of the active species dispersed on the carbon support will depend upon the total surface area of the carbon, the type of active species and the application of the powder. A carbon support having a very high surface area will accommodate a higher percentage of metal on its surface and is therefore preferred.

It is preferred that the average size of the active species phase dispersed on the carbon support is such that the particles include small single crystals or crystallite clusters, collectively referred to herein as clusters. Accordingly, the average active species cluster size is preferably not greater than about 20 nanometers, more preferably is not greater than about 10 nanometers and even more preferably is not greater than about 5 nanometers, such as from about 0.5 to 5 nanometers. According to one embodiment of the present invention, at least about 20 weight percent and more preferably at least about 30 weight percent of the active species clusters have a size of not greater than about 3 nanometers. Composite electrocatalyst powders having such small crystallite clusters advantageously have enhanced catalytic properties as compared to composite powders comprising an active species phase having larger crystallites. The powder production method of the present invention advantageously permits control over the crystallinity by controlling the reaction temperature and/or residence time, as is discussed below.

When the active species includes a metal, the oxidation state of the metal in the metal phase is preferably close to zero, i.e., a pure metal. It is believed that higher oxidation states are detrimental to electrocatalyst powder activity. The powder production method of the present invention advantageously enables good control over the oxidation state of the metal.

The fine powders of the present invention have a well-controlled particle size. Preferably, the volume average particle size is not greater than about 100 μm, more preferably not greater than about 20 μm, even more preferably not greater than about 10 μm and even more preferably not greater than about 5 μm. Further, it is preferred that the volume average particle size is at least about 0.3 μm, more preferably at least about 0.5 μm and even more preferably at least about 1 μm. As used herein, the average particle size is the median particle size ($d_{50}$). Powder batches having an average particle size within the preferred parameters disclosed herein enable the formation of thin electrocatalytic layers which are advantageous for producing energy device such as batteries and fuel cells according to the present invention.

The size distributions of the secondary support phase, the primary particles, and the active species phase are important in determining performance and can be controlled using the powder production method according to the present invention. Narrower particle size distributions are preferred for the secondary support phase to allow printing of the particles through a narrow orifice without clogging. For example, it is preferred that at least about 50 weight percent of the particles have a size of not greater than about two times the average particle size and it is more preferred that at least about 75 weight percent of the particles have a size of not greater than about two times the average particle size. The particle size distribution can be bimodal or trimodal which can advantageously provide improved packing density in deposited layers.

The powders produced by the processes described herein, namely spray pyrolysis or spray conversion, can include some agglomerates of spherical particles. Micrometer-sized particles often form soft agglomerates as a result of their relatively high surface energy (compared to larger particles). Such soft agglomerates may be dispersed easily by treatments such as exposure to ultrasound in a liquid medium or sieving. The particle size distributions described herein are measured by mixing samples of the powders in a medium such as water with a surfactant and a short exposure to ultrasound through either an ultrasonic bath or horn. The ultrasonic horn supplies sufficient energy to disperse the soft agglomerates into the primary spherical particles. The primary particle size distribution is then measured on a volume basis by light scattering, such as in a MICROTRAC particle size analyzer (Honeywell Industrial Automation and Control, Fort Washington, Pa.). This provides a good measure of the useful dispersion characteristics of the powder because this simulates the dispersion of the particles in a liquid medium such as a paste or slurry that is used to deposit the particles in a device. Thus, the particle size referred to herein refers to the particle size after dispersion of soft agglomerates.

The fine powder batches useful according to the present invention are preferably produced by a process referred to as spray conversion or spray pyrolysis. In this process, a liquid precursor is converted to aerosol form and liquid from the droplets in the aerosol is then removed to permit formation of the desired particles in a dispersed state. Although the powder batch is typically manufactured in a dry state, the powder may, after manufacture, be placed in a wet environment, such as in a paste or slurry.

The method for the production of the composite electrocatalyst powders generally includes the steps of: providing a liquid precursor which includes a precursor to the support phase (e.g., carbon) and a precursor to the active species; atomizing the precursor to form a suspension of liquid precursor droplets; and removing liquid from liquid precursor droplets to form the powder. For electrocatalysts and other powders that are not supported, the precursor to the support phase is not necessary. At least one component of the liquid precursor is chemically converted into a desired component of the powder. The drying of the precursors and the conversion to a catalytically active species are advantageously combined in one step, where both the removal of the solvent and the conversion of a precursor to the active species occur essentially simultaneously. Combined with a short reaction time, this enables control over the distribution of the active species on the support, the oxidation state of the active species and the crystallinity of the active species. By varying reaction time, temperature, type of support material and type of precursors, the method of the present invention can produce catalyst morphologies and active species structures which yield significantly improved catalytic performance.

A unique characteristic of the present process is the simultaneous formation of a secondary support phase such as carbon. The secondary support phaseforms as a result of the formation and drying of the droplets during the spray conversion process and the characteristics of the primary support particles such as particle size, particle size distribution and surface area influence the properties of the support phase.

The first step in the fabrication of the electrocatalyst particles according to the present invention is to form a liquid precursor to the particles. In the case of composite electrocatalyst powders, the liquid precursor includes a precursor to both the active species phase and the support phase. Proper selection of the precursors enables the production of particles having well-controlled chemical and physical properties.

For the production of metal-carbon composite electrocatalyst partides the precursor solution includes at least one metal precursor. The metal precursor may be a substance in either a liquid or solid phase. Preferably, the metal precursor will be a metal-containing compound, such as a salt, dissolved in a liquid solvent of the liquid feed. For example, the precursor solution can include nitrates, chlorides, sulfates, hydroxides, or carboxylates of a metal. In this case, the metal precursor will undergo one or more chemical reactions in the furnace to convert to a metallic state and form the electrocatalyst particles. It may be desirable to acidify the precursor solution to increase the solubility, such as by adding hydrochloric acid.

A preferred catalytically active metal according to the present invention is platinum (Pt) and preferred precursors for platinum metal according to the present invention are chloroplatinic acid ($H_2PtCl_6.H_2O$), $Pt(NH_3)_4(NO_3)_2$ and hydroxoplatinic acid ($H_2Pt(OH)_6$). Other platinum precursors include Pt-nitrates, Pt-ammine nitrates, $PtCl_4$, $Na_2PtCl_4$, and the like. Chloroplatinic acid is soluble in water and the solutions advantageously maintain a low viscosity. Hydroxoplatinic acid is advantageous since it converts to platinum metal at relatively low temperatures.

Palladium precursors can include inorganic Pd salts such as $H_2PdCl_4$ or $Na_2PdCl_4$, complex Pd salts such as $Pd(NH_3)_4Cl_2$ or $Pd(NH_3)_2(OH)_2$, Pd-carboxylates, and the like. For silver, inorganic salts can be used including Ag-nitrate ammine complexes, Ag-carboxylates and Ag-oxalate. For osmium, inorganic salts such as $OsCl_3$ can be used. For copper, inorganic salts such as Cu-carboxylates can be used.

For the production of metal oxide-containing electrocatalyst powders, including supported and unsupported metal oxides, a precursor to the metal oxide must be included in the precursor solution. For metal oxides, including oxides of Au, Ag, Pt, Pd, Ni, Co, Rh, Ru, Fe, Mn, Cr, Mo, Re, W, Ta, Nb, V, Hf, Zr, Ti and Al, inorganic salts including nitrates, chlorides, hydroxides, halides, sulfates, phosphates, carboxylates, oxylates and carbonates can be used as precursors. Particulate oxides of the metals can also be used as a precursor to a metal oxide in the final powder.

Particularly preferred metal oxide precursors include: $K_2Cr_2O_7$, Cr-carboxylates and chromium oxalate for chrome oxide; $KMnO_4$, Mn-nitrate, Mn-acetate, Mn-carboxylates, Mn-alkoxides and $MnO_2$ for manganese oxide; $Na_2WO_4$ and $W_2O_3$, for tungsten oxide; $K_2MoO_4$ and $MoO_2$ for molybdenum oxide; Co-ammine complexes, Co-carboxylates and cobalt oxides for cobalt oxide; Ni-ammine complexes, Ni-carboxylates and nickel oxide for nickel oxide; and Cu-ammine complexes, Cu-carboxylates and copper oxides for copper oxide.

For the production of composite powders having a carbon support phase, the precursor solution also includes at least one carbon precursor. The carbon precursor can be an organic precursor such as carboxylic acid, benzoic acid, polycarboxylic acids such as terephthalic, isophthalic, trimesic and trimellitic acids, or polynuclear carboxylic acids such as napthoic acid, or polynuclear polycarboxylic acids. Organic precursors can react by a mechanism such as:

$$aM(NO_3)_n + b(C_xH_yO_z)_m \rightarrow M_aC_b$$

The use of a liquid organic carbon precursor typically results in amorphous carbon, which is not desirable for most electrocatalyst applications. Therefore, the carbon support precursor is preferably a dispersion of suspended carbon particles. The carbon particles can be suspended in water with additives, such as surfactants, to stabilize the suspension. The carbon particles used as the precursor are the primary particles which constitute the secondary support phase.

The carbon precursor particles preferably have a BET surface area of at least about 60 $m^2/g$, more preferably at least about 250 $m^2/g$, even more preferably at least about 600 $m^2/g$ and most preferably at least about 1300 $m^2/g$. The surface area of the particulate carbon precursor strongly influences the surface area of the composite electrocatalyst powder, and therefore strongly influences the electrocatalytic activity of the composite powder.

The particulate carbon is small enough to be dispersed and suspended in the droplets generated from the liquid precursor. Therefore, the particulate carbon preferably has an average size of from about 10 to about 100 nanometers, more preferably from about 20 to about 40 nanometers. The carbon can be crystalline (graphitic), amorphous or a combination of different carbon types. The particles can also have a graphitic core with an amorphous surface or an amorphous core with a graphitic surface.

The surface characteristics of the primary particles making up the secondary support structures (e.g., carbon) can be varied. It is preferred that the surface of the primary particles allow adequate dispersion of the precursor particles into the precursor liquid. After processing to form the secondary structures, it is preferred that the surfaces have a controlled surface chemistry. Oxidized carbon surfaces can expose hydroxyl, carboxyl, aldehyde, and other functional groups which make the surface more hydrophilic. Reduced carbon surfaces terminate in hydrogen which promotes hydrophobicity. The ability to control the surface chemistry allows tailoring of the hydrophobicity of the surfaces, which in turn allows the formation of gradients in hydrophobicity within beds of deposited particles. Oxidized carbon surfaces also tend to be microetched, corresponding to higher surface areas while reduced carbon surfaces have lower surface areas. Oxidized carbon surfaces can be derivatized by reaction with various agents which allows coupling of various oxygen containing groups with the surface to further tailor the surface chemistry. This advantageously enables the addition of inorganic, organic, metal organic or organometallic compounds to the surface. As is discussed above, a TEFLON emulsion can be used in the precursor to coat the carbon particles with a TEFLON layer, thereby controlling the hydrophobicity of the particles.

Among the convenient sources of dispersed carbon are commercially available carbon-based lubricants which are a suspension of fine carbon particles in an aqueous medium such as dispersed carbon black. Particularly preferred are acetylene carbon blacks having high chemical purity and good electrical conductivity. Examples of such carbon suspensions that are available commercially are GRAFO 1300 (Fuchs Lubricant, Co., Harvey, Ill.) which is a suspension of VULCAN XC-72 carbon black (Cabot Corp., Alpharetta, Ga.) having an average size of about 30 nanometers and a surface area of about 254 $m^2/g$. Even more preferred are BLACKPEARLS 2000 (Cabot Corp., Alpharetta, Ga.) and KETJENBLACK (Akzo Nobel, Ltd., Amersfoort, Netherlands), each of which includes carbon having a specific surface area of from about 1300 to 1500 $m^2/g$. Another preferred class of carbon materials are activated carbons which have a degree of catalytic activity, such as NORIT NK (Cabot Corp., Alpharetta, Ga.).

The precursors can be formed into an aerosol by a number of methods, as is discussed below. When ultrasonic atomization is used for aerosol generation, the solids loading of carbon in the precursor solution should not be so high as to adversely affect aerosol generation and is preferably not greater than about 10 weight percent, more preferably not greater than about 5 weight percent. When a spray nozzle is used for aerosol generation, the solids loading of carbon is preferably not greater than about 20 weight percent. However, larger spray nozzles with high pressure lines can accommodate greater than about 40 weight percent solids.

It is preferable to mechanically dissociate larger aggregates of the carbon powders by using, for example, a blade grinder or other type of high-speed blade mill. Thus, dispersing the carbon powder in water preferably includes: 1) if not already provided in suspension, wetting of the carbon black powder by mixing a limited amount of the dry powder with a wetting agent and a soft surfactant; 2) diluting the initial heavy suspension with the remaining water and a basic surfactant diluted in the water; and 3) breaking secondary agglomerates by sonification of the liquid suspension in an ultrasonic bath.

The precursor to the metal or metal oxide active species, for example potassium permanganate, is preferably dissolved separately in water and added in an appropriate amount to a carbon suspension, prior to breaking the secondary agglomerates. Adding the metal salt in this manner advantageously facilitates breaking the larger agglomerates and the mixing results in a less viscous slurry. After sonification, the slurries are stable for several months without any apparent sedimentation or separation of the components.

Spray dryers are not commonly used for spray conversion wherein precursors to a material component are dried and reacted in one step. Nanometer-sized particles are difficult to produce in the presence of other particles while maintaining control of their dispersion on a support surface. Converting the precursors in a spray drier is possible according to the present invention due to the use of precursors and additives that decompose at a temperature that is preferably not greater than about 400° C., more preferably not greater than about 300° C.

Low thermal decomposition temperature precursors that are useful at such low reaction temperatures according to the present invention to form metals include carboxylates, hydroxides, halides, nitrates, metal-organic complexes, amine adducts, isonitrile compounds, Schiff base complexes, b-diketonates, alkyls, phosphine complexes, phosphite complexes and carbonyl complexes of metals such as Ni, Ag, Pd, Pt, Rh, Sn, Cu, Au, Co, Ir, Ru and Os.

For metal oxides, useful low temperature precursors include oxocomplexes, alkoxides, amides, carboxylates, hydroxides, halides, nitrates, metal-organic complexes, amine adducts, isonitrile compounds, Schiff base complexes, b-diketonates, alkyls, phosphine complexes, phosphite complexes and carbonyl complexes of metals such as Sc, Y, La, lanthanides, Ti, Zr, Hf, V, Nb, Ta, Cr, Mo, W, Mn, Re, Fe, Ru, Os, Co, Rh, Ir and Sn.

When a metal is the active species phase, additives to ensure reduction to the metal at a low temperature can advantageously be used and will generally be soluble reducing agents and may either reduce the dissolved complex before spraying or during spraying. Preferably, the reducing agent will not substantially reduce the precursor at room temperature, but will cause reduction at an elevated temperature between about 100° C. and 400° C. These reducing agents should also be water stable and any volatile species that form from the reduction should be capable of being removed from the system. Examples of such reducing agents include boranes, borane adducts (e.g., trimethylamineborane, $BH_3NMe_3$), silane derivatives, e.g., $SiH_{(4-x)}R_x$ (where R=an organic group, aryl, alkyl, or functionalized alkyl or aryl group, polyether, alkyl carboxylate) borohydrides, e.g., $NaBH_4$, $NH_4BH_4$, $MBH_{(3-x)}R_x$ (where R=an organic group, aryl, alkyl, or functionalized alkyl or aryl group, polyether, alkyl carboxylate). Other reducing agents include alanes or tin hydrides.

According to a particularly preferred embodiment, a reducing agent for Pt metal is selected from the group consisting of formic acid, formaldehyde, hydrazine and hydrazine salts. For example, an acidified solution of $H_2Pt(OH)_6$ in the presence of formic acid is stable at room temperature but is reduced to Pt metal at low reaction temperatures, such as about 100° C.

For a metal oxide as the active species phase, additives to ensure oxidation to the metal oxide at low temperature can also be used and will generally be soluble oxidizing agents and may either oxidize the dissolved complex before spraying or during spraying. Preferably, the oxidizing agent will not oxidize the precursor to the metal oxide at room temperature, but will cause reduction at elevated temperature between about 100° C. and 400° C. These species should also be water stable and form volatile species that can be removed from the system. Examples include amine oxides, e.g., trimethylamine-N-oxide ($Me_3NO$), oxidizing mineral acids such as nitric acid, sulfuric acid and aqua regia, oxidizing organic acids such as carboxylic acids, phosphine oxides, hydrogen peroxide, ozone or sulfur oxides.

The precursor solution can include other additives such as surfactants, wetting agents, pH adjusters or the like. It is preferred to minimize the use of such additives, however, while maintaining good dispersion of the precursors. Excess surfactants, particularly high molecular weight surfactants, can remain on the electrocatalyst particle surface and degrade the catalytic activity if not fully removed.

Spray conversion or spray pyrolysis is a valuable processing method because the particles are raised to a high temperature for a short period of time. The relatively high temperature achieves conversion of the molecular precursor to the final desired phase, but the short time ensures little surface diffusion that can cause agglomeration of the nanometer-sized active phase. Hence, the support phase is formed with well dispersed nanometer sized active phase particles.

The liquid precursor is then atomized to form a suspension of droplets. The droplets in the suspension have a droplet size distribution that is determined by the characteristics of the atomizer. Preferred atomizers include single-fluid nozzles, two-fluid nozzles, ultrasonic nozzles and rotary wheel atomizers. Ultrasonic fountains can also be used. An example of an ultrasonic fountain generator and apparatus is disclosed in commonly-owned U.S. patent application Ser. No. 09/030,057, which is incorporated herein by reference in its entirety.

Each of the foregoing aerosol generation methods produces particles with a characteristic size distribution, ejection velocity and spray pattern. The particle size is an important property to consider when selecting an atomization method. Properties such as final particle size, impaction efficiency, settling rate, heating rate and evaporation rate all depend on the precursor droplet size. Other factors to consider when selecting an atomizer include production rate, system orientation, processing temperature and precursor composition. For example, some precursor compositions cannot be economically atomized by ultrasonic methods.

Ultrasonic fountains and ultrasonic nozzles produce droplets by creating capillary waves on a liquid surface. The droplets are ejected from the bulk liquid with a slow velocity and a carrier gas is required to sweep the droplets away from the generation zone.

The manner in which the carrier gas is introduced to the system plays an important part in the droplet capture efficiency for both ultrasonic systems. For ultrasonic fountains, the carrier gas is introduced by either a point source close to the fountain or by sweeping the gas around the perimeter of the cone and removing the gas through a tube placed at a predetermined height above the liquid surface. For a point source, the dimension of the source hole should be appropriately sized to ensure that the gas captures the maximum number of particles per unit time. When gas is delivered to several locations via the same tube, the holes must be sized such that the flow rate is divided equally among the holes. In addition, the position of the source relative the height above the liquid level and transducer level must be selected such that the gas captures the maximum number of particles per unit time.

The gas flow rate also determines the number of droplets removed from the generation zone and delivered to the reactor per unit time. An increase in the carrier-gas flow rate usually results in an increase in the droplet removal rate. However a threshold gas flow rate exists beyond which the droplet removal rate reaches an asymptotic value or declines due to distortions in the fountain caused by the higher velocity gas. For ultrasonic fountains this optimum flow rate is on the order of about 5 slpm per transducer when delivered through 1/8" or 3/32" holes located within 1/2" to 1" of the center of the fountain. When the carrier gas is delivered concentrically and radially inward around the fountain, the droplets are entrained in the gas and removed via a "pick-up" tube situated directly above the fountain. The aerosol-laden stream is transported through the pickup tube and into the reactor. The height of the tube above the precursor liquid level must be adjusted along with the carrier gas flow rate to maximize droplet removal rates per unit time. Preferred tube heights above the liquid surface are between about 0.5 and 1.75 inches and preferred gas flow rates are between about 2.5 and 10 slpm. The diameter of the tube must be selected relative to the fountain dimensions to ensure adequate removal of the droplets and minimize aspiration and percolation of condensation on the inside diameter of the tube. For 20 mm diameter transducers operating at 1.6 MHz, the preferred tube inner diameter is between about 0.5 and 1 inch. For both point source and radial gas delivery, the actual optimum flow rates are material dependent.

Translating the concept of a radially-inward sweeping gas to multi-transducer configurations can be accomplished by one of two methods. Both methods incorporate the use of a gas distribution system and a gas focusing system. The purpose of the gas distribution system is to ensure that the carrier gas is distributed evenly among each transducer or gang of transducers. The focusing system focuses the carrier gas around the fountain(s) such that the droplet removal rate is maximized. An example of the focusing system is the pickup tube described above. The aerosol-laden carrier gas is transported through the pickup tube(s) or zones and the aerosol streams from each pickup zone are combined and transported to the reactor.

In the first method, an array of pickup tubes of optimum diameter can be arranged such that the center of each tube is aligned over an individual fountain (one tube for each fountain). The carrier gas is evenly distributed among the tubes to ensure each transducer has suitable conditions for droplet removal. The pickup tubes transport the aerosol streams to a zone where all streams are combined and delivered to the reactor. In this configuration, the pickup tube acts as the focusing device.

Another configuration allows groups of transducers to be used together in such a way that a large pickup channel or other design can focus gas around and remove droplets from the group of transducers. An example would be to align the transducers in a line and have a rectangular pickup channel positioned above the transducers such that the open interior of the rectangle is oriented above the group of fountains. The pickup channel acts as the focusing device and the carrier gas sweeps axially inward towards the centerline of the rectangle. Again, the height of the pickup channel above the fountains must be adjusted for maximum particle removal rates. The carrier gas must be evenly distributed so that each transducer experiences the conditions necessary for maximum particle removal rates.

Precursor temperature and transducer temperature have an effect on aerosol generation rate and transducer longevity in ultrasonic fountains. Preferably, the precursor fluid and transducer are maintained at a temperature of from about 25° C. to about 40° C. The distance between the transducer and the precursor liquid surface also influences the aerosol generation rate.

Ultrasonic fountains create a large number of droplets that are re-entrained into the bulk precursor fluid. These droplets lose water quickly and cause the bulk fluid to concentrate over time. This requires monitoring and adjustment of the solution to prevent the precursor concentration from changing over time. Typically, water is the only volatile component and a density measurement can be used to monitor the solution and make-up water can be used to re-adjust the solution concentration. More complex solutions may require monitoring of the pH and the addition of other components such as acids or bases.

Typically, ultrasonic fountains operating in the MHz frequency range produce smaller mean particle sizes with narrower particle size distributions compared to ultrasonic nozzles operating in the 100 KHz range and single- or two-fluid spray nozzles. However, ultrasonic fountains typically generate fewer droplets per unit time per device and are less efficient in terms of energy conversion than other systems. Ultrasonic nozzles, however, can atomize a wider variety of solutions more effectively than ultrasonic fountains.

Like ultrasonic fountains, ultrasonic nozzles atomize fluid by creating capillary waves on the surface of a liquid. The liquid is delivered to the vibrating tip where it is atomized, ejected from the surface and carried away from the surface by a carrier gas or by gravity. To transport the particles to the reactor, a carrier gas is passed through the generation zone at velocities that do not disrupt the atomization process.

Commercially available ultrasonic nozzles have frequencies ranging from tens of KHz to hundreds of KHz and have a variety of tip configurations selected according to the desired spray pattern. The lower frequencies allow for greater power input compared to ultrasonic fountains operating in the MHz range and thus a larger variety of materials can be atomized. However, lower frequencies produce larger partides than higher frequencies such that the ultrasonic nozzle is unsuitable for applications requiring a small particle size. Flow rates for ultrasonic nozzles are typically larger than ultrasonic fountains which make them quite attractive for applications requiring high volume without requiring a small droplet size.

Scale up of ultrasonic nozzles can be accomplished by using a unit rated for larger volumetric flow rates or by using multiple units. Larger units produce particles having similar size distributions as smaller units, provided the operating frequencies are similar.

Single-fluid and two-fluid nozzles create droplets from liquid jets sheared apart from forces generated at the gas-liquid interface. Whereas both rely on velocity differentials between the liquid and a gas, the single-fluid nozzle uses ambient air and high liquid velocities while the two-fluid nozzle uses a gas stream to create high gas velocities and pressures that shear the liquid jet stream into droplets. Because high velocity differentials are required to accomplish atomization, the resultant particles typically have high kinetic energy compared to ultrasonic techniques. Also, the trajectories of the particles can diverge greatly and the outer boundary of these spray patterns can be quite large requiring a larger reactor system in order to minimize particle losses on the walls.

The size distributions of particles produced by single- and two-fluid nozzles are typically larger than those produced by ultrasonic techniques. Droplet diameters can be on the order of about 40 $\mu$m to 60 $\mu$m. For horizontally-oriented systems, larger particles will settle out more quickly than smaller particles and therefore ultrasonic techniques may be advantageous for horizontal systems. However, the production rates of spray nozzles are typically higher and are thus a favorable means of atomization, provided that the reactor can reach the necessary temperatures and the nozzle can generate droplets having a desired size and size distribution. Also, spray nozzles can atomize a wider variety of precursors and at higher precursor concentrations, such as precursors with a high loading of particulate carbon.

Another advantage of spray nozzles is the simplicity of the design. Unlike ultrasonic methods, spray nozzles do not require electronic components to operate. Compressed gas and a pressurized liquid source are the only requirements. The mechanical components have few moving parts, minimizing the likelihood of breakdowns.

A two-fluid nozzle is illustrated in FIG. 1. The two fluid nozzle 100 includes a central aperture 102 for directing the liquid precursor into the chamber. Two outer apertures 104 and 106 direct a jet of air or other gas toward the liquid precursor stream as the liquid precursor is sprayed out of the central aperture 102. Atomization is accomplished by large shear forces that are generated when the low-velocity liquid stream encounters the high-velocity gas streams. The particle size characteristics of the aerosol are dependent on the flow rate of the gas.

After atomization, water is removed from the liquid droplets by evaporation. Preferably, the aerosol of liquid droplets is passed through a heating zone, such as a hot-wall reactor or a spray dryer to remove the liquid.

Hot-wall reactors transfer heat into the particle by maintaining a fixed wall temperature within the reaction zone. The carrier gas absorbs heat from the walls of the system until it reaches thermal equilibrium with the reactor walls. Energy transport must occur from the walls through the bulk of the gas, thus some component of convective heat transport within the gas is desirable as opposed to purely conductive transport. Horizontal hot-wall reactors have naturally occurring convective cells that are the result of buoyant forces generated within the reactor. However, highly turbulent systems may give rise to undesirable particle deposition and losses. Preferably, Reynolds numbers within the system should be between 300 and 2400 based on maximum wall temperature, Prandtl numbers should be between 0.6 and 0.8 and Grashof numbers should be between $1 \times 10^5$ and $4 \times 10^7$ based on gas inlet temperature and maximum wall temperature. Residence times within the reactor are preferably the order of from about 1.5 to 4 seconds.

The advantages of the hot-wall reactor include the ability to control the time/temperature history of the particle with greater precision over longer time intervals and the ability to achieve higher processing temperatures. The disadvantages of the hot-wall reactor include limited scalability due to thermal transport properties and equipment costs.

Spray dryers accomplish heat transfer by intimately mixing a hot gas stream with an aerosol stream. The time-temperature history of the particle is a function of the inlet temperatures of the inlet streams, the compositions of the inlet streams, the relative mass flow rates of the streams and the degree of mixing in the drying chamber. The outlet temperature can be calculated from a simple thermodynamic energy balance equating the energy change of two streams and solving for the equilibrium temperature. A spray dryer has the advantages of higher capacity, lower operating cost, less complex equipment and simple scalability.

Most commercial spray dryers are designed to accommodate temperatures on the order of 300° C. while modified spray dryers can achieve temperatures up to about 600° C. However, scale-up of modified systems can be cost prohibitive. Equipment downstream of the spray dryer can also impose temperature limitations on the outlet temperature of the system that will also limit the maximum conversion temperature. Typically, the maximum particle temperature is assumed to be the outlet temperature for co-current flow spray dryer configurations. Typical residence times within a spray dryer are on the order of tens of seconds.

The lower operating temperature of a spray dryer limits the ability to achieve the chemical reactions during spray conversion. In the present spray process, the temperature can be significantly higher, but if carbon is included as one of the phases, there is an upper temperature limit where the carbon will oxidize if an oxidizing environment such as air is used. The upper temperature limit will be higher for the present process because the residence time is shorter.

Atomizers useful with spray dryers include single-fluid and two-fluid nozzles and rotary wheel atomizers. The preferred method for spray drying the particulate carbon-containing precursors of the present invention is a two-fluid nozzle. Rotary wheel atomizers accumulate dried material at the edge requiring frequent cleaning and intermittent operation. Single-fluid nozzles can be used but require higher liquid flow rates to achieve the same particle size distribution.

A spray dryer system that is useful according to the present invention is schematically illustrated in FIG. 2. The spray dryer 200 includes a precursor feed line 202 for delivering liquid precursor to the drying chamber 204 and an atomizing gas line 203 for atomizing the liquid feed. The liquid precursor is dispersed into droplets through a spray nozzle 206, such as the two-fluid nozzle illustrated in FIG. 1. Drying air is introduced at the top of the chamber 204 through a hot gas inlet 208. The liquid droplets are dried and collected in a cyclone 212.

In the foregoing description of the basic components of a spray dryer, it should be noted that during spray drying the precursor mixture actually undergoes a chemical conversion. For example, a manganese precursor, such as potassium permanganate, is converted to manganese oxide. The final phase and oxidation state of manganese oxide are critical to the electrocatalytic activity of the resulting powder. Minor variations in reaction temperature and precursor composition can result in powders with different electrocatalytic activities.

It has been advantageously found according to the present invention that relatively low conversion temperatures can be used to obtain quality electrocatalyst powder. It is preferred that the reaction temperature is not greater than about 400° C., more preferably not greater than about 300° C. and even more preferably not greater than about 200° C. Further, it is preferred that the reaction temperature is at least about 100° C., preferably at least about 150° C. Increasing the reaction temperature to over 400° C. can remove excess surfactant which may remain on the powder and poison the oxide active sites. However, this is typically not necessary if the amount of surfactant in the precursor solution is low.

The process of the present invention is particularly well suited for the production of finely divided particles having a small weight average particle size. In addition to making particles within a desired range of weight average particle size, the particles may advantageously be produced with a narrow size distribution, thereby providing size uniformity that is desired for many applications. In addition, the method of the present invention provides significant flexibility for producing electrocatalyst particles of varying composition, crystallinity, morphology and microstructure.

Referring now to FIG. 3, one embodiment of the process of the present invention utilizing ultrasonic fountains is described. A liquid feed 102, including the precursorforthe desired particles, and a carrier gas 104 are fed to an aerosol generator 106 where an aerosol 108 is produced. The aerosol 108 is then fed to a furnace 110 where liquid in the aerosol 108 is removed to produce particles 112 that are dispersed in and suspended by gas exiting the furnace 110. The particles 112 are then collected in a particle collector 114 to produce an electrocatalyst powder batch 116.

As used herein, the liquid feed 102 is a feed that includes a liquid as the major constituent, such that the feed is a flowable medium. The liquid feed 102 need not comprise only liquid constituents. The liquid feed 102 also include particulate material suspended in a liquid phase. The liquid feed 102 must, however, be capable of being atomized to form droplets of sufficiently small size for preparation of the aerosol 108. Therefore, if the liquid feed 102 includes suspended particles, such as suspended carbon particles, those particles should be relatively small in relation to the size of droplets in the aerosol 108, as is discussed in more detail hereinbelow.

Frequently, the precursor to one or more of the desired components will be a material, such as a salt, dissolved in a liquid solvent of the liquid feed 102. The precursor may undergo one or more chemical reactions in the furnace 110 to form the particles 112. Alternatively, the precursor material may contribute to formation of the particles 112 without undergoing a substantial chemical reaction. This could be the case, for example, when the liquid feed 102 includes, as a precursor material, suspended carbon particles that are not substantially chemically modified in the furnace 110. In any event, the particles 112 include at least one component originally contributed by the precursor. Preferred precursors in accordance with the present invention are discussed above.

The carrier gas 104 may comprise any gaseous medium in which droplets produced from the liquid feed 102 may be dispersed in aerosol form. The carrier gas 104 may be inert, in that the carrier gas 104 does not participate in formation of the particles 112. Alternatively, the carrier gas may have one or more active components that contribute to formation of the particles 112 in the furnace 110. Preferred carrier gases according to the present invention are discussed in more detail hereinbelow.

The aerosol generator 106 atomizes the liquid feed 102 to form droplets in a manner to permit the carrier gas 104 to sweep the droplets away to form the aerosol 108. An important aspect of the present invention is generation of the aerosol 108 with droplets of a small average size and, preferably, a narrow size distribution. In this manner, the particles 112 may be produced at a desired small size with a narrow size distribution, which is advantageous for many applications.

The aerosol generator 106 is preferably capable of producing the aerosol 108 such that it includes droplets having a weight average size in a range having a lower limit of about 1 $\mu$m and preferably about 2 $\mu$m; and an upper limit of about 20 $\mu$m; preferably about 10 $\mu$m, more preferably about 7 $\mu$m and most preferably about 5 $\mu$m. The aerosol generator is also capable of producing the aerosol 108 such that it includes droplets having a narrow size distribution. Preferably, the droplets in the aerosol are such that at least about 70 percent of the droplets are smaller than about 10 $\mu$m and more preferably at least about 70 weight percent are smaller than about 5 $\mu$m. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a high loading, or high concentration, of the liquid feed 102 in droplet form. The capability of the aerosol generator 106 to produce a heavily loaded aerosol 108 is surprising given the high droplet output rate of which the aerosol generator 106 is capable, as is discussed more fully below.

The furnace 110, or hot wall reactor, may be any device suitable for heating the aerosol 108 to evaporate liquid from the droplets of the aerosol 108 and thereby form the particles 112. The maximum average stream temperature, or conversion temperature, refers to the maximum average temperature that an aerosol stream attains while flowing through the furnace. This is typically determined by a temperature probe inserted into the furnace. Preferred conversion temperatures according to the present invention are discussed more fully below.

Although longer residence times are possible, for many applications, residence time in the heating zone of the furnace 110 of shorter than about 4 seconds is typical, with shorter than about 2 seconds being preferred, shorter than about 1 second being more preferred, shorter than about 0.5 second being even more preferred, and shorter than about 0.2 second being most preferred. The residence time should be long enough, however, to assure that the particles 112 attain the desired maximum stream temperature for a given heat transfer rate. In that regard, with extremely short residence times, higher furnace temperatures could be used to increase the rate of heat transfer so long as the particles 112 attain a maximum temperature within the desired stream temperature range.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. Further, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica or alumina. Quartz tubes can also be advantageous. Preferably, the tube is metallic. Advantages of using a metallic tube are low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. Flange fittings may be welded directly to the tube for connecting with other process equipment. Metallic tubes are generally preferred for making particles that do not require a maximum tube wall temperature of higher than about 1100° C. during particle manufacture, such as the electrocatalyst particles of the present invention.

Also, although the present invention is described with primary reference to a furnace reactor, which is preferred, it should be recognized that, except as noted, any other thermal reactor, including a flame reactor or a plasma reactor, could be used. A furnace reactor is preferred because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from the gas. Such a filter may be of any type, including a bag filter. Another preferred embodiment of the particle collector uses one or more cyclone to separate the particles 112. Other apparatus that may be used in the particle collector 114 includes an electrostatic precipitator. Particle collection should normally occur at a temperature above the condensation temperature of the gas stream in which the particles 112 are suspended. Further, collection should normally be at a temperature that is low enough to prevent significant agglomeration of the particles 112.

Figure 4:
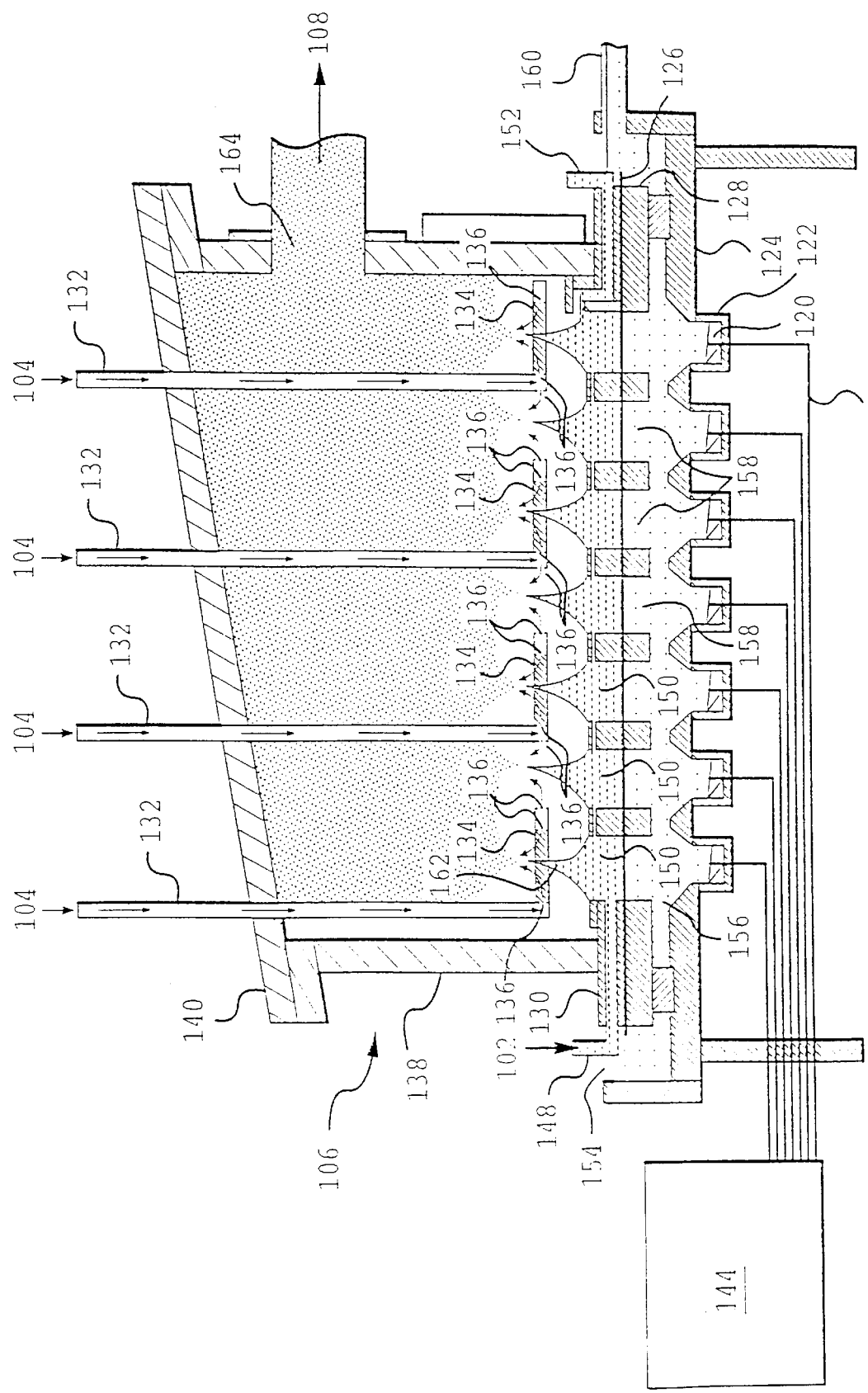
FIG. 4 is a side view in cross section of one embodiment of aerosol generator of the present invention.
Figure 5:
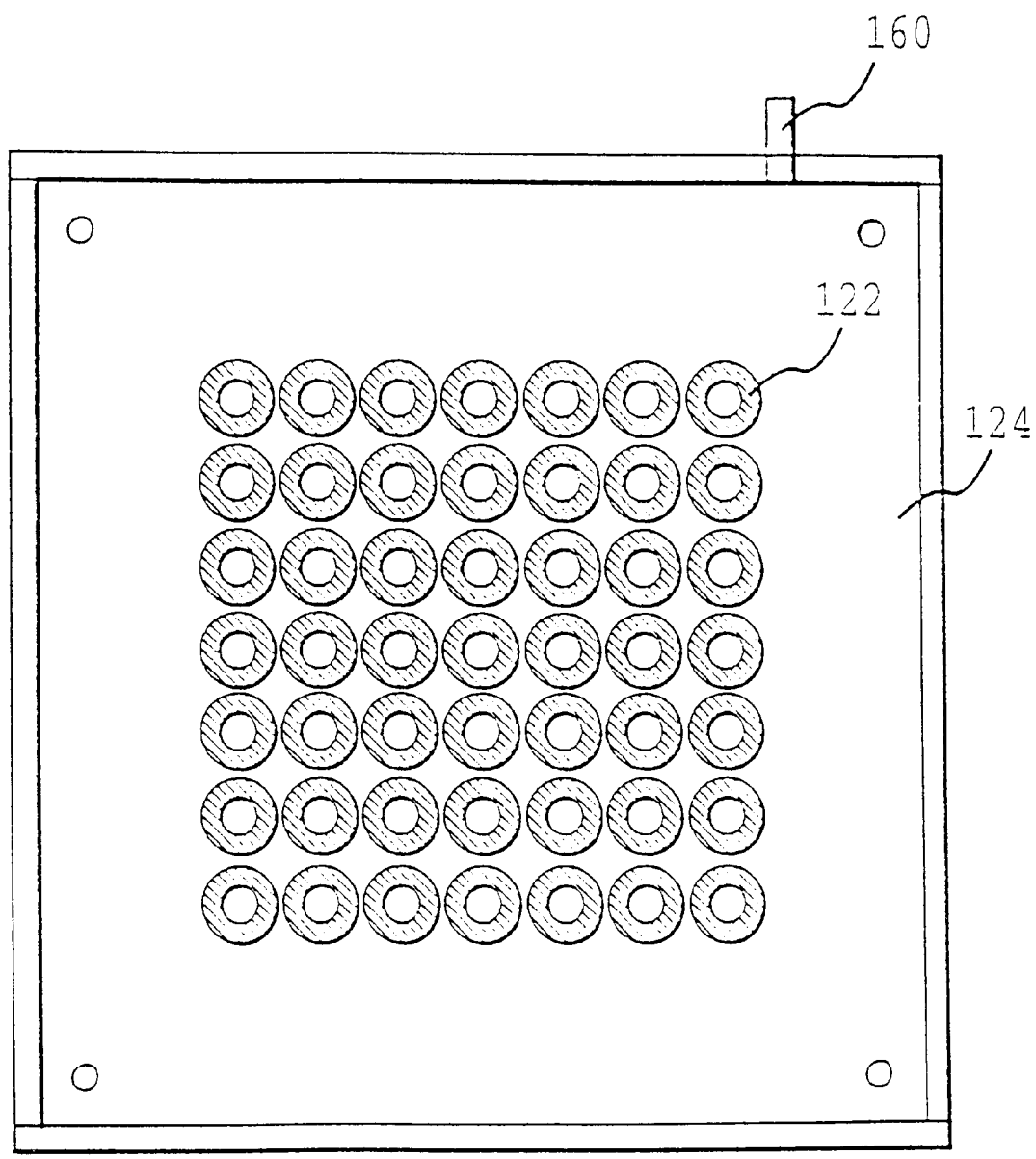
FIG. 5 is a top view of a transducer mounting plate showing a 49 transducer array for use in an aerosol generator of the present invention.

Of significant importance to the operation of the process of the present invention is the aerosol generator 106, which must be capable of producing a high quality aerosol with high droplet loading, as previously noted. With reference to FIG. 4, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 4, includes forty-nine transducers in a 7×7 array. The array configuration is as shown in FIG. 5, which depicts the locations of the transducer housings 122 mounted to the transducer mounting plate 124.

With continued reference to FIG. 4, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 4, the transducer discs 120 are activated by the transducer driver 144 via the electrical cables 146. The transducers preferably vibrate at a frequency of from about 1 MHz to about 5 MHz, more preferably from about 1.5 MHz to about 3 MHz. Frequently used frequencies are at about 1.6 MHz and about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%, resulting in deviations in the operating frequencies. It is preferred, however, that the transducer discs 120 operate at frequencies within a range of 5% above and below the median transducer frequency, more preferably within a range of 2.5%, and most preferably within a range of 1%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 4 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Another important feature of the aerosol generator 106, as shown in FIG. 4, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extends the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, TEFLON™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102. It has been found that when the liquid feed 102 includes an aqueous liquid at an elevated temperature, the droplet loading increases significantly. The temperature of the liquid feed 102 is preferably higher than about 30° C., more preferably higher than about 35° C. and most preferably higher than about 40° C. If the temperature becomes too high, however, it can have a detrimental effect on droplet loading in the aerosol 108. Therefore, the temperature of the liquid feed 102 from which the aerosol 108 is made should generally be lower than about 50° C., and preferably lower than about 45° C. The liquid feed 102 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106. When the ultrasonic generator 106 includes the separator 126, the ultrasonically transmissive fluid adjacent the ultrasonic transducer discs 120 are preferably also at an elevated temperature in the ranges discussed for the liquid feed 102.

The design for the aerosol generator 106 based on an array of ultrasonic transducers is versatile and is easily modified to accommodate different generator sizes for different applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

Figure 6:
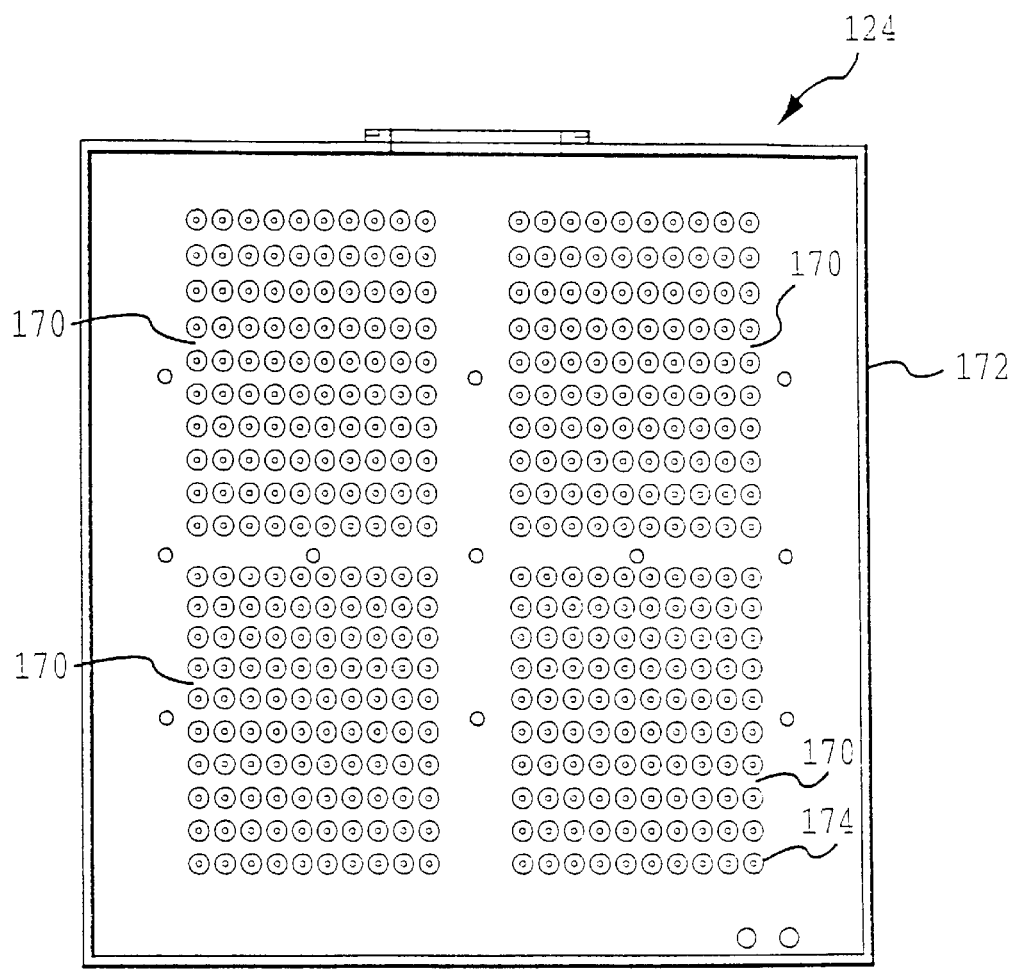
FIG. 6 is a top view of a transducer mounting plate for a 400 transducer array for use in an ultrasonic generator of the present invention.
Figure 7:
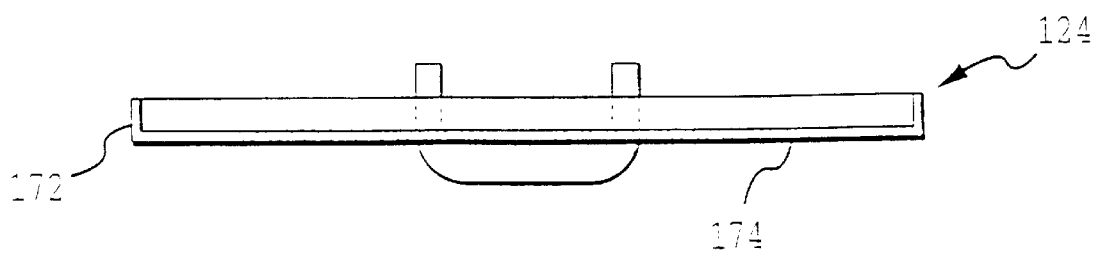
FIG. 7 is a side view of the transducer mounting plate shown in FIG. 6.

FIGS. 6–23 show component designs for an aerosol generator 106 including an array of 400 ultrasonic transducers. Referring first to FIGS. 6 and 7, the transducer mounting plate 124 is shown with a design to accommodate an array of 400 ultrasonic transducers, arranged in four subarrays 170 of 100 ultrasonic transducers each. The transducer mounting plate 124 has integral vertical walls 172 for containing the ultrasonically transmissive fluid, typically water, in a water bath similar to the water bath volume 156 described previously with reference to FIG. 4.

Figure 8:
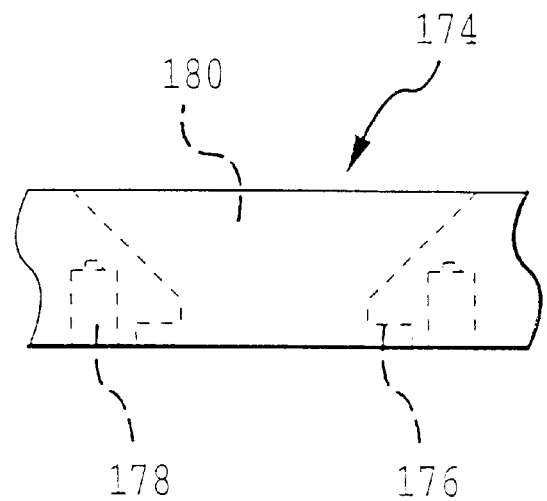
FIG. 8 is a partial side view showing the profile of a single transducer mounting receptacle of the transducer mounting plate shown in FIG. 6.

As shown in FIGS. 6 and 7, four hundred transducer mounting receptacles 174 are provided in the transducer mounting plate 124 for mounting ultrasonic transducers for the desired array. With reference to FIG. 8 the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 4.

Figure 9:
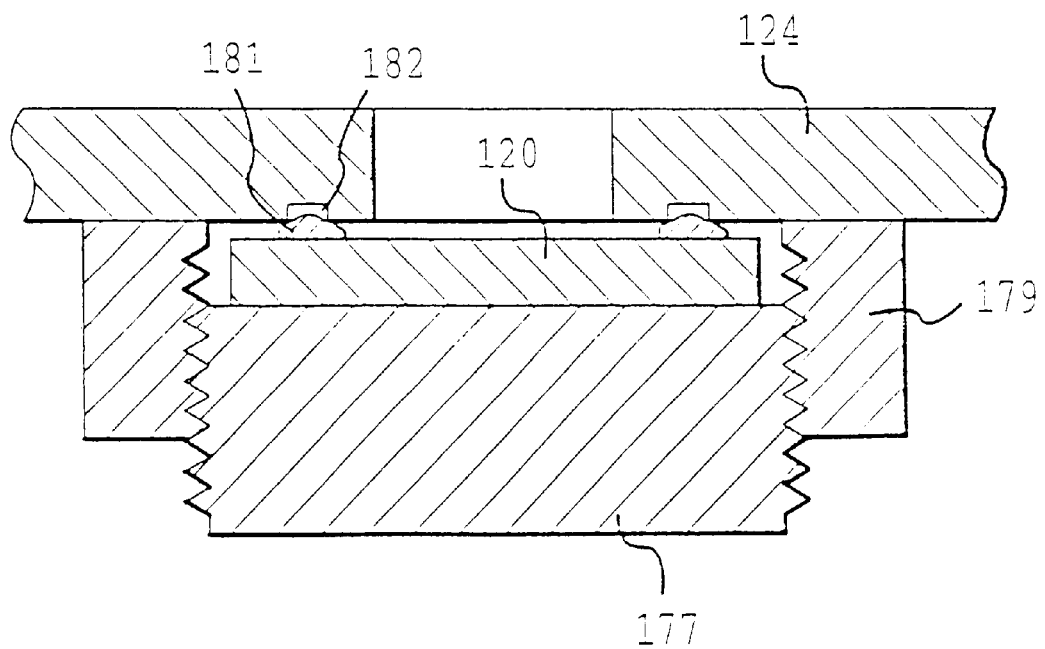
FIG. 9 is a partial side view in cross-section showing an alternative embodiment for mounting an ultrasonic transducer.

A preferred transducer mounting configuration, however, is shown in FIG. 9 for another configuration for the transducer mounting plate 124. As illustrated in FIG. 9, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the o-ring to the ultrasonic transducer disc 120 will be inside of the outer edge of the protective seal, thereby preventing liquid from penetrating under the protective surface coating from the edges of the ultrasonic transducer disc 120.

Figure 10:
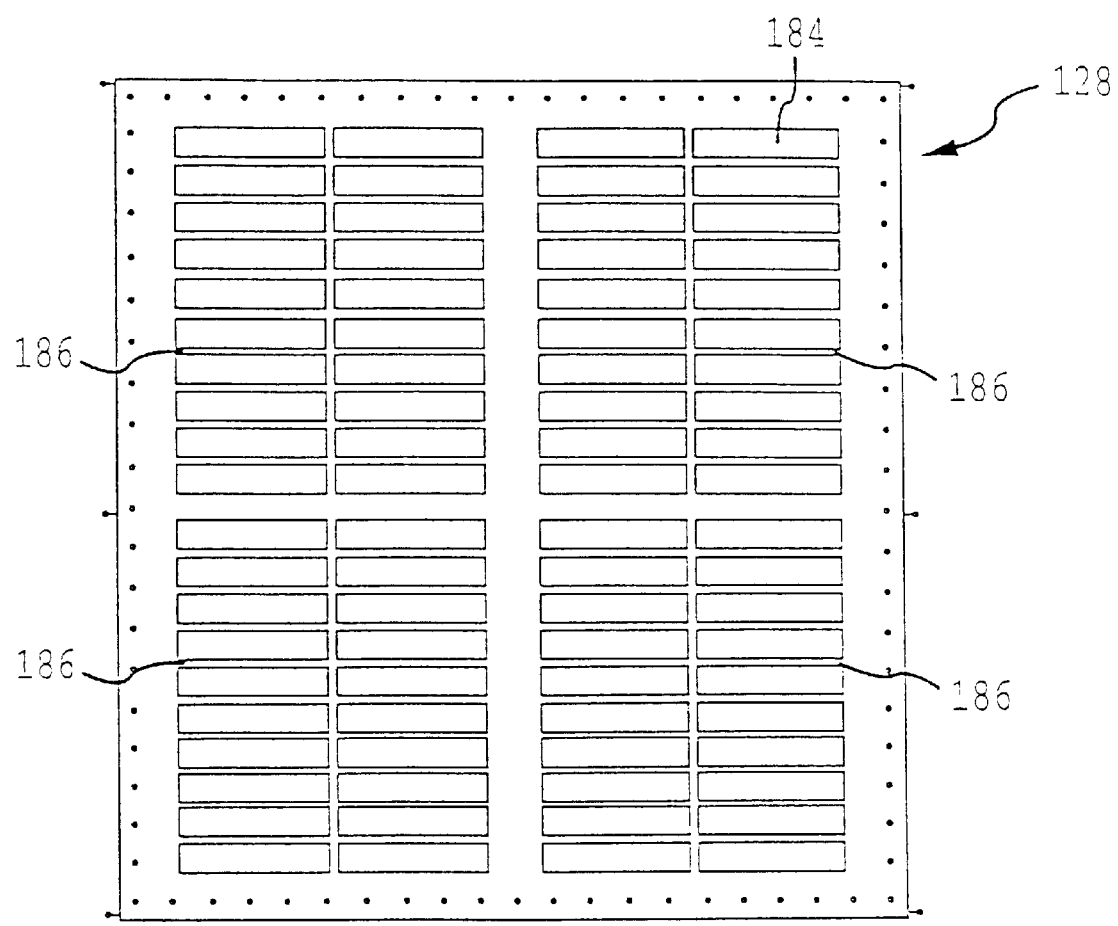
FIG. 10 is a top view of a bottom retaining plate for retaining a separator for use in an aerosol generator of the present invention.

Referring now to FIG. 10, the bottom retaining plate 128 for a 400 transducer array is shown having a design for mating with the transducer mounting plate 124 (shown in FIGS. 6–7). The bottom retaining plate 128 has eighty openings 184, arranged in four subgroups 186 of twenty openings 184 each. Each of the openings 184 corresponds with five of the transducer mounting receptacles 174 (shown in FIGS. 6 and 7) when the bottom retaining plate 128 is mated with the transducer mounting plate 124 to create a volume for a water bath between the transducer mounting plate 124 and the bottom retaining plate 128. The openings 184, therefore, provide a pathway for ultrasonic signals generated by ultrasonic transducers to be transmitted through the bottom retaining plate.

Figure 11:
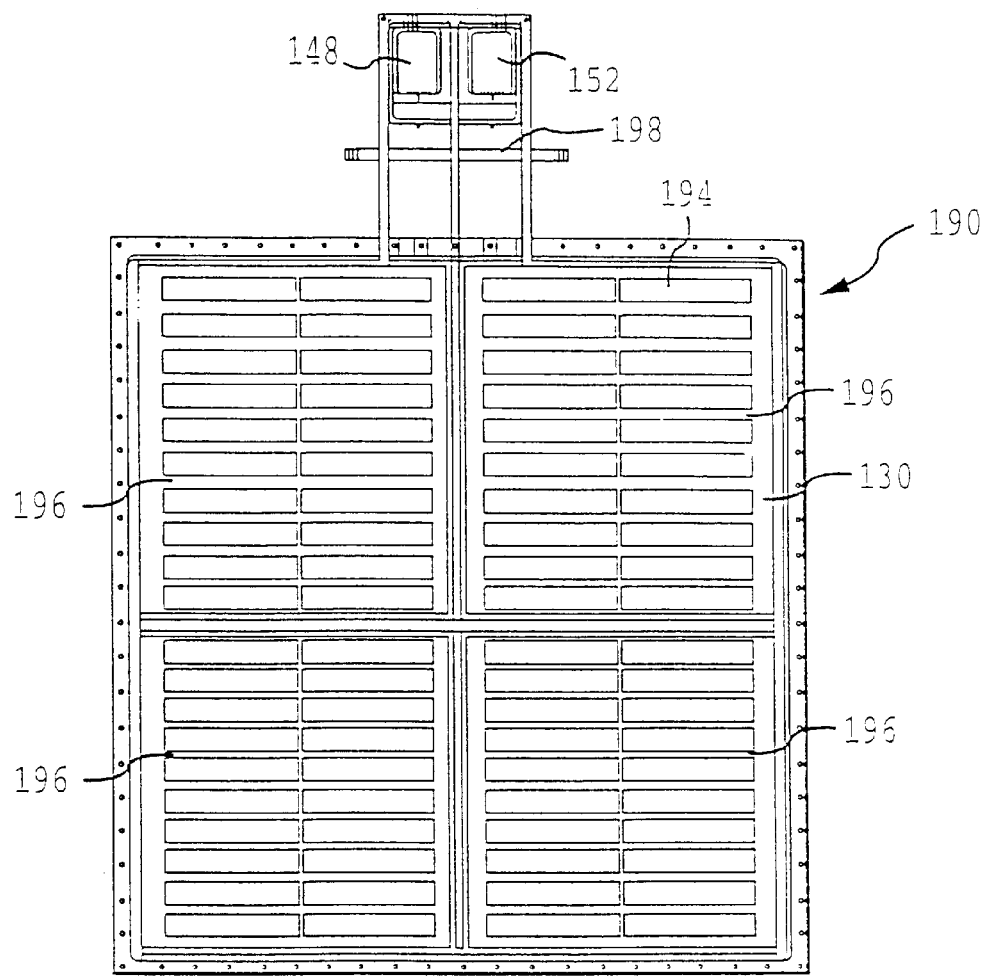
FIG. 11 is a top view of a liquid feed box having a bottom retaining plate to assist in retaining a separator for use in an aerosol generator of the present invention.
Figure 12:
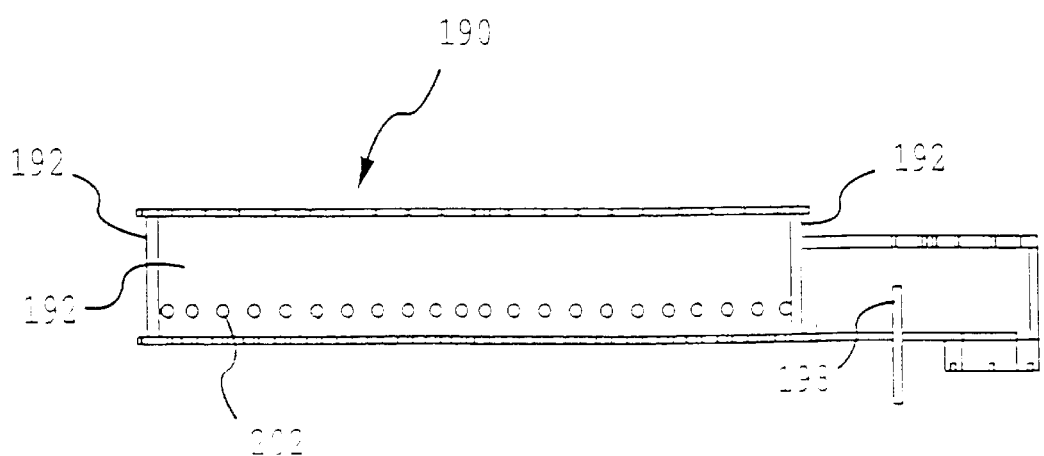
FIG. 12 is a side view of the liquid feed box shown in FIG. 11.

Referring now to FIGS. 11 and 12, a liquid feed box 190 for a 400 transducer array is shown having the top retaining plate 130 designed to fit over the bottom retaining plate 128 (shown in FIG. 10), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 11 and 12 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 10). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Figure 13:
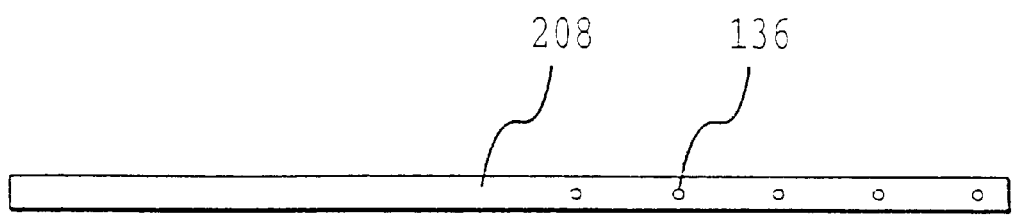
FIG. 13 is a side view of a gas tube for delivering gas within an aerosol generator of the present invention.

Referring now to FIGS. 11–13, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 13. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Figure 14:
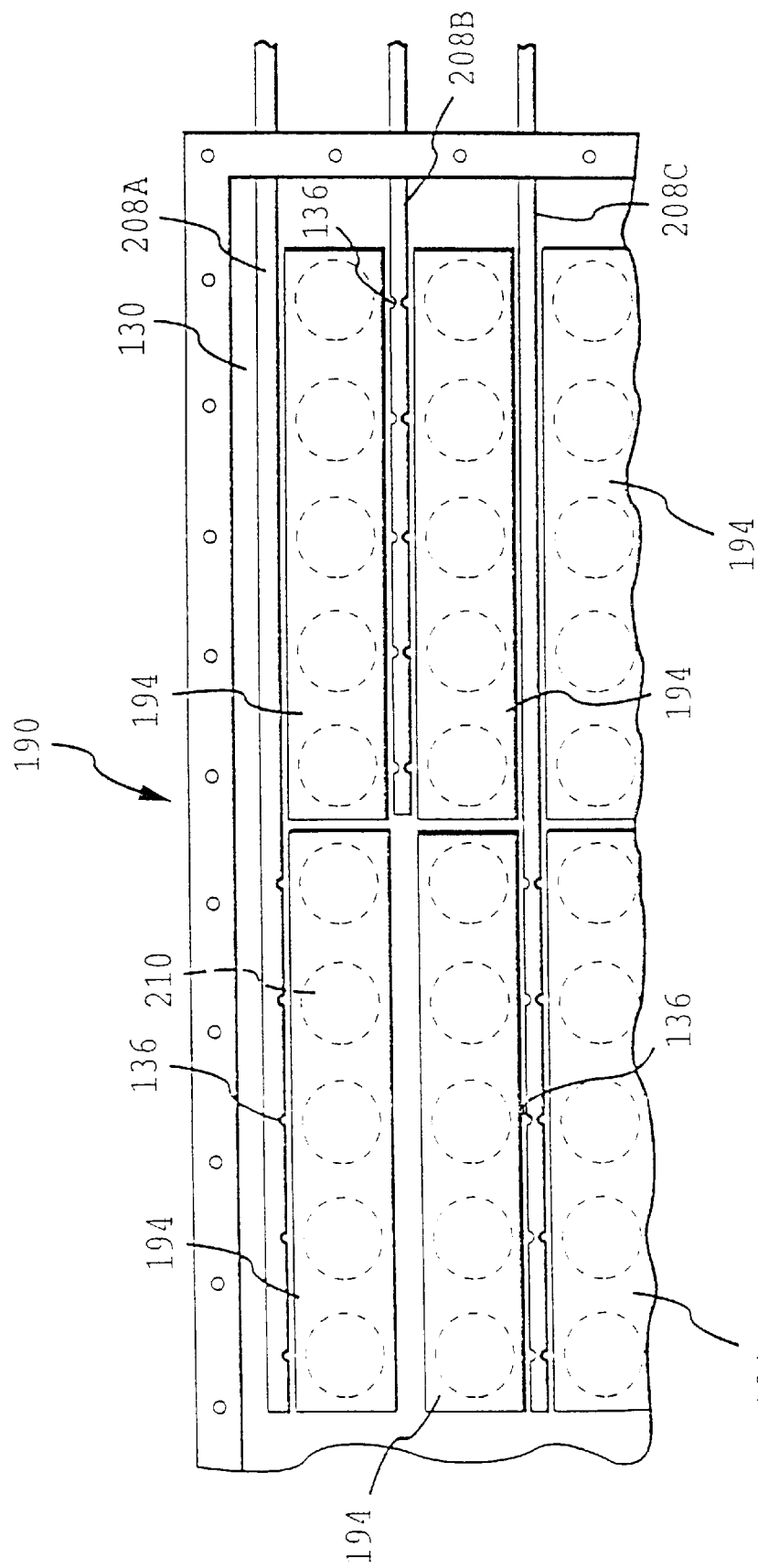
FIG. 14 shows a partial top view of gas tubes positioned in a liquid feed box for distributing gas relative to ultrasonic transducer positions for use in an aerosol generator of the present invention.

Referring now to FIG. 14, a partial view of the liquid feed box 190 is shown with gas tubes 208A, 208B and 208C positioned adjacent to the openings 194 through the top retaining plate 130. Also shown in FIG. 14 are the relative locations that ultrasonic transducer discs 120 would occupy when the aerosol generator 106 is assembled. As seen in FIG. 14, the gas tube 208A, which is at the edge of the array, has five gas delivery ports 136. Each of the gas delivery ports 136 is positioned to divert carrier gas 104 to a different one of atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The third gas tube, 208C, is a longer tube that also has ten gas delivery ports 136 for delivering gas to atomization cones corresponding with ten ultrasonic transducer discs 120. The design shown in FIG. 14, therefore, includes one gas delivery port per ultrasonic transducer disc 120. Although this is a lower density of gas delivery ports 136 than for the embodiment of the aerosol generator 106 shown in FIG. 4, which includes two gas delivery ports per ultrasonic transducer disc 120, the design shown in FIG. 14 is, nevertheless, capable of producing a dense, high-quality aerosol without unnecessary waste of gas.

Figure 15:
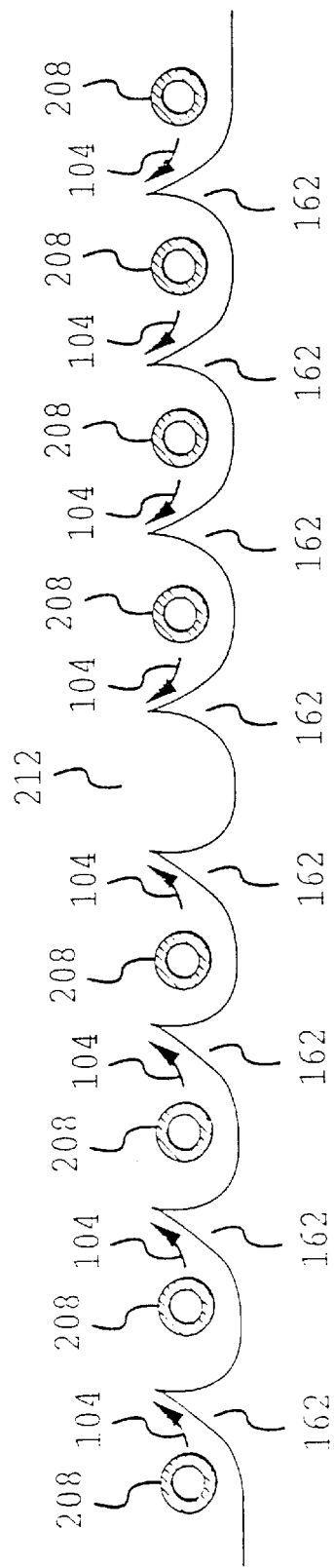
FIG. 15 shows one embodiment for a gas distribution configuration for the aerosol generator of the present invention.

Referring now to FIG. 15, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C in the gas distribution configuration shown in FIG. 13. The carrier gas 104 sweeps both directions from each of the gas tubes 208.

Figure 16:
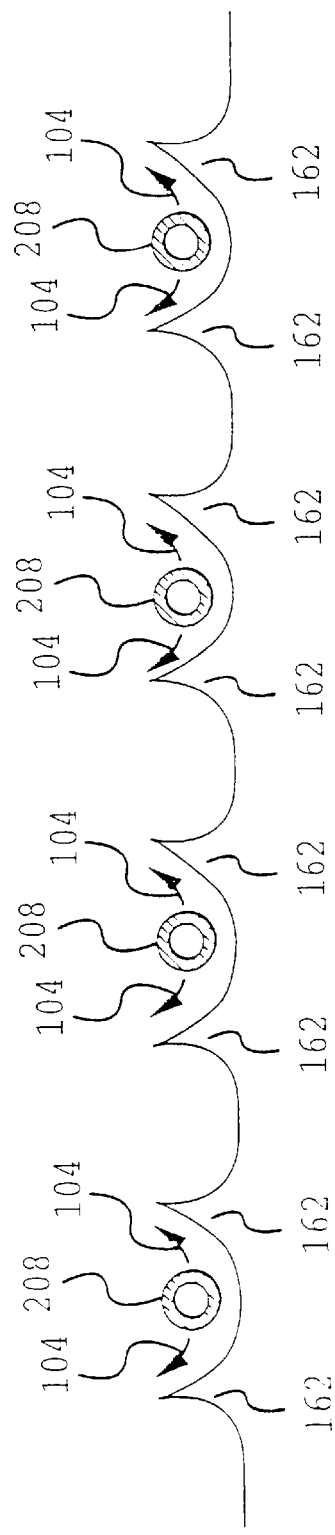
FIG. 16 shows another embodiment for a gas distribution configuration for the aerosol generator of the present invention.

An alternative, and preferred, flow for carrier gas 104 is shown in FIG. 16. As shown in FIG. 16, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 17:
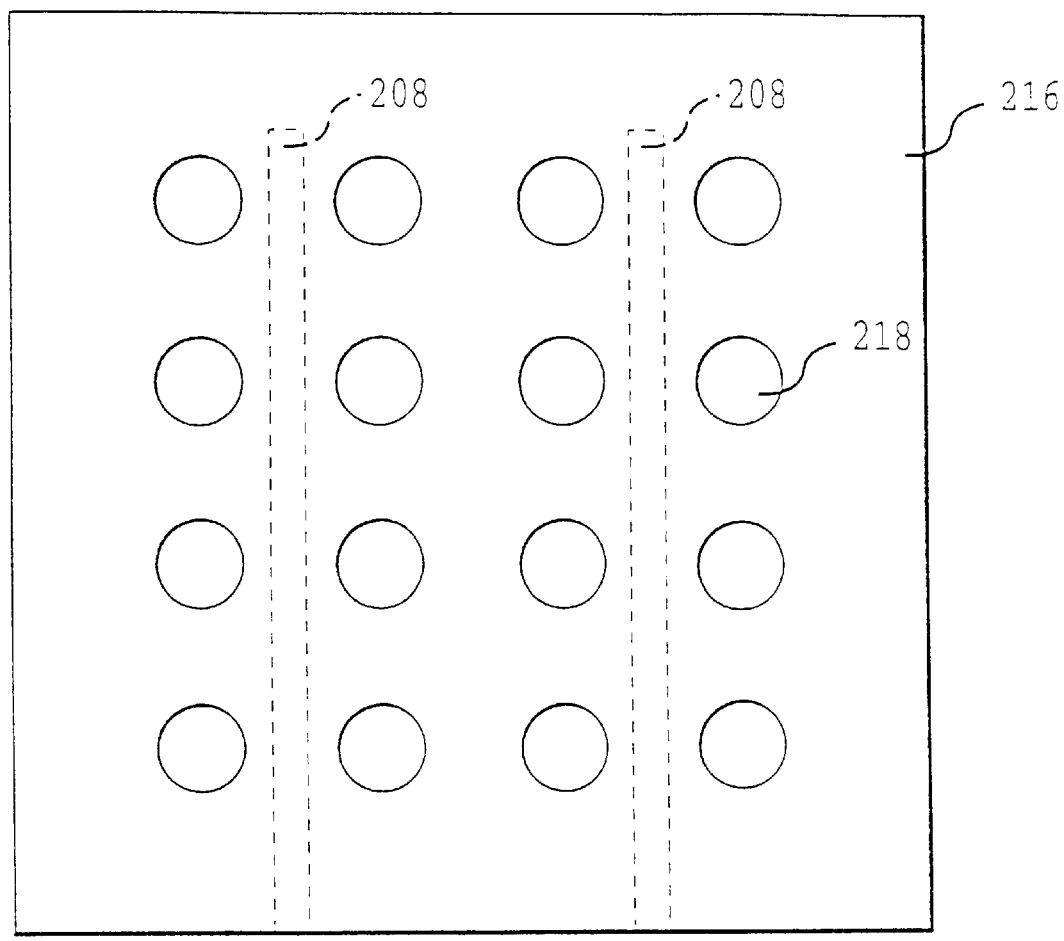
FIG. 17 is a top view of one embodiment of a gas distribution plate/gas tube assembly of the aerosol generator of the present invention.
Figure 18:
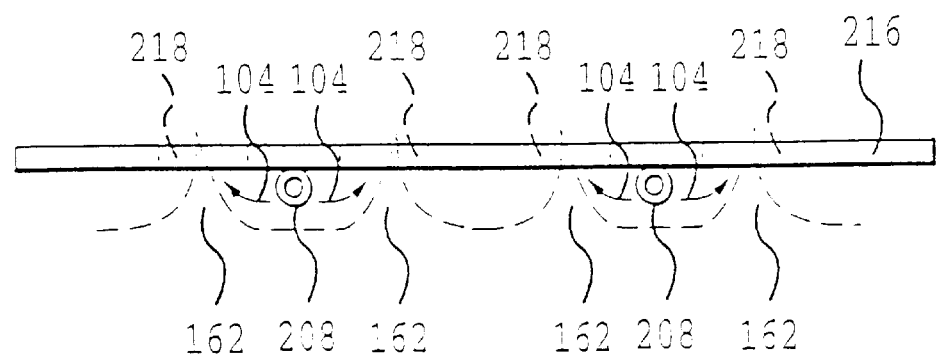
FIG. 18 is a side view of one embodiment of the gas distribution plate/gas tube assembly shown in FIG. 17.
Figure 21:
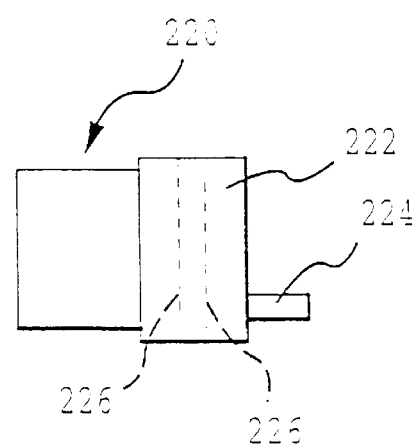
FIG. 21 is a side view of the gas manifold shown in FIG. 20.

Another configuration for distributing carrier gas in the aerosol generator 106 is shown in FIGS. 17 and 18. In this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 18, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 17 and 21 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 19:
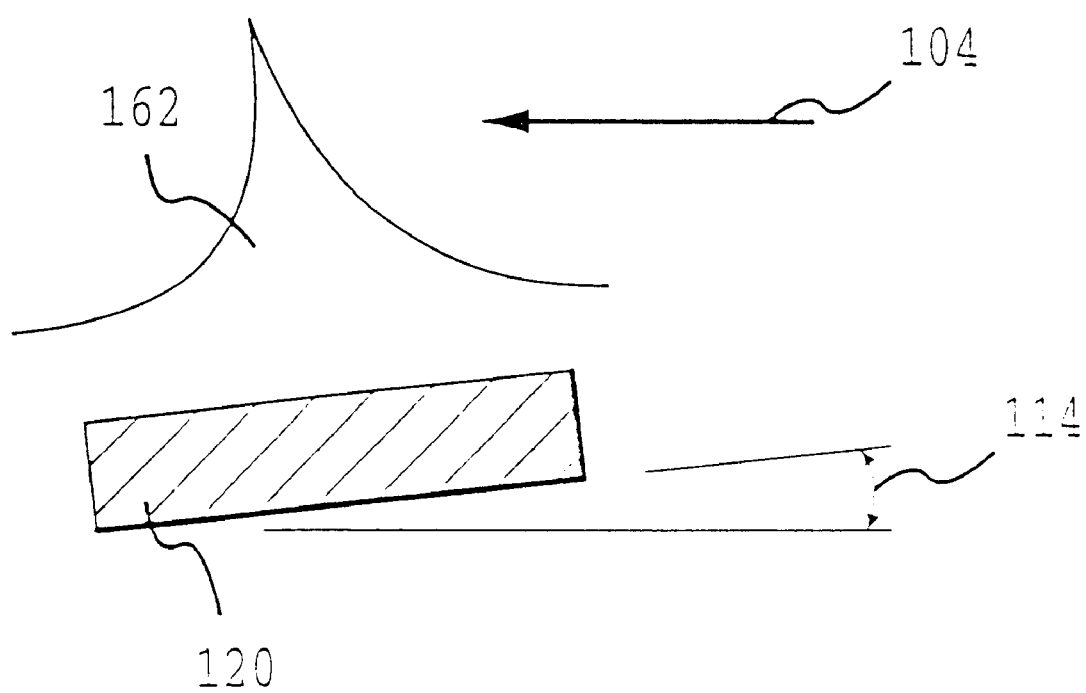
FIG. 19 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 19, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 164 directed at the atomization cone 162 is in the same direction as the tilt of the atomization cone 162.

Figure 20:
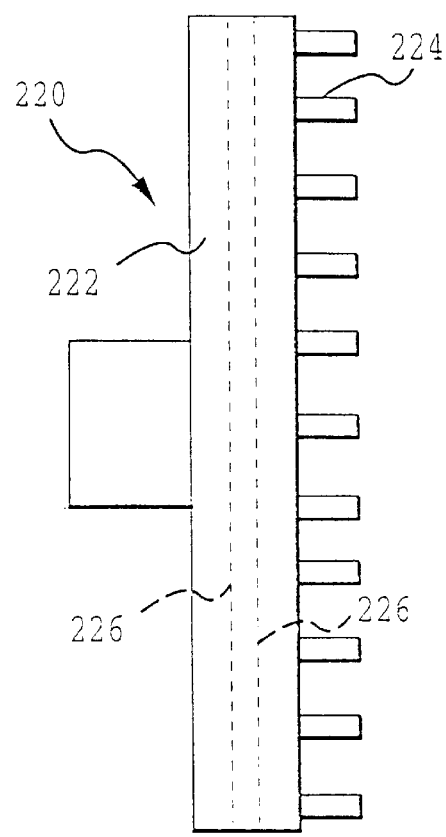
FIG. 20 is a top view of a gas manifold for distributing gas within an aerosol generator of the present invention.

Referring now to FIGS. 20 and 21, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 13). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 20 and 21, is designed to feed eleven gas tubes 208. For the 400 transducer design, a total of four gas manifolds 220 are required.

Figure 22:
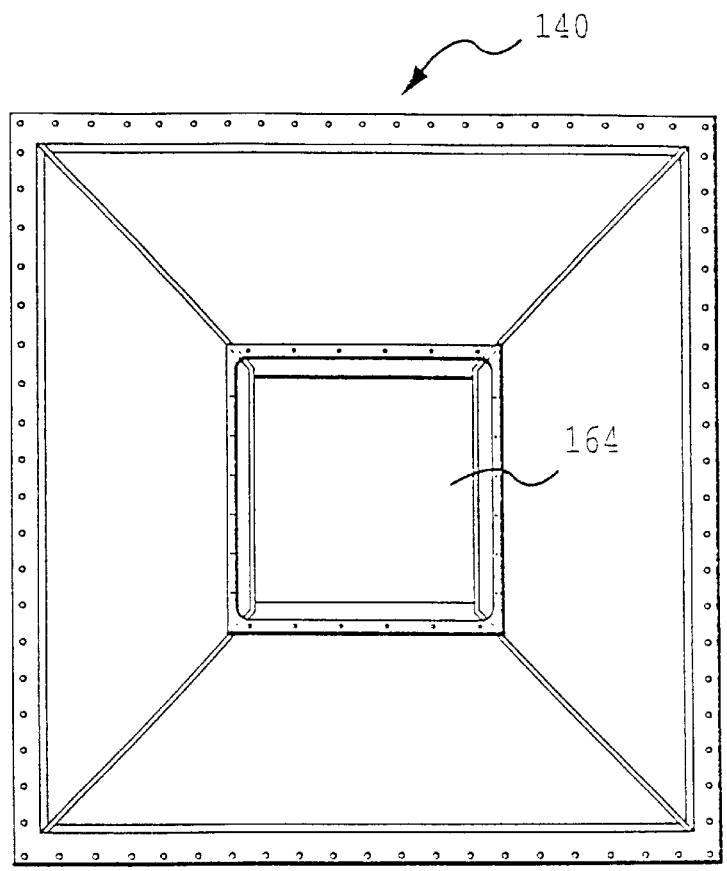
FIG. 22 is a top view of a generator lid of a hood design for use in an aerosol generator of the present invention.
Figure 23:
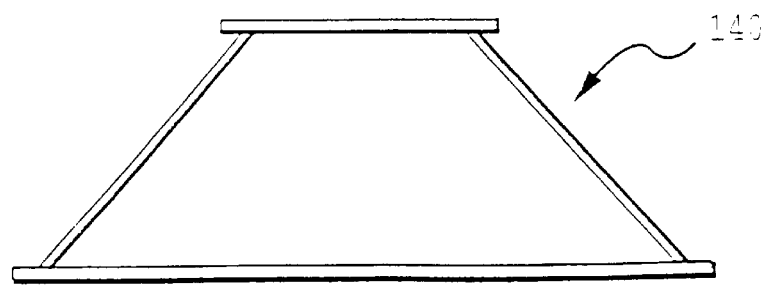
FIG. 23 is a side view of the generator lid shown in FIG. 22.

Referring now to FIGS. 22 and 23, the generator lid 140 is shown for a 400 transducer array design. The generator lid 140 mates with and covers the liquid feed box 190 (shown in FIGS. 11 and 12). The generator lid 140, as shown in FIGS. 22 and 23, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator 106 is in operation, the aerosol 108 would be withdrawn via the aerosol exit opening 164 through the generator cover 140.

It is important that the aerosol stream fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

As discussed previously, the aerosol generator 106 of the present invention produces a concentrated, high quality aerosol of micro-sized droplets having a relatively narrow size distribution. It has been found, however, that for many applications the process of the present invention can be enhanced by further classifying by size the droplets in the aerosol 108 prior to introduction of the droplets into the furnace 110. In this manner, the size and size distribution of particles in the particulate product 116 are further controlled.

Figure 24:
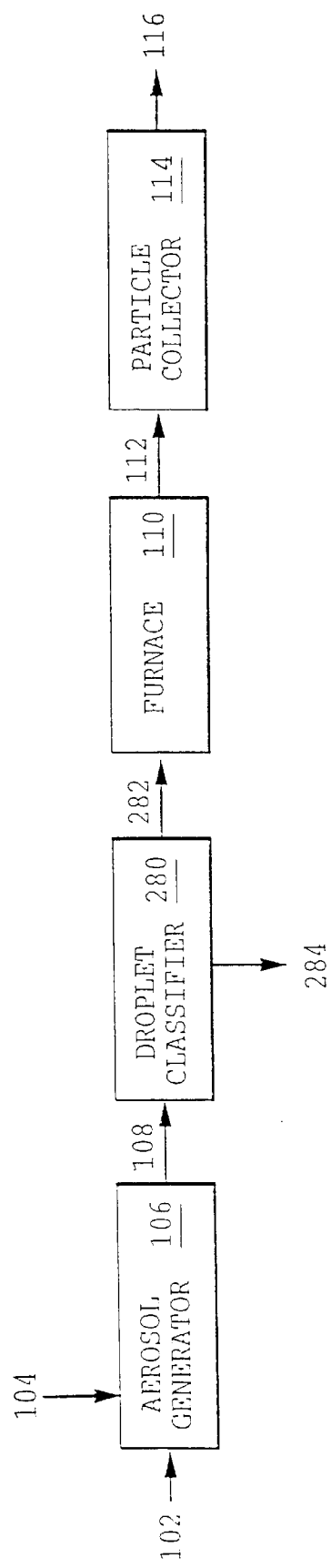
FIG. 24 is a process block diagram of one embodiment of the process of the present invention including a droplet classifier.

Referring now to FIG. 24, a process flow diagram is shown for one embodiment of the process of the present invention including such droplet classification. As shown in FIG. 24, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 25–29.

Figure 25:
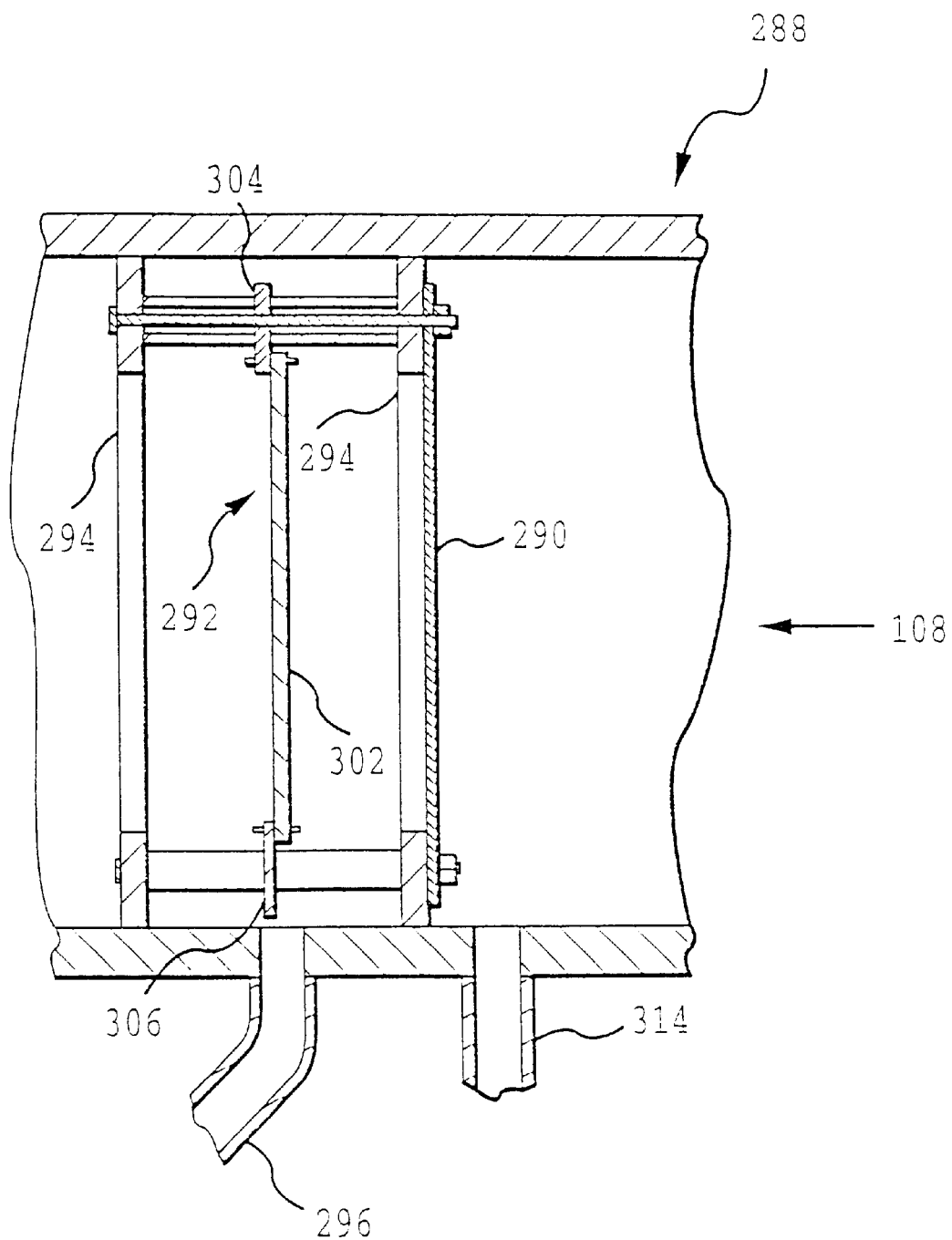
FIG. 25 is a top view in cross section of an impactor of the present invention for use in classifying an aerosol.

As seen in FIG. 25, an impactor 288 has disposed in a flow conduit 286 a flow control plate 290 and an impactor plate assembly 292. The flow control plate 290 is conveniently mounted on a mounting plate 294.

Figure 26:
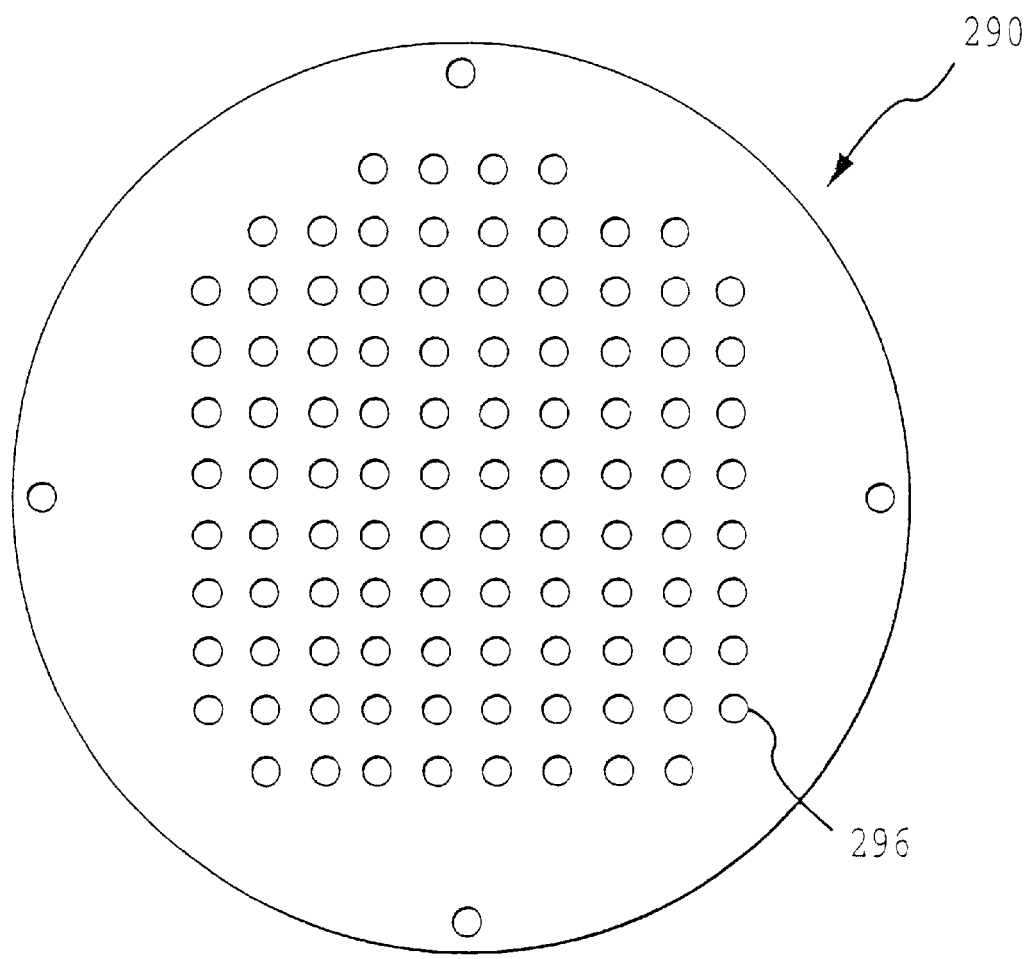
FIG. 26 is a front view of a flow control plate of the impactor shown in FIG. 25.

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 26. The flow control plate 290 has an array of circular flow ports 296 for channeling flow of the aerosol 108 towards the impactor plate assembly 292 with the desired flow characteristics.

Figure 27:
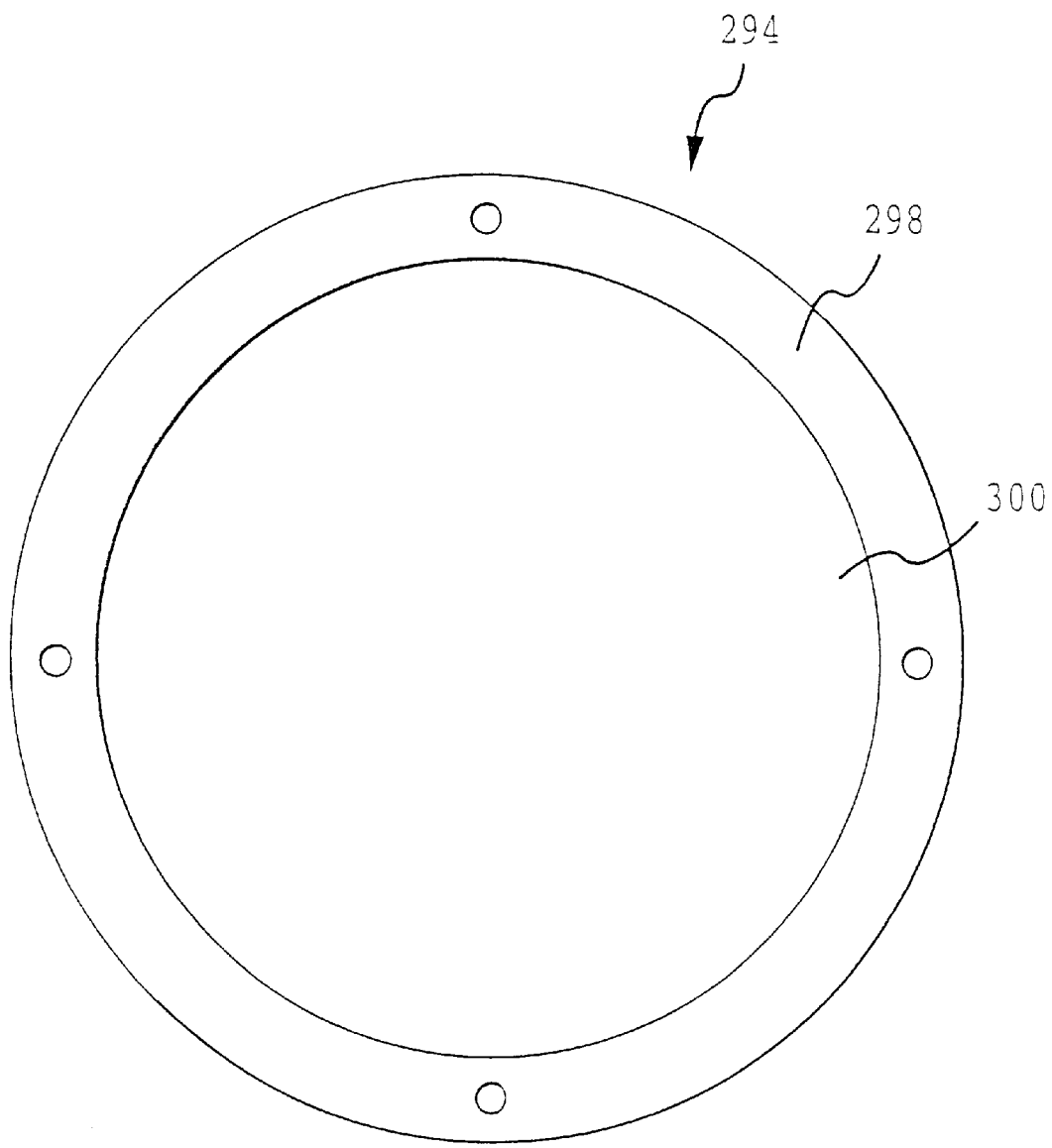
FIG. 27 is a front view of a mounting plate of the impactor shown in FIG. 25.

Details of the mounting plate 294 are shown in FIG. 27. The mounting plate 294 has a mounting flange 298 with a large diameter flow opening 300 passing therethrough to permit access of the aerosol 108 to the flow ports 296 of the flow control plate 290 (shown in FIG. 26).

Referring now to FIGS. 28 and 29, one embodiment of an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 25).

The configuration of the impactor plate 302 shown in FIG. 24 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away.

The classification size, also called the classification cut point, is that size at which half of the droplets of that size are removed and half of the droplets of that size are retained. Depending upon the specific application the droplet classification size may be varied, such as by changing the spacing between the impactor plate 302 and the flow control plate 290 or increasing or decreasing aerosol velocity through the jets in the flow control plate 290. Minimizing the removal of liquid feed 102 from the aerosol 108 is particularly important for commercial applications to increase the yield of high quality particulate product 116. It should be noted that because of the superior performance of the aerosol generator 106, it is typically not required to use an impactor or other droplet classifier to obtain a suitable aerosol. This is a major advantage, because the added complexity and liquid losses accompanying use of an impactor may often be avoided with the process of the present invention.

Figure 30:
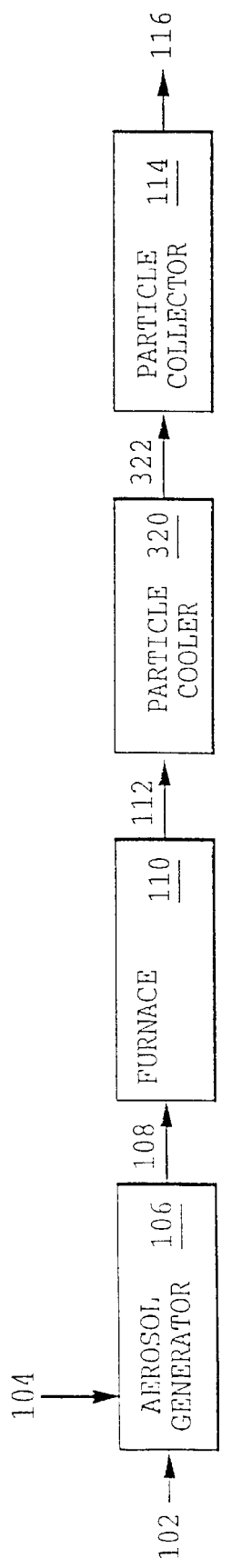

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 30, one embodiment of the process of the present invention is shown in which the particles 112 exiting the furnace 110 are sent to a particle cooler 320 to produce a cooled particle stream 322, which is then fed to the particle collector 114. According to the present invention, a gas quench apparatus is provided for use as the particle cooler 320 that significantly reduces thermophoretic losses compared to a traditional heat exchanger.

Referring now to FIGS. 31–33, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion of an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 33, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream radiant heating from the furnace is normally not a significant problem. Use of the heat radiation shields 347 is not preferred due to particulate losses that accompany their use.

With continued reference to FIGS. 31–33, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas.

Also, as shown in FIG. 32, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensable vapor in the stream. The temperature of the cooled particle stream 322 is often at a temperature of from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 31–33, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Figure 34:
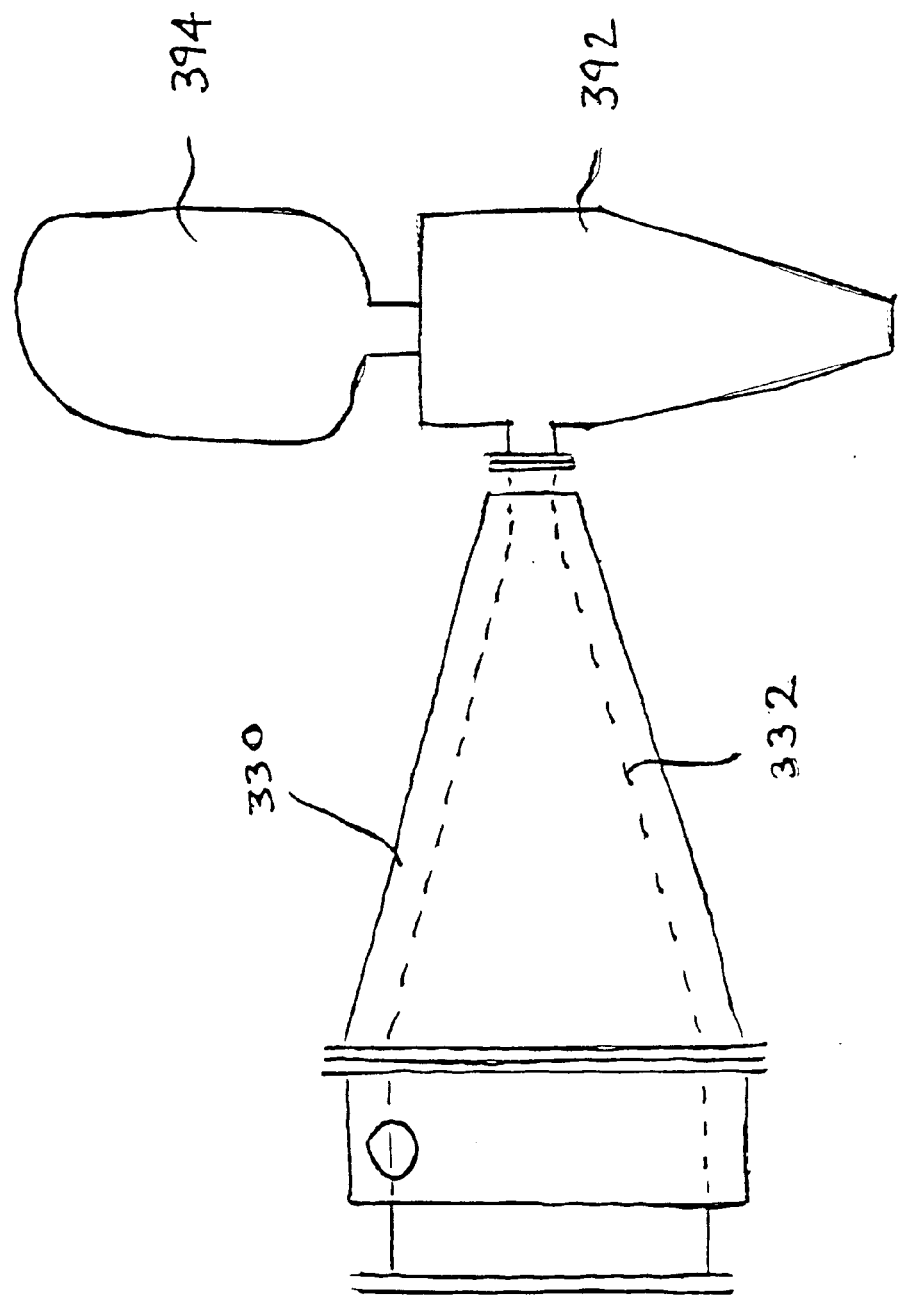

Referring now to FIG. 34, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up of overflow from the cyclone separator 392. Separated particles exit with underflow from the cyclone separator 392 and may be collected in any convenient container. The use of cyclone separation is particularly preferred for powder having a weight average size of larger than about 1 μm, although a series of cyclones may sometimes be needed to obtain the desired degree of separation. Cyclone separation is particularly preferred for powders having a weight average size of larger than about 1.5 μm.

Figure 35:
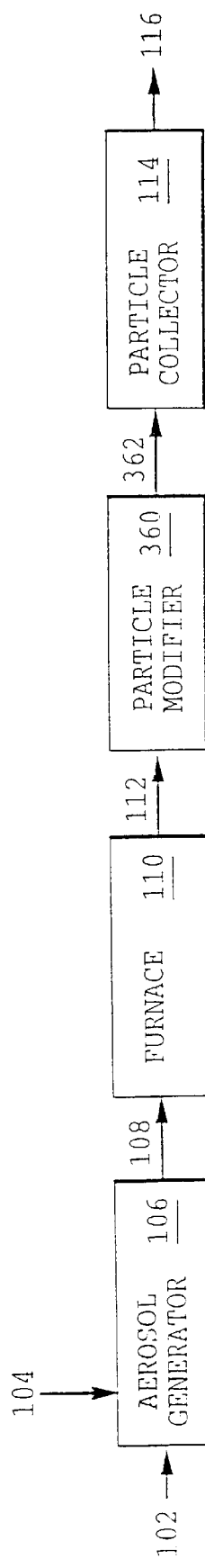

In a further embodiment of the present invention, following preparation of the particles 112 in the furnace 110, the particles 112 may then be structurally modified to impart desired physical properties prior to particle collection. Referring now to FIG. 35, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural modification of the particles 112.

Figure 36:
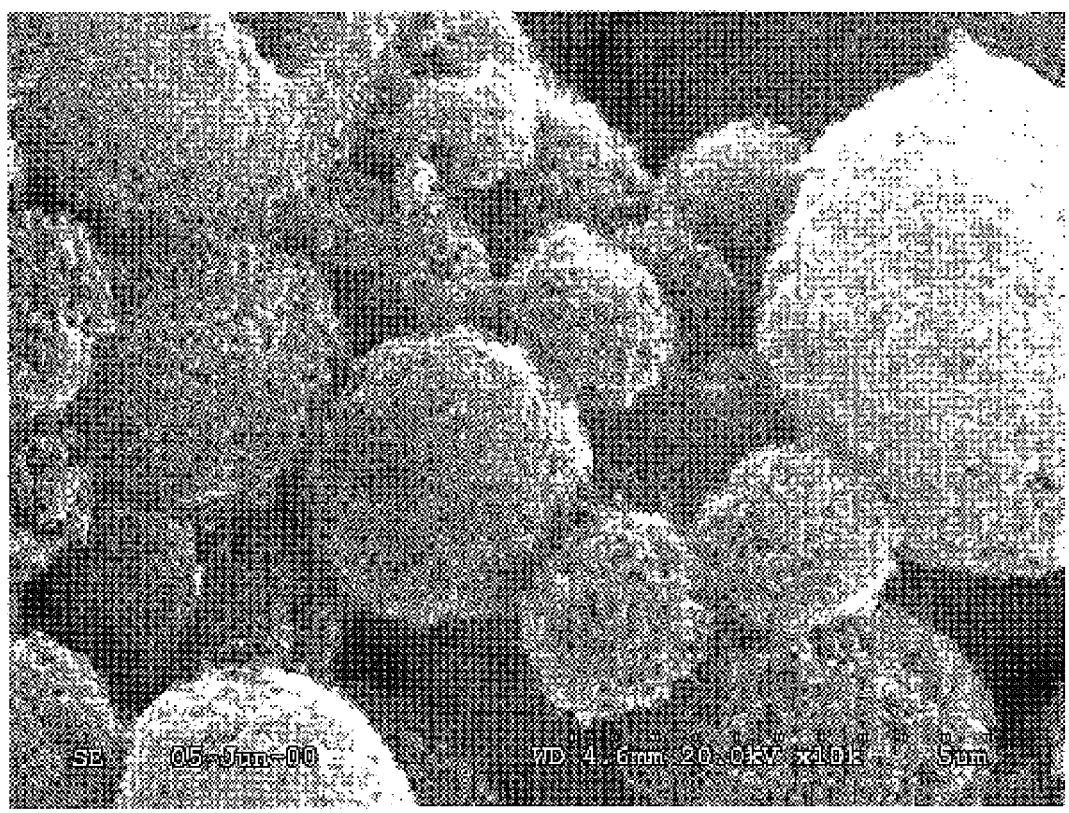
Figure 37:
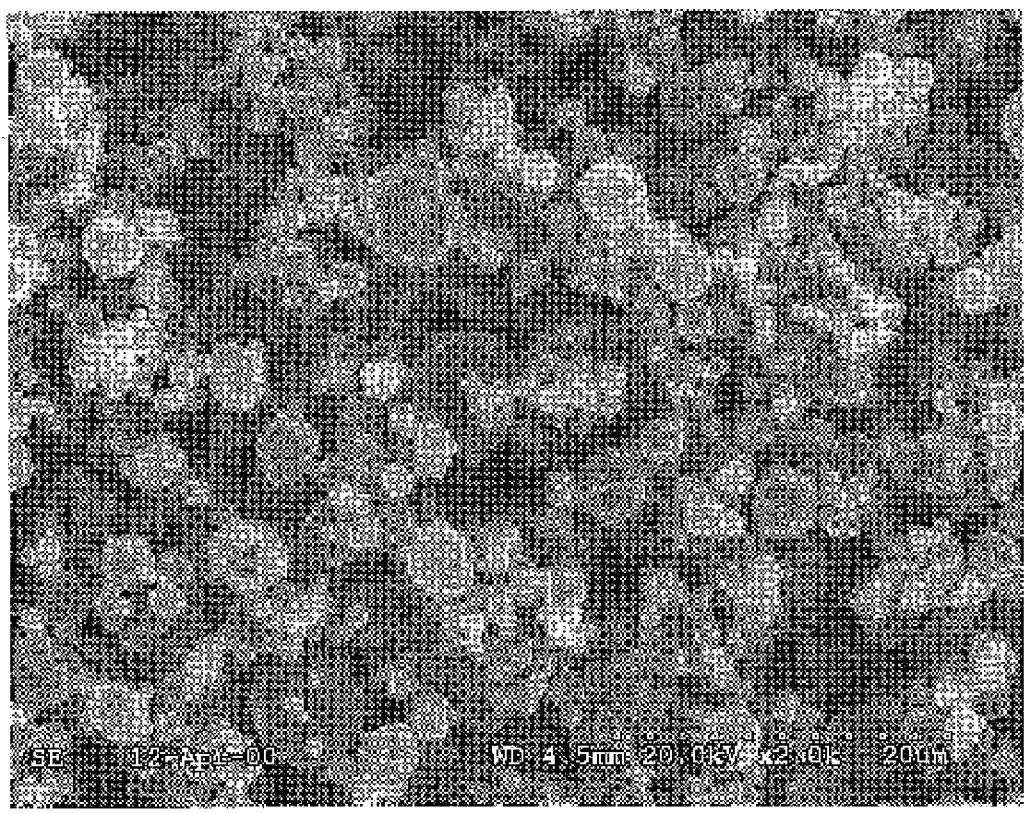

The foregoing methods produce fine powders having a small partide size, spherical morphology and a well-controlled chemistry. FIG. 36 is an SEM photomicrograph (×10 k) of TEFLON coated carbon particles according to an embodiment of the present invention, which are useful for forming a hydrophobic layer in a thin film battery according to the present invention. FIG. 37 is an SEM photomicrograph (×2.0 k) of a bifunctional electrocatalyst (Ni—Co—O). In both instances, the particles are spherical with a well controlled size.

The fine powders of the present invention can be deposited onto device surfaces or substrates by a number of different deposition methods which involve the direct deposition of the dry powder such as dusting, electrophotographic or electrostatic precipitation. Other deposition methods involve liquid vehicles such as ink jet printing, syringe dispense, toner deposition, slurry deposition, paste-based methods and electrophoresis. In all these deposition methods, the powders according to the present invention have a number of advantages over the powders produced by other methods. For example, small, spherical, narrow size distribution particles are more easily dispersed in liquid vehicles, they remain dispersed for a longer period of time and allow deposition of smoother and finer features compared to powders made by alternative methods.

In many applications, the electrocatalyst powders are formed into a layer, often in combination with other materials as a component of a device such as a fuel cell or battery. The method by which these materials are deposited has a strong influence on the characteristics of the deposited layer. In turn, the characteristics of the deposited layer also has a strong influence on the performance of the device. Layer characteristics that are important include average thickness, porosity, compositional homogeneity, nature of the interface with other layers, control over the compositional gradient within a layer and the hydrophobicity, hydrophilicity, wettability and accessibility of the surface.

The electrocatalyst powders according to the present exhibit a high catalytic activity and also have a microstructure which enables them to be formed into layers by methods that are not useful with electrocatalyst powders having different characteristics. The high catalytic activity enables thinner layers of these materials to be deposited since a reduced mass of the electrocatalyst is required to achieve the same level of performance. However, it is also important that in the process of printing the layer, the performance advantages of the powders is retained in the layers, for example access to the porosity of the individual particles.

One way of depositing the fine powders of the present invention is to apply the powders to a substrate through the use of a thick-film paste. In the thick film process, a viscous paste that includes a functional particulate phase (e.g., a carbon composite powder) is screen printed onto a substrate. More particularly, a porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a screen printing device and the thick film paste is deposited on top of the screen. The substrate to be printed is then positioned beneath the screen and the paste is forced through the screen and onto the substrate by a squeegee that traverses the screen. Thus, a pattern of traces and/or pads of the paste material is transferred to the substrate. The substrate with the paste applied in a predetermined pattern is then subjected to a drying and firing treatment to solidify and adhere the paste to the substrate.

Thick film pastes have a complex chemistry and generally include a functional phase, a binder phase and an organic vehicle phase. The functional phase include the electrocatalyst powders of the present invention. The binder phase can be, for example, a mixture of carbon, metal oxide or glass frit powders. PbO based glasses are commonly used as binders. The function of the binder phase is to control the sintering of the film and assist the adhesion of the functional phase to the substrate and/or assist in the sintering of the functional phase. Reactive compounds can also be included in the paste to promote adherence of the functional phase to the substrate.

Thick film pastes also include an organic vehicle phase that is a mixture of solvents, polymers, resins and other organics whose main function is to provide the appropriate rheology (flow properties) to the paste. The liquid solvent assists in mixing of the components into a homogenous paste and substantially evaporates upon application of the paste to the substrate. Usually the solvent is a volatile liquid such as methanol, ethanol, terpineol, butyl carbitol, butyl carbitol acetate, aliphatic alcohols, esters, acetone and the like. The other organic vehicle components can include thickeners (sometimes referred to as organic binders), stabilizing agents, surfactants, wetting agents and the like. Thickeners provide sufficient viscosity to the paste and also acts as a binding agent in the unfired state. Examples of thickeners include ethyl cellulose, polyvinyl acetates, resins such as acrylic resin, cellulose resin, polyester, polyamide and the like. The stabilizing agents reduce oxidation and degradation, stabilize the viscosity or buffer the pH of the paste. For example, triethanolamine is a common stabilizer. Wetting agents and surfactants arewell known in the thick film paste art and can include triethanolamine and phosphate esters.

The different components of the thick film paste are mixed in the desired proportions in order to produce a substantially homogenous blend wherein the functional phase is well dispersed throughout the paste. Typically, the thick film paste will include from about 5 to about 95 weight percent such as from about 60 to 85 weight percent, of the functional phase, including the carbon composite powders of the present invention.

Examples of thick film pastes are disclosed in U.S. Pat. Nos: 4,172,733; 3,803,708; 4,140,817; and 3,816,097 all of which are incorporated herein by reference in their entirety.

Some applications of thick film pastes require higher tolerances than can be achieved using standard thick-film technology, as is described above. As a result, some thick film pastes have photo-imaging capability to enable the formation of lines and traces with decreased width and pitch (distance between lines). In this type of process, a photoactive thick film paste is applied to a substrate substantially as is described above. The paste can include, for example, a liquid vehicle such as polyvinyl alcohol, that is not crosslinked. The paste is then dried and exposed to ultraviolet light through a patterned photomask to polymerize the exposed portions of paste. The paste is then developed to remove unwanted portions of the paste. This technology permits higher density lines and features to be formed. The combination of the foregoing technology with the composite powders of the present invention permits the fabrication of devices with higher resolution and tolerances as compared to conventional technologies using conventional powders.

In addition, a laser can be used instead of ultraviolet light through a mask. The laser can be scanned over the surface in a pattern thereby replacing the need for a mask. The laser light is of sufficiently low intensity that it does not heat the glass or polymer above its softening point. The unirradiated regions of the paste can then be removed leaving a pattern. Likewise, conventional paste technology utilizes heating of the substrate to remove the vehicle from a paste and to fuse particles together or modify them in some other way. A laser can be used to locally heat a conventionally applied paste layer wherein the laser is scanned over the paste layer to form a pattern. The laser heating is confined to the paste layer and drives out the paste vehicle and heats the powder in the paste without appreciably heating the substrate. This allows heating of particles, delivered using pastes, without damaging a glass or even polymeric substrate.

It is particularly advantageous according to the present invention to print the layers containing the powders of the present invention using a direct-write tool. There are a number of advantages of constructing an energy device such as a battery or fuel cell using direct-write methods. Direct-write methods enable the formation of layers that are thinner and with smaller feature sizes than those that can be produced by manufacturing methods such as rolling and pressing. The thinner layers result in reduced mass and volume and therefore an increase in the volumetric and gravimetric energy density of the battery. The thin devices can be incorporated into unusual vehicles or be directly integrated with electronic devices to form compact, self-contained operational systems.

Thinner layers can also facilitate faster transport of chemical species such as ions, electrons and gases due to the reduced diffusional distances. This can lead to improved battery performance where, for example, the diffusion of a chemical species is otherwise a rate limiting factor. This is the case in metal-air batteries where the transport of $O_2$ or hydroxide ion in the air electrode can be rate limiting. Shorter diffusional distances and lower diffusional barriers will lead to a higher rate of drain for this type of device. The discharge rate can also be improved.

Direct-write methods can also facilitate better control over the construction of interfaces and layer compositions giving rise to tailored gradients in composition and layer surface morphology that facilitate chemical transport and electrochemical reactions.

Certain direct-write methods facilitate the construction of features with combined functionalities such that multiple layers may be combined into a single layer with multiple functions to provide benefits in both performance and energy density.

To be deposited using a direct-write tool, the particles must be carried in a liquid vehicle. The particles should remain well-dispersed in the liquid vehicle for extended periods of time and therefore the cartridge or reservoir into which the suspension is placed will have a long shelf-life. In some instances, substantially fully dense particles can be adequately dispersed and suspended. Depending upon the density of the particle compound, however, particles with a high density relative to the liquid in which they are dispersed and with a size in excess of about 0.5 $\mu$m cannot be suspended in a liquid that has a sufficiently low viscosity to be deposited using a direct-write tool, particularly an ink-jet device. In most cases, the apparent density of the particles must therefore be substantially lower than the theoretical density.

More specifically, it is desirable to maintain a substantially neutral buoyancy of the particles in the suspension while maintaining a relatively large physical size. The buoyancy is required for ink stability while the larger size maintains ink properties, such as viscosity, within useful ranges. Stated another way, it is desirable to provide particles having a low settling velocity but with a sufficiently large particle size. The settling velocity of the particles is proportional to the apparent density of the particle ($\rho_S$) minus the density of the liquid ($\rho_L$). Ideally, the fine particles will have an apparent density that is approximately equal to the density of the liquid, which is typically about 1 g/cm$^3$ (i.e., the density of water). Since a compound such as an oxide has a theoretical density ($\rho_P$) in the range of from about 3 to about 7 g/cm$^3$, it is preferable that the apparent density of such particles be a small percentage of the theoretical density. According to one embodiment, the particles have an apparent density that is not greater than about 50 percent of the particles theoretical density, more preferably not greater than about 20 percent of the theoretical density. Such particles would have small apparent sizes when measured by settling techniques, but larger sizes when measured by optical techniques.

In the case of electrocatalyst powders, especially carbon-based electrocatalyst powders, they are designed to have a high degree of porosity and therefore relatively low density. This aids in the suspendability of these powders in low viscosity inks having a high solids loading.

Some electrocatalyst formulations may be comprised of material with a relatively high density. One preferred method for obtaining a reduced apparent density of the fine particles according to the present invention is to produce particles having either a hollow or a porous microstructure (or a combination thereof). Hollow electrocatalyst particles might include carbon, metal or metal oxide based materials where the surface area of these materials is high with a desire to maintain a relatively low apparent density. That is, one preferred particle morphology is a particle comprised of a dense shell having an inner radius and an outer radius. Preferably, the shell has a high density and is substantially impermeable. Assuming that air fills the interior of such a hollow particle, the equation representing the conditions for neutral buoyancy can be written:

$$r_2 = \left[ \sqrt[3]{\frac{\rho_p}{\rho_p - 1}} \right] r_1$$

where:
$r_2$=outer radius
$r_1$=inner radius
$\rho L$=1 (water)
$\rho_P$=theoretical density of the particle For example, if a hollow particle has an outer radius of 2 $\mu$m (4 $\mu$m diameter) and a density of 5 g/cm$^3$, then the optimum average wall thickness would be about 0.15 $\mu$m for the particle to be neutrally buoyant in a liquid having a density of 1 g/cm$^3$. According to one preferred embodiment, the hollow particles have an average wall thickness that is not greater than about 10 percent of the particle diameter, and more preferably not greater than about 5 percent of the particle diameter.

It will be appreciated that other particle morphologies can be utilized while maintaining an apparent density within the desired range. For example, the electrocatalyst particles can have a sufficient amount of porosity to yield a particle having an apparent density that is lower than the theoretical density. Open (surface) porosity can also decrease the apparent density if the surface tension of the liquid medium does not permit penetration of the surface pores by the liquid.

Thus, the fine particles according to the present invention have a low settling velocity in the liquid medium. The settling velocity according to Stokes Law is defined as: where $$V = \frac{D_{st}^2 (\rho_s - \rho_l) g}{18 \eta}$$

| | |
|---|---|
| $D_{st}$ = | Stokes diameter |
| $\eta$ = | fluid viscosity |
| $\rho_s$ = | apparent density of the particle |
| $\rho_l$ = | density of the liquid |
| V = | settling velocity |
| g = | acceleration due to gravity |

Preferably, the average settling velocity of the particles is sufficiently low such that the suspensions have a useful shelf-life without the necessity of frequent mixing. It is preferred that a large mass fraction of the particles, such as at least about 50 weight percent remains suspended in the liquid. The particles preferably have an average settling velocity that is not greater than 50 percent, more preferably not greater than 20 percent, of a theoretically dense particle of the same composition. Further, the particles can be completely redispersed after settling, such as by mixing, to provide the same particle size distribution in suspension as measured before settling.

In one embodiment, the electrocatalyst particles can include a hydrophilic compound, such as silica ($SiO_2$), hydrophilic carbon, another metal oxide or a surface modification agent/surfactant, to enhance the dispersion characteristics of the powder in the liquid, provided that such an additive does not interfere with the electrocatalytic properties of the particles. Preferably, the hydrophilic compound is found on at least a portion of the surface of the particle. As is discussed in more detail above, the powders according to the present invention are preferably produced utilizing a spray pyrolysis or spray conversion technique, typically in the presence of water vapor. The presence of water vapor during formation of the particles can advantageously result in a hydroxylated particle surface. Such a hydroxylated surface provides further hydrophilicity of the particle, aids in the dispersion of the particles and reduces the number of particle agglomerates in the liquid suspension.

Figure 38:
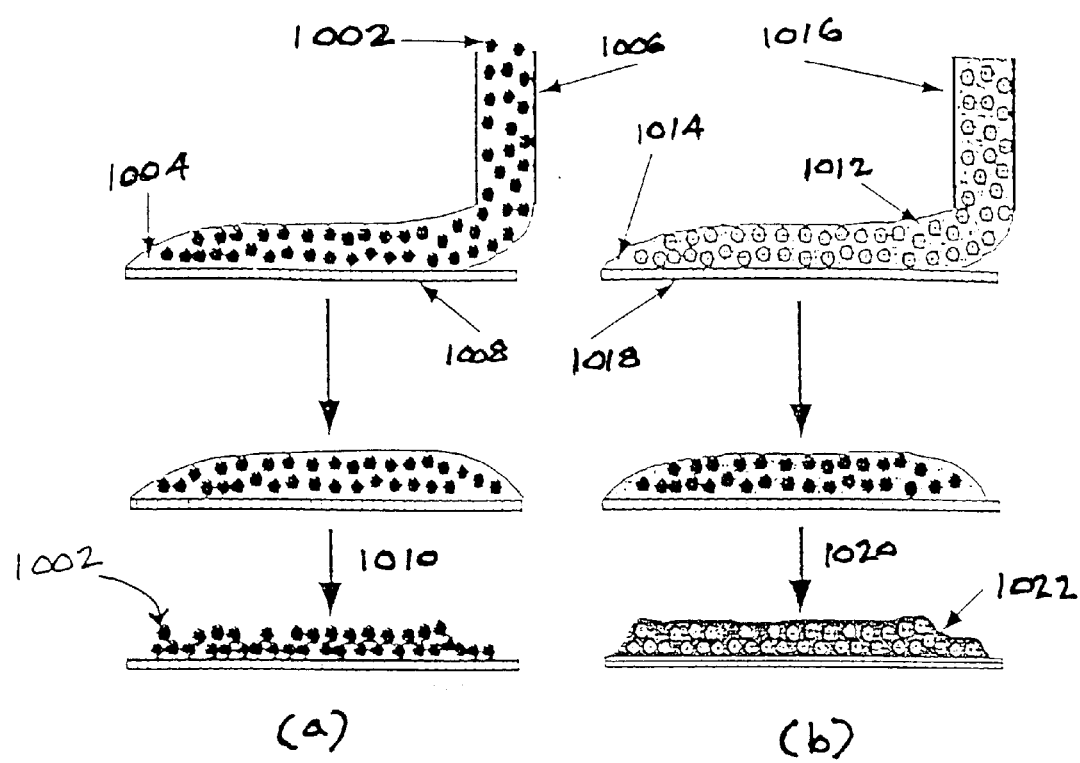

A direct-write deposition method according to the present invention is illustrated schematically in FIG. 38. In FIG. 38($a$), a fine powder 1002 is dispersed in an organic vehicle 1004 including water and various organics to aid in the dispersion of the fine powder 1002. The direct-write tool 1006 ejects the suspension through an orifice and onto a substrate 1008. After deposition the substrate 1008 is thermally treated 1010 to remove the liquid vehicle 1004 including the organics and deposit a thin layer of fine particles 1002.

In the embodiment illustrated in FIG. 38($b$), the particles 1012 are dispersed in a liquid vehicle 1014 which include water, organics and at least one molecular precursor to a compound or a metal. The liquid suspension including the particles 1012 and the precursor-containing liquid vehicle 1014 are deposited using a direct-write tool 1016 onto a substrate 1018. After deposition, the substrate 1018 is thermally treated 1020 to remove liquids and convert the precursors to their respective compound or metal. The resulting layer 1022 includes particles dispersed throughout a film of the compound or metal.

As used herein, a direct-write tool is a device that deposits a liquid or liquid suspension onto a surface by ejecting the liquid through an orifice toward the surface without the tool making substantial contact with the surface. The direct-write tool is preferably controllable over an x-y grid relative to the printed surface (i.e. either or both the substrate and device may move). One preferred direct-write tool according to the present invention is an ink-jet device. Other examples of direct-write tools include automated syringes, such as the MICROPEN tool (Ohmcraft, Inc. Honeoye Falls, N.Y.) and the DOTLINER dispense system (Manncorp, Huntingdon Valley, Pa.) which is capable of dispensing lines, dots and areas down to 200 $\mu$m or smaller at speeds of up to 10,000 dots/hour.

According to the present invention, the orifice of the direct-write tool can have a reduced diameter. This is a direct result of the particle characteristics discussed hereinabove. A reduced diameter will enable the formation of finer features.

One preferred direct-write tool according to the present invention is an ink-jet device. Ink-jet devices operate by generating droplets of ink and directing the droplets toward a surface. Ink-jet printing, when applied to the particulate suspensions in accordance with the present invention is a means for delivering controlled quantities of the particles to a variety of substrates.

The position of the ink-jet head is carefully controlled and can be highly automated so that discrete patterns of the ink can be applied to the surface. Ink-jet printers are capable of printing at a rate of 1000 drops per second or higher and can print linear features with good resolution at a rate of 10 cm/sec or more, up to about 1000 cm/sec. Each drop generated by the ink-jet head includes approximately 2 to 200 picoliters of the liquid that is delivered to the surface. For these and other reasons, ink-jet devices are a highly desirable means for depositing materials onto a surface.

Typically, an ink-jet device includes an ink-jet head with one or more orifices having a diameter of less than about 100 $\mu$m, such as from about 50 $\mu$m to 75 $\mu$m. Ink droplets are generated and are directed through the orifice toward the surface being printed. Ink-jet printers typically utilize a piezoelectric driven system to generate the droplets, although other variations are also used. Ink-jet devices are described in more detail in, for example, U.S. Pat. No. 4,627,875 by Kobayashi et al. and U.S. Pat. No. 5,329,293 by Liker, each of which is incorporated herein by reference in their entirety. However, such devices have primarily been used to deposit inks of soluble dyes.

Ideally, the droplet generated by the printer head is identical in composition to the bulk fluid. However, some filtration of suspensions may occur if the particles are too large to pass through the channels or onboard filters. The small particle size and reduced number of particle agglomerates according to the present invention reduces the amount of particles collected by the filter and can enable removal of the filter.

According to the present invention, it is possible to deposit gradient layers of material wherein the composition of the layer changes through the thickness of the layer. In order to deposit such layers, it is preferred to form the layer using multiple direct-write deposition steps wherein the composition of the suspension being deposited changes through the layer. Such gradient layers are discussed in more detail below.

Utilizing the direct-write method of the present invention, it is also possible to form features and create device components on a non-planar surface, if required for a specific application or product geometry.

According to the present invention, more than one type of particle can be dispersed in a single liquid vehicle for deposition with a direct-write tool. The particles can be dispersed into the liquid vehicle by lightly mixing or, for example, by using ultrasound. For use in an ink-jet device, the viscosity of the suspension is preferably not greater than about 30 centipoise, more preferably not greater than about 20 centipoise. It is also important to control the surface tension of the liquid suspension and preferably the surface tension is from about 20 to 25 dynes/cm for an ink-jet device.

The solids loading of fine particles in the suspension is preferably as high as possible without adversely affecting the viscosity or other necessary properties of the direct-write composition. For example, the direct-write composition can have a particle loading of up to about 75 weight percent, such as from about 10 to about 50 weight percent.

The direct-write compositions are typically water-based, although other solvents or liquids may be used. Such compositions can include other chemicals including, but not limited to, surfactants, dispersion agents, defoamers, chelating agents, humectants and the like.

More specifically, ink-jet compositions generally include water and an alcohol. Organic solvent based systems can also be used and ink-jet print heads are often tailored for either organic or aqueous systems. Surfactants are also used to maintain the particles in suspension. Co-solvents, also known as humectants, are used to prevent the ink from crusting and clogging the orifice of the ink-jet head. Biocides can also be added to prevent bacterial growth over time. Examples of such ink-jet liquid vehicle compositions are disclosed in U.S. Pat. No. 5,853,470 by Martin et al.; U.S. Pat. No. 5,679,724 by Sacripante et al.; U.S. Pat. No. 5,725,647 by Carlson et al.; U.S. Pat. No. 4,877,451 by Winnik et al.; U.S. Pat. No. 5,837,045 by Johnson et al.; and U.S. Pat. No. 5,837,041 by Bean et al. Each of the foregoing U.S. patents is incorporated by reference herein in their entirety. The selection of such additives is based upon the desired properties of the composition, as is known to those skilled in the art. The fine particles are mixed with the liquid vehicle using a mill or, for example, an ultrasonic processor.

According to one embodiment of the present invention, the liquid vehicle into which the particles are dispersed includes soluble molecular precursors, such as metal precursors, that have a relatively low decomposition temperature, as is illustrated in FIG. 38(b). The molecular precursor is preferably a soluble inorganic compound that can be co-deposited with the powders and then thermally treated to form an essentially continuous phase filling any void space between particles. Low temperature decomposition precursors such as those described herein with respect to spray drying can be used. A preferred type of precursor compound are the alpha hydroxycarboxylate (glycolate) derivatives. Metal carboxylates are often advantageous in this respect for the formation of metal compounds. It will be appreciated that the molecular precursors will have a composition that is specific to the material being deposited. Ligands on the molecular precursors can act as a surfactant or the actual liquid vehicle.

In one embodiment, the molecular precursor forms essentially the same compound as the particles. In this embodiment, the particles in the liquid vehicle can advantageously catalyze the molecular precursor to form the desired compound. The addition of precursors with decomposition temperatures not greater than about 400° C., preferably not greater than about 300° C. and more preferably not greater than about 250° C. allows the formation of functional features on a polymeric substrate, including polyamide, fluoro-polymers, epoxy laminates and other substrates. These molecular precursors are particularly useful when combined with hollow or porous particles because they contribute to higher densities when the deposited layer is sintered. That is, a portion of the final layer comes from the particles and a portion from the molecular precursor wherein the portion from the precursor fills in space between particles and thereby increases the solids fraction in the final structure.

The liquid vehicle can also include carriers to hold the particles together once the particles are deposited. Such a liquid vehicle would be advantageous when the particles are to be deposited and will not be sintered to adhere the particles to one another. The liquid vehicle could also include a polymer that, after deposition, would yield a polymer layer with particles dispersed throughout the polymer. Further, the liquid vehicle could also include a molecular species which can react with the dispersed particles to modify the properties of the particles.

Other processes that can be utilized to fabricate the devices of the present invention include laser transfer and guided optical deposition. In a laser transfer method, a material that is to be deposited is placed onto a transfer substrate such as a glass disc or an organic polymer-based ribbon. The transfer substrate is then placed over the substrate upon which the material is to be deposited. A laser is then used to controllably transfer the material to the substrate from the transfer substrate.

Guided optical deposition is a technique wherein the materials or precursors to the materials are delivered through an optical fiber to the substrate in a controlled manner such that features on the substrate can be formed by controlling the position of the optical fiber relative to the substrate. Upon delivery of the material and or material precursor to the substrate, the material is heated if necessary to convert the material or otherwise modify the material properties. For example, the material can be heated in a localized manner by using a laser.

Particles such as metal-carbon composite particles can also be deposited electrophoretically or electrostatically. The particles are charged and are brought into contact with the substrate surface having localized portions of opposite charge. The layer is typically lacquered to adhere the particles to the substrate. Shadow masks can be used to produce the desired pattern on the substrate surface.

Patterns can also be formed by using an ink jet or small syringe (discussed above) to dispense sticky material onto a surface in a pattern. Powder is then transferred to the sticky regions. This transfer can be done is several ways. A sheet covered with powder can be applied to the surface with the sticky pattern. The powder sticks to the sticky pattern and does not stick to the rest of the surface. A nozzle can be used to transfer powder directly to the sticky regions.

Many methods for directly depositing materials onto surfaces require heating of the particles once deposited to sinter them together and densify the layer. The densification can be assisted by including a molecular precursor to a material in the liquid containing the particles. The particle/molecular precursor mixture can be directly written onto the surface using ink jet, micro-pen, and other liquid dispensing methods. This can be followed by heating in a furnace or heating using a localized energy source such as a laser. The heating converts the molecular precursor into the functional material contained in the particles thereby filling in the space between the particles with functional material.

A number of other methods may be employed to construct layers containing the electrocatalyst powders according to the present invention. For example, the powders can be deposited by doctor blading, slot die or curtain coater methods. In these methods, an ink or paste containing the electrocatalyst powder is applied to the surface using a blade which is held at a specified height from the substrate. The thickness of the layer can be controlled down to several micrometers. For slot die and curtain coater methods, the ink or paste is dispensed through a small gap onto a substrate that may be moving on a web drive.

Roll pressing methods can also be used. Roll pressing methods involve mixing components including the electrocatalyst powder, binders and other property modifiers and feeding them through a roll mill to form a pressed film. Roll pressing is often done directly on other active parts of the energy device such as a nickel mesh current collector.

Electrostatic printing methods can be used wherein the electrocatalyst partides are charged with an electric charge, transferred to the drum of a roller, then transferred to a substrate which has the opposite electric charge to that of the particles. This transfer can be carried out in a fashion that results in a blanket layer over the entire substrate or in a patterned manner with the pattern determined by the distribution of the electrical charge on the substrate surface. Typically this method enables the transfer of layers one particle thick and therefore enables very good control over layer thickness for thin layers.

Gravure, rotogravure and intaglio printing methods can be used wherein an ink or paste containing the electrocatalyst powder is transferred to a sunken surface feature, often on a cylinder, that defines the pattern to be transferred to the substrate surface. The substrate is often a continuous feed from a web drive. Relief and flexographic printing methods can also be used which are the reverse of Gravure printing in that a material, often in the form of a paste or ink, is transferred from a raised pattern on a surface, often a roller, to a substrate.

Lithographic printing methods can also be used. In lithographic printing methods, a photosensitive ink or paste is placed on the substrate and exposed to a source of illumination or electromagnetic radiation, generally UV light, wherein the exposed areas interact with this radiation to undergo a change. The change may result in creation of a soluble or insoluble feature depending on the reactivity of the paste and the desire for positive or negative lithography. After removal of the unwanted matter the patterned layer containing the electrocatalyst powder remains for further processing.

Laser transfer methods can be used in which the electrocatalyst containing material is dispersed on a tape or ribbon and a laser is used to transfer material from the underneath surface of the ribbon or tape to the surface of the desired substrate which is close proximity to the tape. Using this method, features can be built with controlled dimensions.

Spray deposition methods can also be used. In spray deposition methods, an ink containing the electrocatalyst powder is fed through a spray nozzle and atomized to form droplets which are directed to a surface where the electrocatalyst layer is to be deposited.

The fine powders produced according to the present invention result in thinner and smoother powder layers when deposited by such liquid or dry powder based deposition methods. Smoother powder layers are the result of the smaller average particle size, spherical particle morphology and narrower particle size distribution compared to powders produced by other methods.

The present invention is also directed to devices including thin film primary and secondary batteries and in one embodiment is directed to thin film air cathodes for use in such batteries. The thin film air cathodes are particularly useful in metal-air batteries such as Zn/Air primary batteries and Zn/Air secondary batteries and novel batteries referred to herein as metal hydride/air (MH/Air) secondary batteries. The novel air cathode advantageously enables the reduction of oxygen ($O_2$) to hydroxyl ion ($OH^-$) and the transport of the $OH^-$ ions to the anode during discharge and transport $O_2$ to the liquid-solid interface during discharge. For this reason, the thin film air cathodes of the present invention are also referred to as bi-functional oxygen electrodes, since they combine both functions, namely oxygen reduction and oxygen evolution.

Metal-air batteries have the best potential for power density, peak power characteristics, voltaic efficiency and rate capability among all battery technologies. In addition, the components of a metal-air battery are very suitable for printing to produce a light-weight, thin battery. The high rate of discharge is also advantageous for portable devices that require frequent high current discharge with a background of low current continuous operation.

The metal-air batteries according to the present invention include multiple functional layers, two or more of which may be combined into a single multi-functional layer. The functional layers can include a membrane layer, current collector, hydrophobic layer, electrocatalyst layer, an electrolyte, separator and anode.

Figure 39:
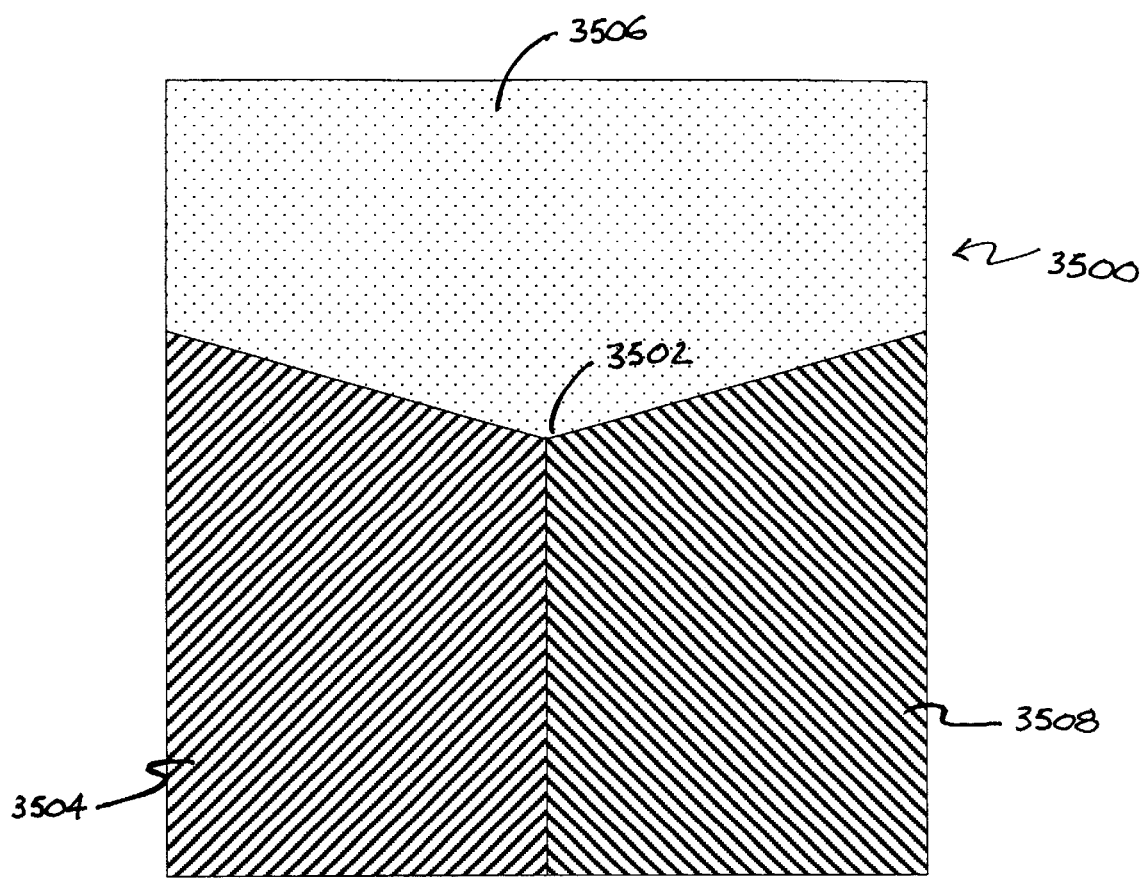

The main electrocatalytic processes in the air cathode of a metal/air battery take place in a 3-phase boundary (electrode/air/electrolyte) which is graphically illustrated in FIG. 39. The electrocatalyst for oxygen reduction must populate the zone of 3-phase contact 3502 and be in electrical contact with the electrode (current collector) 3504 and in diffusional contact with the electrolyte 3506 and the air 3508. To accomplish this, present metal air battery cathodes include a gas-diffusion layer, a catalytic layer and a current collection system. The gas-diffusion layer is characterized by high gas permeability and impermeability to aqueous solutions. The catalytic layer consists of a porous conductive matrix with a highly dispersed electrocatalyst to yield a distribution of hydrophobic pores for oxygen supply and hydrophilic pores for electrolyte exposure. The current collector is usually made from an inert metal mesh, such as nickel or nickel alloy mesh in intimate mechanical contact with the pressed matrix of highly dispersed carbon.

It is desirable to maximize the exposure of the active electrocatalyticsites to both air and the electrolyte. According to the present invention, a gradient of hydrophilic/hydrophobic properties across the catalytic layer in the zone of 3-phase contact can be utilized to enhance the properties of the air cathode. Various embodiments of the air cathode according to the present invention will now be described with particular reference to FIGS. 40–47.

Figure 40:
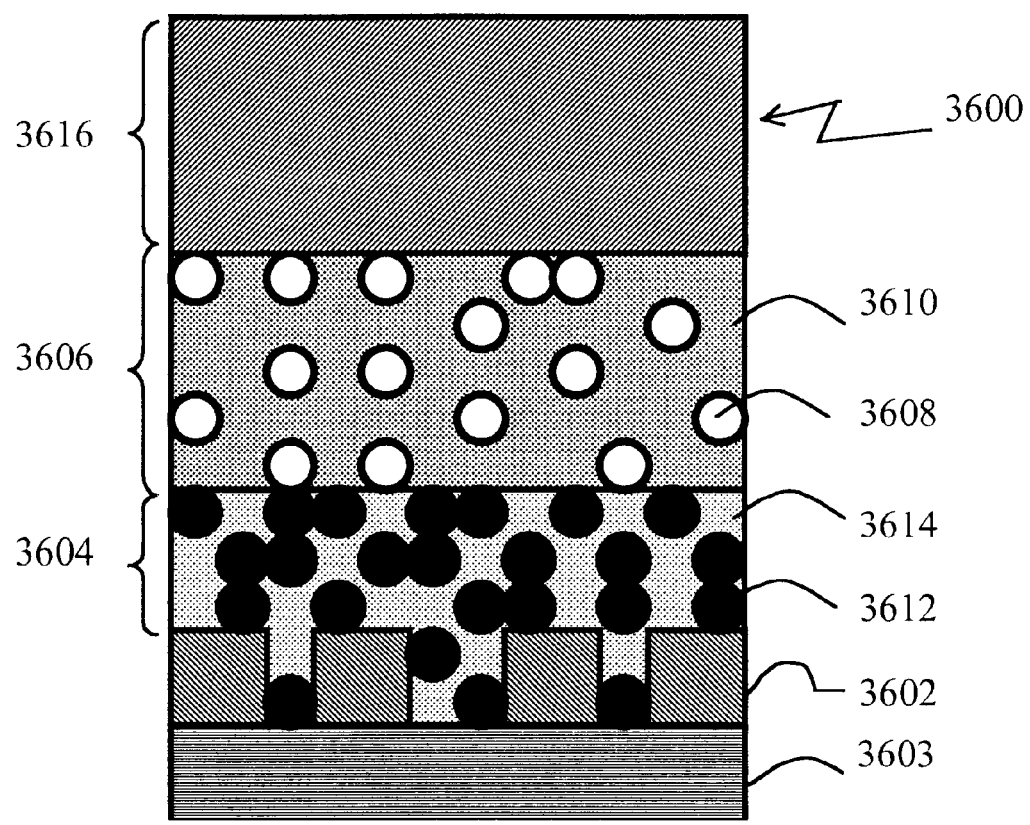

FIG. 40 illustrates an air cathode 3600 according to one embodiment of the present invention. The air cathode illustrated in FIG. 40 can advantageously utilize printing of the current collector 3602 and sequential printing of the electrocatalyst layer 3606 and carbon conductor layer 3604. The current collector 3602 is fabricated from a conductive metal such as nickel or silver and for many applications silver is preferred. The current collector 3602 can be deposited solely from metal precursors or from metal precursors combined with dispersed metal powders. The dispersed metal powders can be nanometer-sized particulate powders or can be high aspect ratio powders (e.g., fibers), such as fibers having an average length of 2 to 10 $\mu$m, which can provide good conductivity while being highly porous. The metal precursors should be capable of decomposing into the metal at relatively low temperatures, such as not greater than about 400° C., more preferably not greater than about 250° C. For example, silver metal precursors can be chosen from silver carboxylates and silver trifluoroacetate, which can also include silver nanoparticles. When silver nanoparticles are included in a silver trifluoroacetate precursor, the thermal decomposition temperature can be reduced from about 350° C. to about 250° C. If the material is subjected to a rapid thermal anneal or is laser processed, then it may be possible to utilize higher temperature precursors due to the short exposure time. A thermally insulating layer, such as a porous aerogel layer, can also be used as a thermal insulator to reduce the thermal affects. Current collectors thinner than about 1 $\mu$m can be formed solely from the metal precursors and will not require incorporation of metal powder, while those thicker than 1 $\mu$m will typically require the use of a metal powder precursor.

The current collector 3602 must be deposited and processed at low temperatures onto a membrane gas diffusion layer 3603. The gas diffusion layer 3603 is typically fabricated from TEFLON. TEFLON is a tetrafluoroethylene (TFE) fluorocarbon polymer available from E.I. duPont deNemours, Wilmington, Delaware. Although the term TEFLON is used in the present specification for convenience, it is understood that other similar fluorocarbon polymers can be substituted for TEFLON.

The current collector is preferably fabricated using a direct-write deposition process. Advantageously, the current collector comprises a plurality of elongated strips having an average width of preferably not greater than about 100 μm, such as not greater than about 75 μm. It will be appreciated that the metal current collector can be fabricated by other methods, including sputtering, evaporation, photolithography, electroless plating, electroplating, doctor blade, screen printed or electrochemical deposition.

A gas diffusion layer 3603 which allows maximum permeation of oxygen and no permeability to aqueous solutions using hydrophobic pores is necessary as the pores of the gas diffusion layer need to be protected from flooding by the electrolyte. This layer can be a continuous TEFLON membrane or a pressed Teflonized carbon layer. For example, one preferred TEFLON layer is about 90 μm thick with a density of 2.26 cm$^3$/g. The average pore size is about 23 nm, with a distribution of pores ranging from about 0.2 nm to 70 nm, corresponding to a porosity of about 10% and a surface area of 7.3 m$^2$/g.

In case of the Teflonized carbon (discussed below), the current collector is incorporated as a Ni mesh in the carbon with the metal mesh being closer to the gas-open side. However in the case of the current collector being deposited directly on the TEFLON, the TEFLON surface is preferably modified to promote adhesion between the current collector and the TEFLON surface. Several routes can be utilized to modify the surface of the TEFLON. A commonly used method to modify the TEFLON surface is to etch the surface. Tetra-etch is a commonly used industrial etchant for TEFLON. Tetra-etch is a mixture of sodium naphthalene in ethylene glycol dimethyl ether. The TFE TEFLON molecule is a long chain of carbon atoms to which fluorine atoms are bonded. The etchant strips the fluorine atoms from the chain creating a deficiency of electrons, which are then replaced with water vapor, oxygen, and hydrogen when the TEFLON is exposed to air. The carboxyl, carbonyl and hydroxyl groups formed as a result of etching easily adhere the current collector on the TEFLON surface. Tetra-etch in the as received form is to strong to etch the thin TEFLON layer and should be diluted for etching the TEFLON surface.

Another approach to modify the TEFLON surface is to sputter a thin layer of metal film on the TEFLON surface. Examples of metals that can be sputtered are Au and Cu. In one embodiment, a 40 nm Au layer is sputtered on TEFLON, which enabled the Ag current collector to adhere to the TEFLON. The characteristics of TEFLON were measured after surface modification of TEFLON and the etched TEFLON and TEFLON with a 40 nm thick Au sputtered layer retained their surface area and porosity when compared to the unmodified TEFLON surface.

To deposit a conductive current collector 3602 it is often necessary to anneal the precursor to the conductive metal. Thus, it may be necessary to anneal the TEFLON membrane in the further processing steps to make a thin film battery. Thus, the effect of heat treatment on TEFLON was investigated. Several strips of TEFLON were placed at different temperatures in a furnace for ten minutes. Since the glass transition temperature of TEFLON is 340° C. as measured from TGA/DTA data, the changes in characteristics of TEFLON, if any, were measured at 100° C., 200° C., 250° C. and 300° C. There was a decrease from 7.3 m$^2$/g to 5.9 m$^2$/g in surface area of the TEFLON on heating for ten minutes in a furnace at 300° C. A decrease in surface area is undesirable as it directly relates to the decrease in gas diffusion through this layer. There was no difference in surface area and porosity at temperatures below 300° C.

An alternative to heating in a furnace is to use rapid thermal processing. Rapid thermal processing (RTP) is a versatile approach for several different processing functions, such as rapid thermal annealing (RTA), rapid thermal cleaning (RTC), and rapid thermal chemical vapor deposition (RTCVD). Rapid thermal systems are capable of increasing temperatures in excess of 200° C./s. A rapid thermal process heats the material to a processing temperature by radiative heating.

TEFLON strips were annealed at 200° C., 250° C., 300° C., and 347° C. respectively for one minute each. Each of the TEFLON strips that were subjected to RTP at the different measurement were then characterized in terms of their surface area and porosity. A decrease in surface area to 5.3 m$^2$/g was observed when the TEFLON strip was subjected to RTP at 347° C. There was however no change in the surface area of the TEFLON below 347° C. Thus, it is possible to subject TEFLON to RTP at higher temperatures than heating in a furnace. Table I illustrates the characteristics of TEFLON on annealing.

TABLE I

| | Temperature ° C. | Surface Area m$^2$/g | Pore Volume cm$^3$/g |
|---|---|---|---|
| TEFLON as received | — | 7.33 | 0.0489 |
| In furnace for 10 minutes | | | |
| | 100 | 7.81 | 0.0638 |
| | 200 | 7.51 | 0.0554 |
| | 250 | 7.05 | 0.0724 |
| | 300 | 5.91 | 0.0390 |
| RTP for one minute | | | |
| | 200 | 7.92 | 0.0625 |
| | 250 | 8.04 | 0.0518 |
| | 300 | 7.74 | 0.0544 |
| | 347 | 5.38 | 0.0525 |
| 40 mn Au on TEFLON | — | 7.6 | 0.0568 |
| Etched TEFLON | — | 7.6 | 0.0619 |

Figure 41:
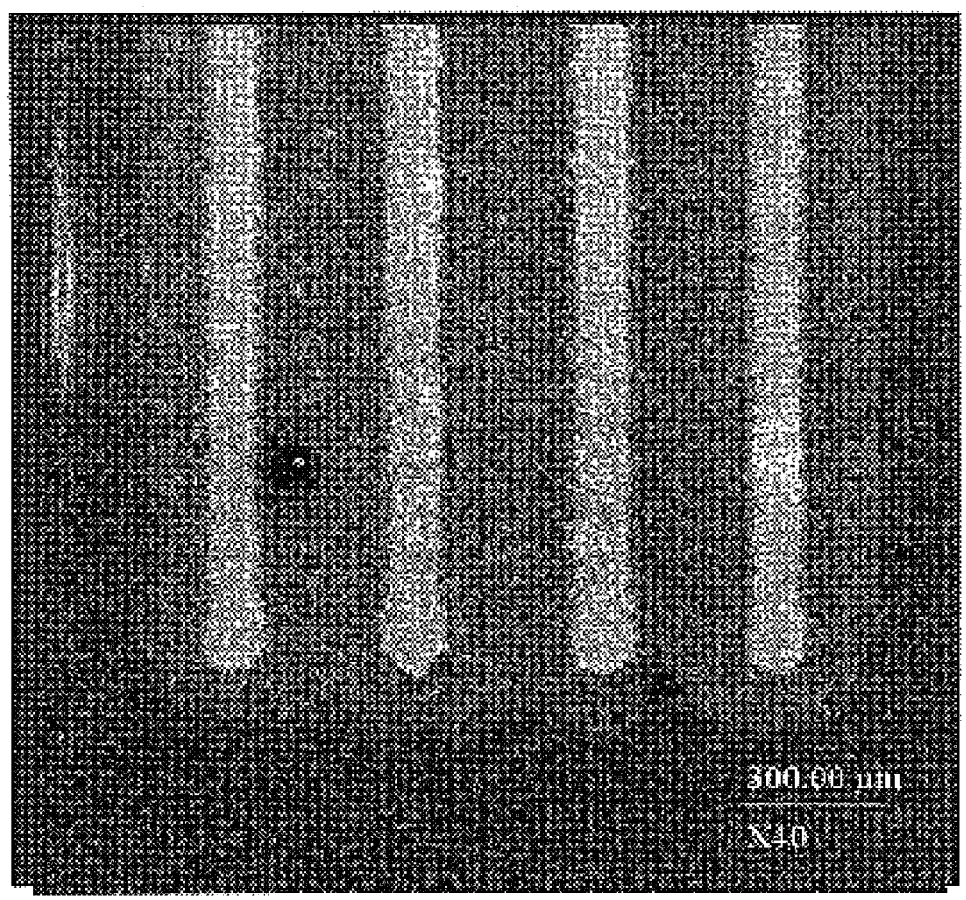

FIG. 41 illustrates a photomicrograph (40x) of a silver current collector deposited on an etched TEFLON membrane using a direct-write method. The silver precursor included silver trifuroacetate and silver metal nanoparticles. After deposition, the assembly was heat at 250° C. for 10 minutes to form the current collector. The average width of the current collector lines is about 75 μm.

Referring back to FIG. 40, the electrocatalyst 3608 is preferably an oxygen deficient Ci—Ni—O metal oxide for secondary batteries and composite C/MnO$_2$ or C/Pt for primary batteries. To form the electrocatalyst layer 3606, the electrocatalyst particles 3608 are dispersed in a hydrophilic matix 3610 having lower hydrophobicity than the hydrophobic matrix 3614. The carbon conductor layer 3604 is required to provide conductivity between the current collector and electrocatalyst layer 3606. In this layer, the carbon particles 3612 are dispersed in a hydrophobic matrix 3616. The separator 3616 preferably consists of a material that can be applied by a direct write method, however, screen print, doctor blade, or other approaches can also be used.

The hydrophobic matrix 3614 can include certain forms of carbon, fluorocarbon polymers such as TEFLON and other organic species. Hydrophilic layers can include metal-oxide based materials such as a carbon electrocatalyst coated with metal oxide active phases. Some types of carbon and some organic polymers derivatized with hydrophilic functional groups (e.g., polyesters, polyethylene oxides, polyethers, polyalcohols and polycarboxylates) can also be used.

To form the carbon conductor layer 3604 and the electrocatalyst layer 3606 the carbon particles 3612 and electrocatalyst particles 3608, respectively, can be dispersed into liquid vehicles and printed onto each other with controlled thickness. The carbon particles and/or electrocatalyst particles can be TEFLONIZED by coating with TEFLON to form the hydrophobic matrix and the hydrophobicity can be controlled by adjusting the ratio of TEFLON to the particles.

One advantage of the embodiment illustrated in FIG. 40 is that the overall thickness is preferably not greater than about 100 $\mu$m (excluding the separator 3616). This results in several improvements including reduced diffusional resistance in these layers. The thickness of the current collector 3602 is reduced resulting in a smaller volume that corresponds to higher volumetric and gravimetric energy density, in addition to a higher drain rate. The drain rate is higher because once the kinetic limitation of the electrocatalyst is removed by using a more effective catalyst material, the next limitation on the catalytic conversion is the rate at which the species can diffuse between layers. Therefore, in this particular case (using a liquid electrolyte in contrast to a solid electrolyte) not only does the volumetric and gravimetric energy density increase due to a reduced mass and volume, but the diffusing species travel a shorter distance, resulting in a shorter transport time, hence a faster drain rate. This is an advantage over a Li-ion battery for example because even if a printed current collector is used, the diffusing species (Li ions) still diffuse relatively slowly through the metal oxide solid $LiMnO_x$ spinel electrolyte.

Figure 42:
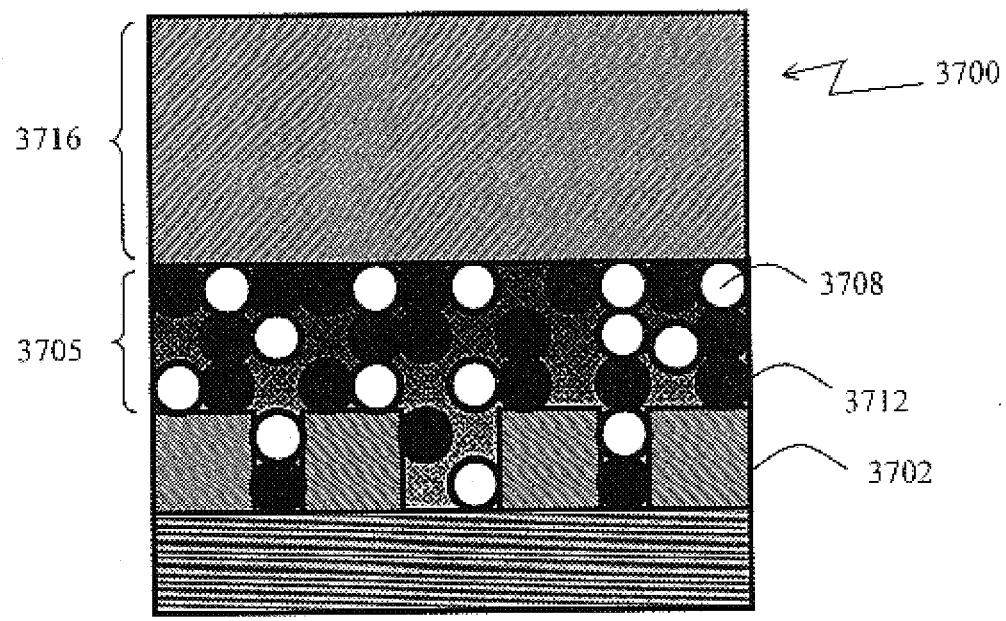

FIG. 42 illustrates an air cathode 3700 according to another embodiment of the present invention including a printed current collector 3702 and a gradient in the electrocatalyst concentration through layer 3705. Layers 3604 and 3606 (FIG. 40) are combined into a single gradient layer 3705 (FIG. 42). The same current collector metals can be used as is discussed above with reference to FIG. 40. The.carbon and electrocatalyst layers are combined into a single gradient layer 3705 wherein the portion contacting the current collector 3702 includes a hydrophobic matrix and the portion contacting the separator 3716 includes a hydrophilic matrix, resulting in a significant reduction in electrode thickness. The ratio of hydrophobic matrix to hydrophilic matrix varies through the layer 3705 accordingly. The fabrication of a gradient in composition in the electrocatalyst/conductor layer 3705 requires printing sequential layers with varying compositions (e.g., ratio of TEFLON to carbon particles) ranging in degree of hydrophobicity, concentration of electrocatalyst particles 3708 and concentration of carbon particles 3712, all of which lead to improvements in performance. Thus, thin layers of different compositions can be printed successively wherein the composition of each layer is systematically varied. This produces a tailored composition gradient and therefore the desired property can be achieved. Alternatively, the composition of the precursor may be continuously varied and the repeating layers leads to a composition gradient.

One advantage is that the overall thickness is further reduced leading to higher energy density. Preferably, the current collector and gradient layer have a total average thickness of not greater than about 50 $\mu$m. In addition, thecompositional gradient creates a larger 3-phase contact zone, also leading to better performance.

Figure 43:
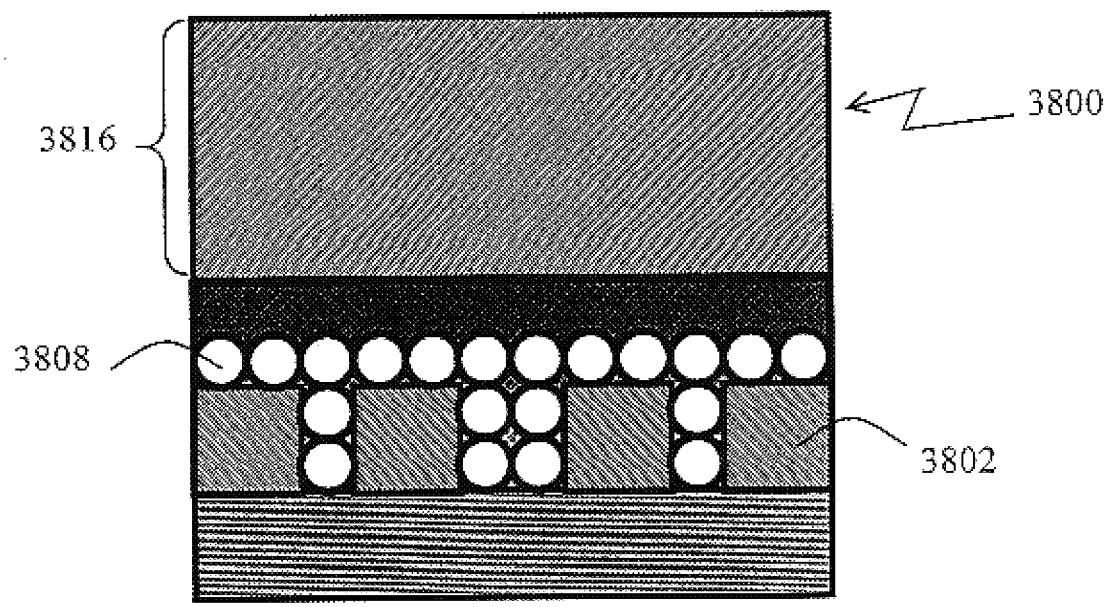

FIG. 43 illustrates another embodiment of an air cathode 3800 according to the present invention including an electrocatalyst particle layer 3808 printed directly over a current collector 3802. The combined functionality of several layers advantageously eliminates the carbon layer and provides an even thinner electrode. The carbon that was required for conductivity (FIGS. 40 and 42) is eliminated due to the intimate contact between the current collector 3802 and the electrocatalyst particles 3808.

Several approaches can be used to deposit the electrocatalyst 3808 on the current collector 3802. The electrocatalyst 3808 can be deposited using a direct-write method or can be formed directly on the current collector 3802 by vapor phase deposition.

The thickness of the electrode (not including the separator 3816) is preferably not greater than about 30 $\mu$m, compared to about 400 $\mu$m for a conventional structure. Thus, diffusional resistances are reduced resulting in better performance.

Figure 44:
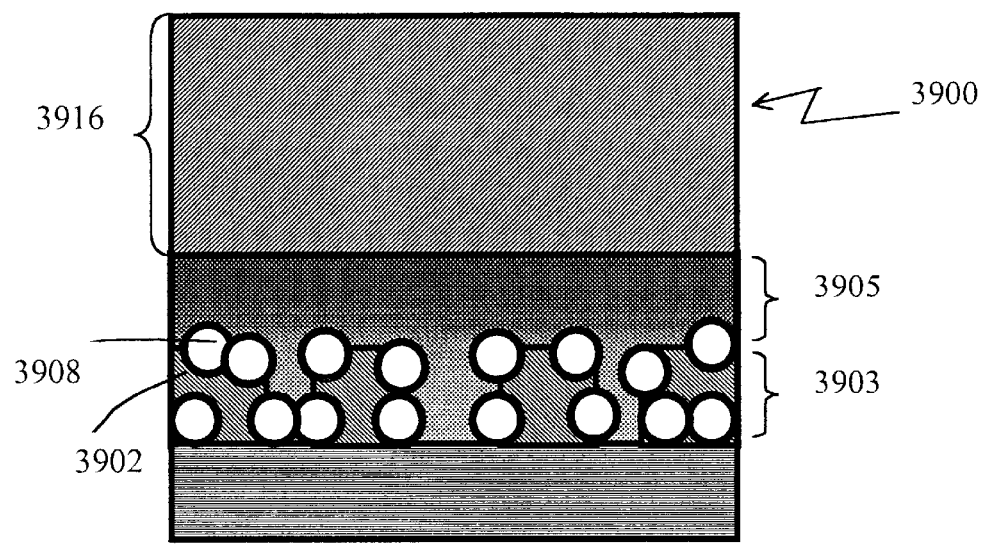

FIG. 44 illustrates an air cathode 3900 including a composite current collector/electrocatalyst 3903 according to another embodiment of the present invention. This structure combines the functions of the current collector and the electrocatalyst into a single porous conductive printed pattern 3903. No diffusion of oxygen is required through the layer 3903.

In this embodiment, the electrocatalyst and current collector are combined into a porous composite structure 3903 with controlled wetting to obtain the 3-phase interface. This is accomplished by combining the pre-formed electrocatalyst particles 3908 with precursors to the porous metal that can include metal particles and metal precursors. Thermal processing at low temperature converts the metal precursor to the metal, joining the metal particles to form a porous layer 3903 containing the electrocatalyst. Layer 3903 can be a metal ceramic composite such as a silver or nickel ink containing electrocatalyst particles such as a $NiCoO_x$. In this case, a lower temperature route compatible with the substrate (e.g., porous fluorocarbon polymer) can be used. Other additives that aid in the decomposition of the silver precursor to form silver such as reducing agents can be included. Silver pastes used in polymer thick film applications may also be useful.

Further, composite particles such as metal/metal oxide particles can be useful for this layer. For example, a metal or metal alloy such as Ag/Pd with embedded perovskite metal oxides (e.g., $MgTiO_3$) can be useful.

In this embodiment, the electrons generated at the surface of the electrocatalyst 3908 are captured directly by the current collector 3902. This leads to better current collection efficiency, as well as a faster drain rate.

Figure 45:
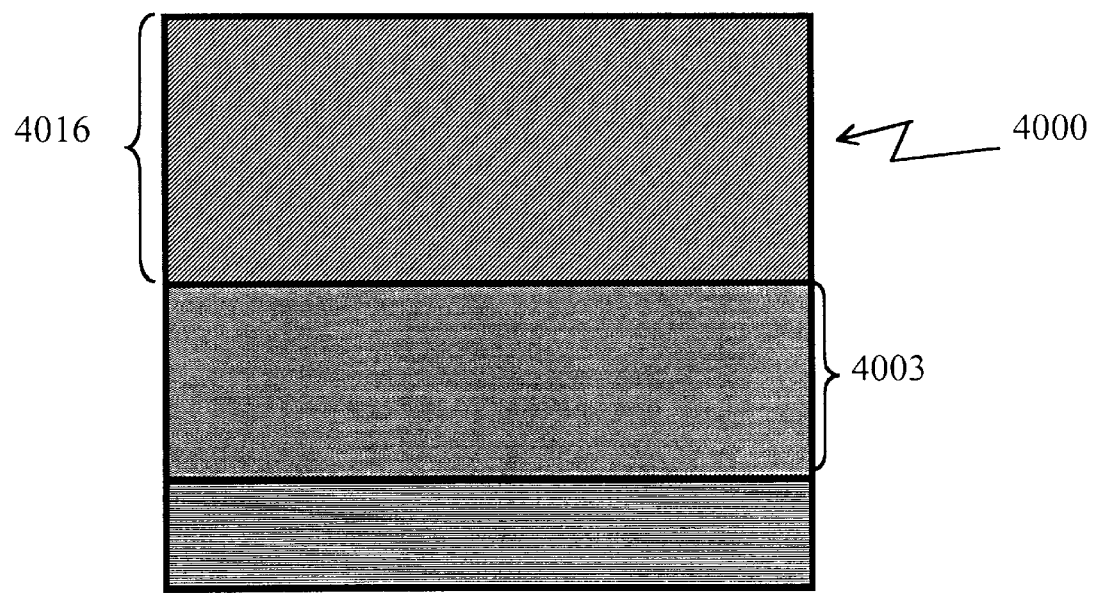

FIG. 45 illustrates an air cathode 4000 according to a further embodiment of the present invention wherein the cathode 4000 includes a porous composite current collector/electrocatalyst 4003. The composite layer 4003 combines the current collector and electrocatalyst in a continuous porous layer 4003 which also includes a hydrophobicity modifier, such as a fluorocarbon polymer. An example is liquid TEFLON, an emulsion containing small TEFLON particles, or various modified fluorocarbon polymers. A TEFLON emulsion can be incorporated by one of the methods such as those described above. Oxygen is able to diffuse through the porous layer, which is about 30 $\mu$m thick.

This composite layer approach relies on the mixing of several components including particles of a metal, TEFLON and electrocatalyst with other components. The metal particles have a controlled particle size distribution. This leads to a well-controlled pore size distribution wherein the pore size is defined by the size of the spaces between particles.

Various types of compositional gradients can be fabricated for the composite layer 4003. For example, a porosity gradient can be formed through control of the particle size distribution as a function of location in the layer. A hydrophobicity gradient can be formed by varying the concentration of the TEFLON-type material. The electrocatalyst concentration can also be varied. Further, conductivity can be varied by control of the metal particles and molecular metal precursors.

Vapor infiltration can also be used to form various useful structures such as those discussed above. In this process, a bed of particles is first deposited using a direct write process. The bed is heated and exposed to a reactive vapor that carries out CVD or ALE to deposit metals or metal oxides. This vapor-infiltration method has several potential benefits including enhanced catalytic activity, the ability to fuse particles to each other, the ability to oxidize or reduce certain species, the ability to control site specific reactions, the ability to deposit $MnO_2$, silver, and other metals and metal oxides at low temperatures and the ability to modify the hydrophobicity of materials with suitable silanating or similar agents.

Figure 46:
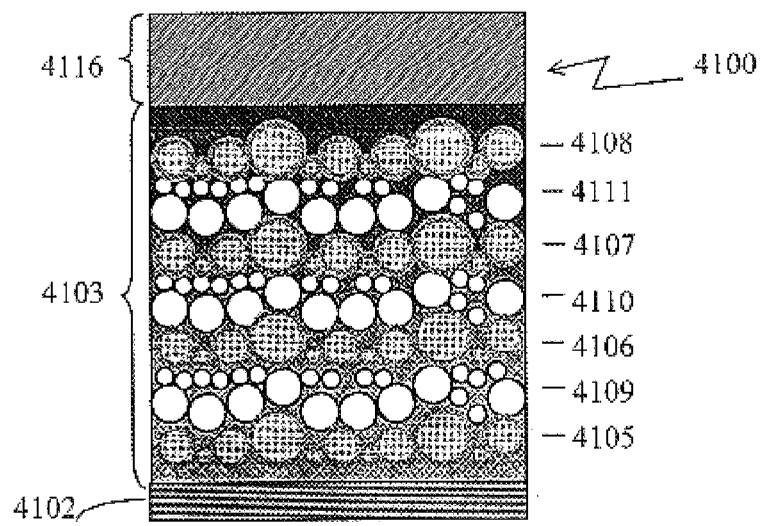

For the construction of 3-dimensional layered devices, alternating "monolayers" of particles can be deposited that will form three-dimensional architectures with considerable performance improvements. This approach will be most beneficial when alternating monolayers of metal particles as the current collector with monolayers of electrocatalyst particles. This 3-dimensional structure leads to performance improvements as a result of the high surface area and intimate contact between conductor and electrocatalyst particles. This design is schematically illustrated in FIG. 46.

In the embodiment illustrated in FIG. 46, the device 4100 can be fabricated as follows. The base 4102 (gas diffusion layer) is coated with a composite layer 4103, preferably using a direct-write method. This can be done with multiple jets/heads in series with different compositions in each to form a quasi-gradient. The layer 4103 includes alternating thin layers of current collector particles (4105, 4106, 4107, 4108) and electrocatalyst particles (4109, 4110 and 4111). The particle layers are dispersed in a hydrophobic matrix near the base 4102 and a hydrophilic matrix near the separator 4116. The hydrophobic/hydrophilic ratio changes accordingly through the thickness of the layer 4103. Then an overcoat of electrolyte composition is applied using similar methods or other technologies. For example, the electrolyte can be an aqueous solution of potassium hydroxide, KOH. It can be deposited as part of the ink formulation throughout the printed layer in which case an additional overcoat may not be necessary. The layers can also be deposited without the electrolyte, which can then be applied as an overcoat afterwards to infiltrate the underlying layers when it can be deposited using a method that can withstand the corrosion of the KOH. A separator layer 4116 is then applied using a direct-write method.

It is expected that when decreasing feature size and layer thickness in the air cathode there will be a point at which further reduction in size will be detrimental to battery performance. It is possible to print layers that are about one particle thick which corresponds to dimensions of about 1 to 2 $\mu m$. At these sizes it is possible that certain parameters such as pH, concentration, and electric field gradients may dominate the performance of the device and possibly be detrimental. The layer in which this is likely to have the most significant effect is in the current collector. The line width and pitch can be varied from the extreme of a largely "transparent" grid to a microporous layer that could limit battery performance due to a large IR drop. Calculations indicate that down to a layer thickness and feature size of 20 $\mu m$, there is no significant problem of IR drop.

Figures 47A, 47B:
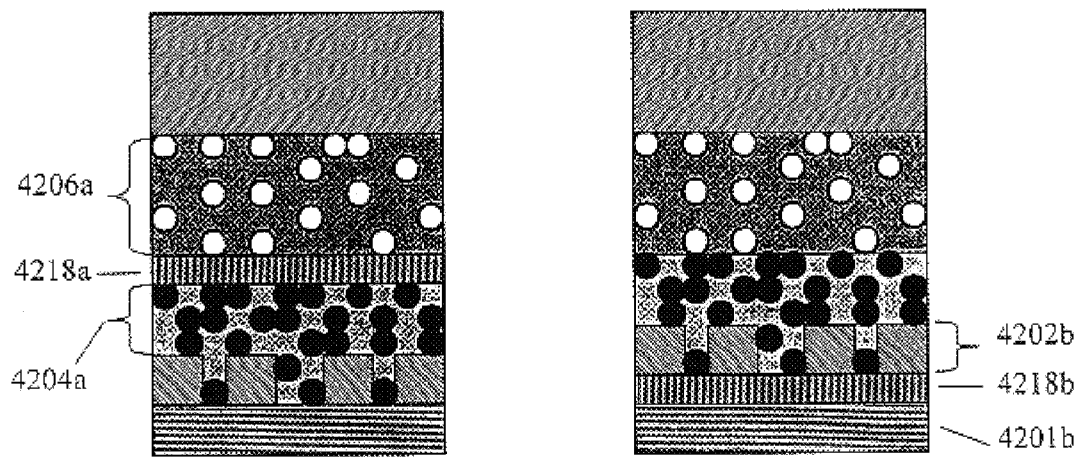

One of the problems associated with batteries that use electrolytes is carbonate formation from $CO_2$. A $CO_2$ reduction layer can be used to alleviate this problem. For example, selective adsorption of $CO_2$ by a high surface area metal oxide such as Group II metal oxide can be used. The molar volume increase on formation of $MCO_3$ from MO on reaction with $CO_2$ is considerable which may result in restricted mass transport of $O_2$ in the cell depending on the porosity and other factors. Therefore, heavy metal oxides are preferred since the expansion in volume decreases with increasing atomic weight of the metal ion. As an alternative, the layer can be used to initiate a catalytic reaction to convert the $CO_2$ to an inert or even useful species. This can have the additional advantage that oxygen is formed which can benefit cell performance. This layer must be placed between the air and the electrocatalyst layer. FIGS. 47(a) and 47(b) illustrate two placements for this layer. In FIG. 47(a) the $CO_2$ reduction layer 4218a is placed between the electrocatalyst layer 4206a and the carbon conductor layer 4204a. In the embodiment illustrated in FIG. 47(b), the $CO_2$ reduction layer 4218b is placed between the base 4201b and the current collector 4202b.

The fine particles and methods for depositing the fine particles according to the present invention are useful for the fabrication of a number of novel devices such as primary and secondary batteries. Such devices are included within the scope of the present invention.

For example, the thin film air cathodes of the present invention and described above are particularly advantageous for use in the electrodes of rechargeable batteries such as rechargeable zinc-air batteries. A zinc-air battery is schematically illustrated in FIGS. 48(a) and (b).

Specifically, FIG. 48(a) illustrates a zinc-air battery 500 in charging mode. The battery 500 includes air electrodes (cathodes) 502 and 508 and a zinc electrode (anode) 504 which includes a layer of zinc 506. The electrodes are typically packaged in a flat container that is open to the air. When the battery cell discharges, the zinc metal 506 is oxidized to $Zn^{2+}$. When all the zinc has been oxidized, the battery 500 is recharged and $Zn^{2+}$ is reduced back to zinc metal 506. The direct-write deposition methods of the present invention can advantageously be used to produce such electrocatalytic devices by depositing the metal-carbon composite powders in discrete patterns, having a thin, dense structure.

The present invention is also directed to a novel battery system that is a hybrid of existing metal hydride and zinc/air technologies, referred to as a metal hydride/air (MH/Air) battery. The properties of different battery systems are illustrated in Table II.

TABLE II

| Battery System | Specific Energy (Wh/kg) | Energy Density (Wh/L) | Specific Power (W/kg) | Cycle Life |
|---|---|---|---|---|
| Li-ion | 250 | 200 | 100–200 | 1000 |
| Metal Hydride | 70 | 250 | 70–280 | 500 |
| Zinc/Air | 250 | 200 | 200–450 | 200 |
| Metal Hydride/Air | 320 | 250 | 100–350 | 1000 |

The metal hydride/air battery according to the present invention advantageously combines the advantages of the anode from a metal hydride battery with the air cathode of the present invention. As illustrated in Table II, the metal hydride/air battery provides many of the advantages of a zinc/air battery such as high specific energy and specific power, but also has an increased cycle life.

The metal hydride/air battery according to the present invention includes a metal hydride anode and an air cathode, with an alkaline electrolyte disposed between the two electrodes. During discharge, oxygen and water are converted to hydroxyl ions which are transported to the anode where they react with the metal hydride to form electrons which can be routed to produce energy. During recharge, the water is reacted at the metal hydride electrode to create hydroxyl ions which are then reacted at the oxygen electrode to liberate oxygen.

The metal hydride/air batteries of the present invention are particularly useful in miniaturized devices such as GPS (Global Positioning System) transceivers. Each metal hydride/air battery cell can provide approximately 0.9 volts of power and at least four such cells would be utilized in a GPS battery to provide a total voltage of 3.6 volts, which is sufficient for GPS requirements. The battery is thin, lightweight and can be recharged many times. It is estimated that each cell would have a mass of about 4 grams. Although the battery has a slightly lower power density than a zinc air battery, the battery has a much longer useful life. The air cathode which permits recharge can be combined with different anodes to tailor the performance for different applications. Such applications can include, but are not limited to unmanned vehicles, smart cards, GPS transceivers, RF tags, various sensors, immunoassays, telemetry and other portable communications.

Figure 49:
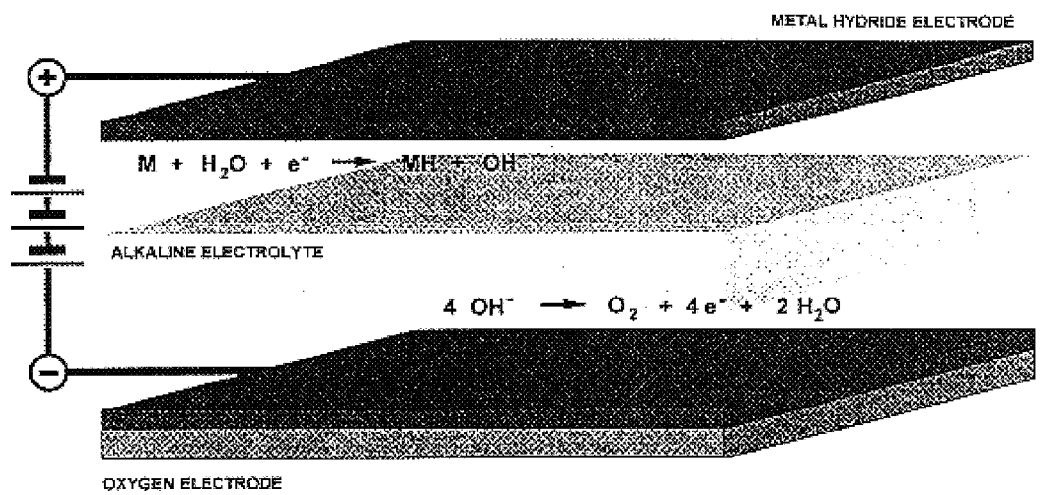
Figure 50:
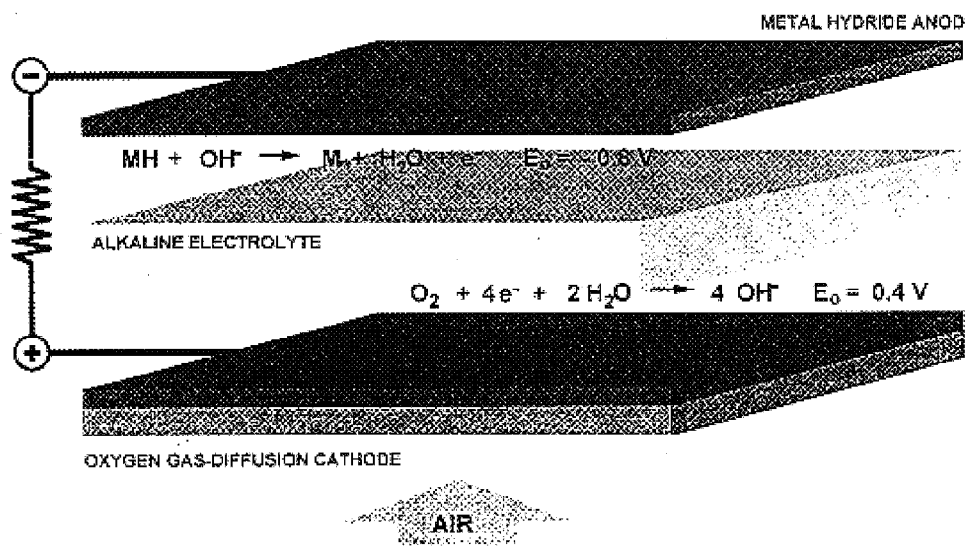

FIG. 49 schematically illustrates a metal-air battery in discharge mode. FIG. 50 schematically illustrates a metal air battery in charging mode. Metal-air rechargeable batteries were previously limited by problems with the air electrode. The problems included rechargeability, cycle life and environmental stability.

The direct-write deposition process of the present invention enables high performance battery such as the foregoing to be fabricated. The method is adaptable to different performance requirements, produces thin and light weight layers, is cost effective and efficiently uses the materials. The ability to digitally control the deposition allows simple design changes to be made.

The batteries advantageously provide improved volumetric and gravimetric energy density, increased capacity, increased cycle life, higher discharge rate and a wide temperature range of operation.

The present invention is also applicable to a number of different battery technologies. For example, the methodology can advantageously be applied to the production of prismatic batteries. The technology can also be applied to supercapacitors to provide peak power for specific applications. The methodology of the present invention advantageously enables an increase in the number of recharge cycles, increase power density, increase specific power, reduce layer thickness and reduce cell thickness thereby resulting in a smaller device.

Figure 51:
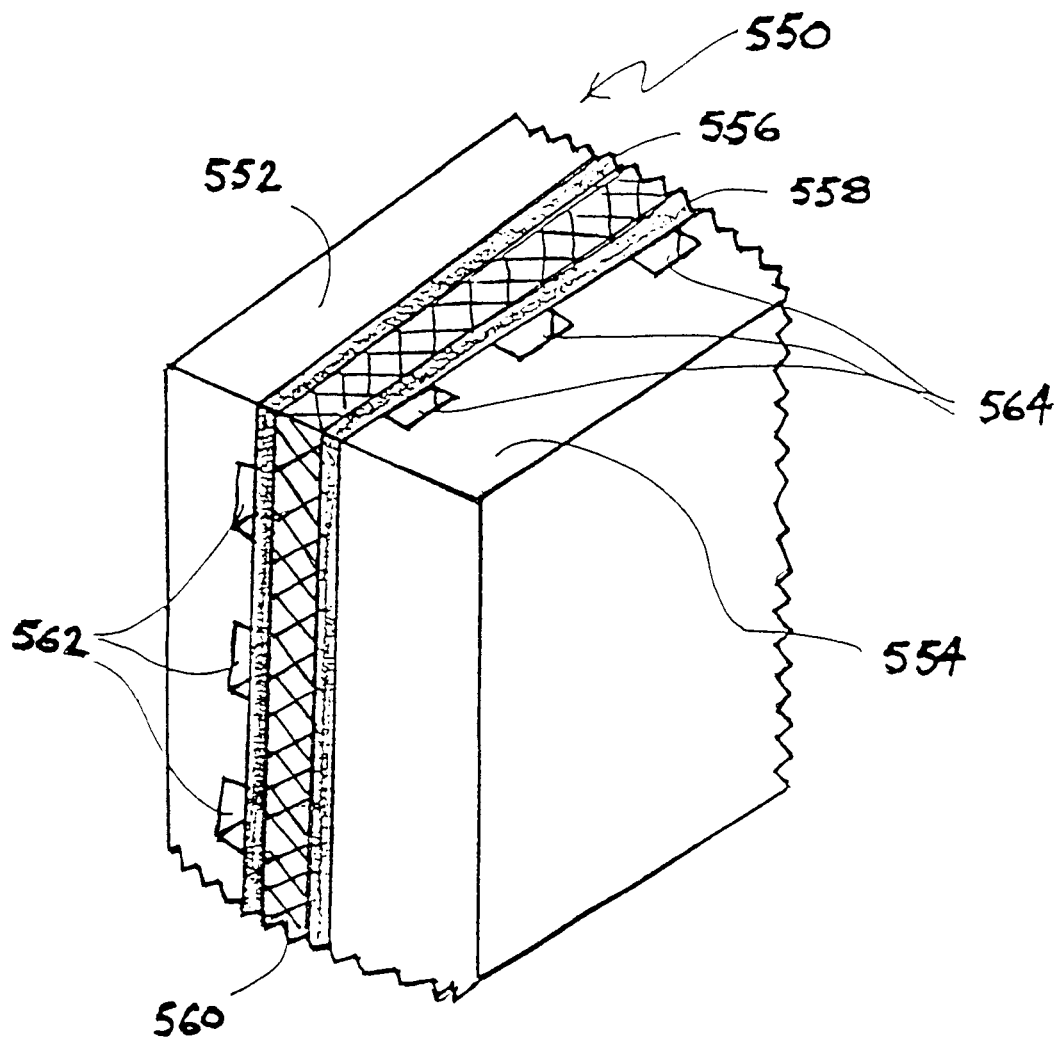

The electrocatalyst powders of the present invention are also useful in fuel cells. FIG. 51 illustrates a schematic cross section of a membrane electrode assembly for a fuel cell according to an embodiment of the present invention. The membrane electrode assembly 550 comprises an anode 552 and cathode 554 which are typically constructed from carbon cloth. The anode 552 and cathode 554 sandwich a catalyst layer 556 and 558 on each side of a proton exchange membrane 560 which can be fabricated from a material such as Nafion 117. Power is generated when hydrogen is fed into the anode 552 through anode channels 562 and oxygen, such as from air, is fed into the cathode 554 through cathode channels 564. In a reaction catalyzed by a metal catalyst in the catalyst layers 556 and 558, the hydrogen ionizes to form protons and electrons. The protons are transported through the proton exchange membrane 560 to the other catalyst layer where another catalyst catalyzes the reaction of protons with air to form water. The electrons are routed from the anode to the cathode via an electrical circuit which provides electrical power.

A class of fuel cell reactions that is required to be catalyzed is the reaction of a fuel such as hydrogen gas ($H_2$) to form $H^+$ where, in the case of a PEM fuel cell, the $H^+$ is transported through a $H^+$ ion transport membrane to the cathode. In this case, the fuel cell generally operates in acidic media and the cathode reduces $O^2$ to ultimately form water as the final product. Other fuels may also be employed such as methanol, natural gas or other hydrocarbons such as methane. In some of these cases other gases which may poison the reaction or catalytically active sites such as CO are also present. These gases must be removed by the presence of an alternative active composition to that which oxidizes the fuel. As a result, the electrocatalysts aid in the removal or conversion of such species to benign products. Examples of such fuel cells are PEM and phosphoric acid fuel cells.

In some cases, catalysts are also required to convert the feedstock fuel such as natural gas to a reactant having a higher $H_2$ content. This improves the efficiency of the fuel cell and reduces formation of catalyst poisons. The catalytic compositions of the present invention are also useful to catalyze this reaction.

EXAMPLES

1. Mn $O_x$/C Composite Particles

Two groups of $MnO_x$/C composite electrocatalyst examples were prepared according to the present invention. The first group, described in Table ll, was prepared by ultrasonic aerosol generation and heating the aerosol in a hot-wall reactor (tubular furnace). The second group, described in Table IV, was prepared using a spray nozzle to generate an aerosol which was heated in a spray dryer. Air was used for the carrier gas for all examples.

TABLE III

Experimental conditions for ultrasonically generated electrocatalysts

| Example Number | Mn precursor | Additional Surfactant (wt. %) | Reactor Temp (° C.) | Mn (wt. %) | Precursor Concentration (wt. %) |
|---|---|---|---|---|---|
| 19A | KMnO4 | None | 400 | 10 | 5 |
| 19B | Mn nitrate | None | 350 | 10 | 5 |
| 20A | KMnO4 | None | 350 | 10 | 5 |
| 20B | KMnO4 | None | 350 | 10 | 5 |
| 23A | KMnO4 | 0.017 | 350 | 10 | 5 |
| 24A | KMnO4 | 0.034 | 350 | 10 | 5 |
| 27A | Mn nitrate | 0.049 | 350 | 10 | 5 |
| 28B | KMnO4 | 0.049 | 300 | 10 | 5 |
| 28D | KMnO4 | 0.049 | 250 | 10 | 5 |
| 28E | KMnO4 | 0.049 | 200 | 10 | 5 |
| 29B | Mn nitrate/ KMnO4 | 0.012 | 350 | 10 | 5 |

TABLE IV

Experimental conditions for spray nozzle electrocatalysts

| Example Number | Mn precursor | Additional Surfactant (wt. %) | Reactor Temp (° C.) | Mn (wt. %) | Precursor Concentration (wt. %) |
|---|---|---|---|---|---|
| 30A | KMnO4 | 0.078 | 208 | 10 | 5 |
| 30C | KMnO4 | 0.078 | 208 | 10 | 5 |
| 34B | KMnO4 | 0.078 | 208 | 10 | 5 |
| 41A | KMnO4 | 0.083300 | 315 | 10 | 5 |
| 41B | KMnO4 | 0.006700 | 315 | 10 | 5 |
| 41C | KMnO4 | 0.083300 | 315 | 20 | 5 |
| 41D | KMnO4 | 0.083300 | 315 | 10 | 5 |
| 44B | None | 0.000000 | 208 | — | 5 |
| 44C | KMnO4 | 0.001600 | 208 | 5 | 5 |
| 44D | KMnO4 | 0.001600 | 149 | 5 | 5 |
| 44E | KMnO4 | 0.001600 | 149 | 10 | 5 |
| 44F | KMnO4 | 0.001600 | 208 | 10 | 5 |
| 44G | KMnO4 | 0.001600 | 208 | 10 | 5 |
| 47A | None | 0.000000 | 208 | — | 10 |
| 47B | None | 0.000000 | 208 | — | 5 |
| 47C | None | 0.000000 | 208 | — | 2.5 |
| 47D | KMnO4 | 0.000000 | 208 | 10 | 2.5 |
| 47E | KMnO4 | 0.001600 | 208 | 10 | 2.07 |

The carbon precursor for all examples listed in Tables III and IV was GRAFO 1300 (Fuchs Lubricant Co., Harvey, Ill.) an aqueous dispersion of particulate carbon which has an average particle size of about 30 nanometers and a surface area of about 254 $m^2/g$. The aqueous dispersion also includes an anionic surfactant. Additional amounts of a nonionic surfactant (TRITON X-405, Sigma-Aldrich, St. Louis, Mo.) were added in some of the examples as is indicated in Tables III and IV. Triton X-405 is a 70 wt. % solution of polyoxyethylene(40)-isooctylphenylether in water. The GRAFO 1300 was suspended in water and the Mn precursor, previously dissolved in water, was slowly added to the carbon suspension while stirring. The surfactant, added to the carbon suspension prior to the Mn precursor, reduces precipitation when the Mn precursor is added. The reaction temperature for all examples was maintained below about 400° C. since excessive temperatures (e.g., above 600° C.) can burn-off carbon when air is used as the carrier gas.

More specifically, for the spray nozzle generation (Table IV), a batch of $MnO_x/C$ powder was prepared in a spray drying apparatus in the following manner. 35.6 kg (78.3 lbs) of carbon paste was added to a batching vessel. 65 kg (143 lbs) of de-ionized water was then added to the carbon paste and mixed thoroughly. 0.13 kg (0.286 lbs) of the nonionic surfactant was added to the mixture and the mixture was stirred for approximately 10 minutes. In a separate vessel, 2.27 kg (5 lbs) of potassium permanganate was dissolved in 65 kg (143 lbs) of de-ionized water. The solution was mixed for 20 minutes to allow the $KMnO_4$ to dissolve. The $KMnO_4$ solution was then slowly added to the carbon paste.

Figure 52:
Figure 53:
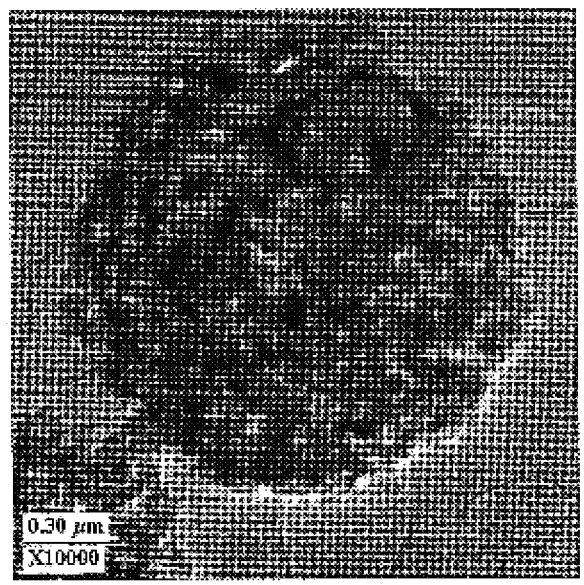

FIG. 52 illustrates a scanning electron microscope (SEM) photomicrograph of Example 23A (Table III). The particle morphology illustrated in FIG. 52 is typical for the ultrasonically generated samples. The particles have a spherical shape with the particle size varying between about 0.3 $\mu$m and 10 $\mu$m. The support phase consists of primary carbon particles. As is illustrated in the transmission electron microscope (TEM) photomicrograph image of FIG. 53, the support phase has a porous structure.

Figure 54:
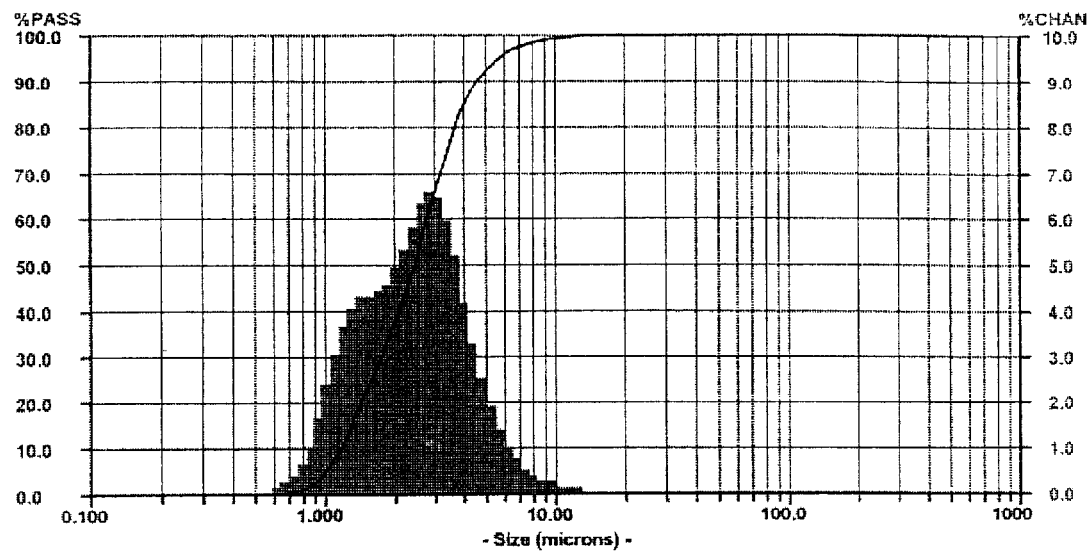
Figure 55:
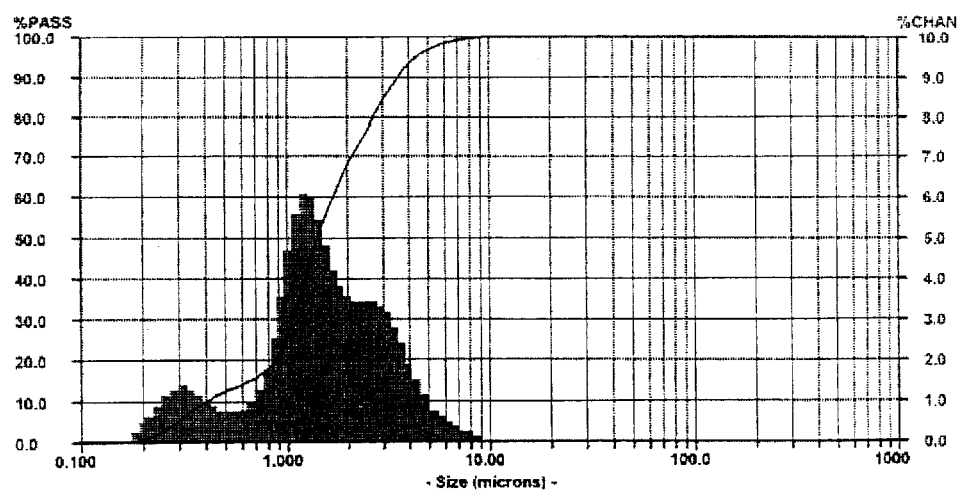

The particles can be partially dissociated to smaller aggregates by mechanical force, such as ultrasound or compressing the particles by rolling into a layer. FIGS. 54 and 45 illustrate the ultrasonically induced dissociation for a typical electrocatalyst powder produced by ultrasonic generation. FIG. 54 illustrates the size distribution before breaking up secondary particles by sonification and FIG. 55 illustrates the same powder after sonification.

Figure 56:
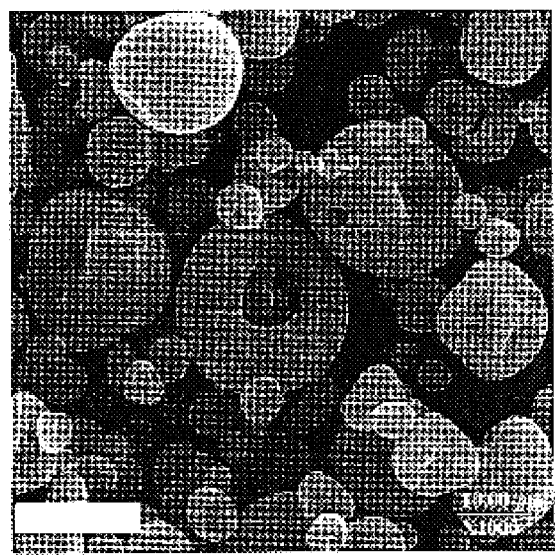

FIG. 56 illustrates an SEM photomicrograph of Example 30C, generated by a spray nozzle. A comparison of FIGS. 52 and 56 illustrates that the spray generation method has a significant impact on the morphology of the secondary particles in terms of both shape and size. Some of the large particles produced by the spray nozzle deviate from the spherical shape and have a "donut" shape.

Figure 57:
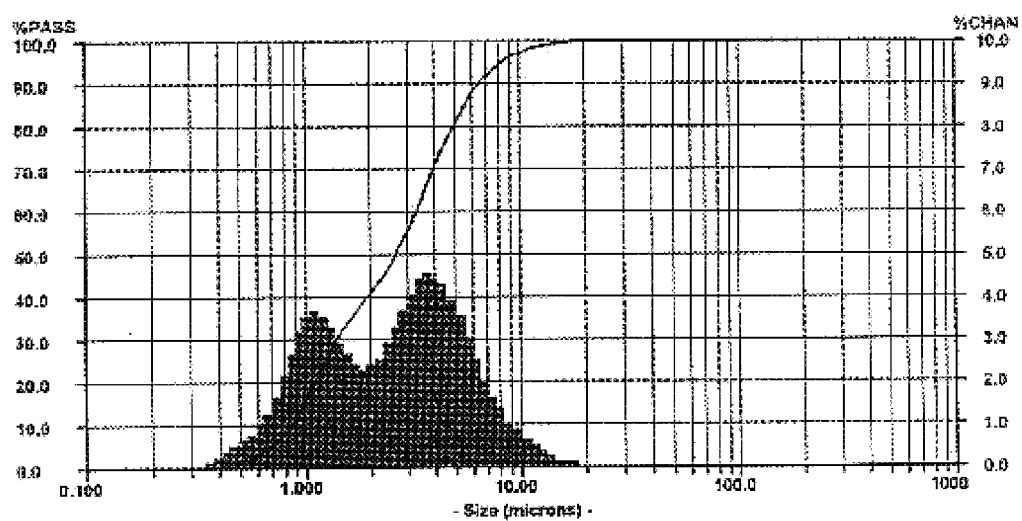

FIG. 57 illustrates the size distribution of a spray dried powder. The secondary particles are larger, with diameters up to 20 $\mu$m, but the powder has an average particle size of about 5 $\mu$m. The differences in the secondary particles are related to the droplet size typical for the two aerosol generation approaches.

BET nitrogen absorption was used to measure the surface area and porosity of the electrocatalyst powders generated ultrasonically and by a spray nozzle. The results are summarized in Table V. If the ultrasonically generated samples are compared, it is clear that the conversion temperature has an effect on the surface area. Example 19A, converted at 400° C., has a surface area of 93 $m^2/g$, while Example 19B, converted at 350° C. has a surface area of 37 $m^2/g$. However, further reduction in the temperature to 300° C. and 250° C. did not produce a significant decrease in the catalyst surface area.

It also appears that the presence of surfactant has an impact on the surface area. At identical conversion temperatures, the sample, which had additional amounts of surfactant in the precursor solution (Example 29B) has a 40% lower surface area than the same powder with no additional surfactant (Example 19B).

TABLE V

Surface area of electrocatalysts

| Example | Generation Method | BET Surface Area ($m^2/g$) | Average Pore Diameter (nm) |
|---|---|---|---|
| 19A | Ultrasonic | 93 | — |
| 19B | Ultrasonic | 37 | — |
| 28B | Ultrasonic | 19 | — |
| 28D | Ultrasonic | 24 | — |
| 28E | Ultrasonic | 19 | — |
| 29B | Ultrasonic | 25 | — |
| 34B | Ultrasonic | 21 | — |
| 41A | spray nozzle | 21 | — |
| 41B | spray nozzle | 21 | — |
| 41C | spray nozzle | 17 | — |
| 41D | spray nozzle | 22 | — |
| 44C | spray nozzle | 28 | 20 |
| 44D | spray nozzle | 29 | 19 |
| 44E | spray nozzle | 24 | 17 |
| 44F | spray nozzle | 24 | 20 |
| 44G | spray nozzle | 24 | 21 |
| 44H | spray nozzle | 36 | 9 |
| 47A | spray nozzle | 36 | 23 |
| 47B | spray nozzle | 36 | 23 |
| 47C | spray nozzle | 33 | 23 |
| 47D | spray nozzle | 24 | 18 |
| 47E | spray nozzle | 25 | 16 |

The pure carbon samples (no surfactant) have the highest surface area of about 35 $m^2/g$. The presence of precursors to $MnO_x$ in the solution therefore leads to a reduced surface area and the surface areas for Mn-containing samples are on the order of 20 to 25 $m^2/g$, which is comparable to the surface areas of the ultrasonically generated samples at similar conversion temperatures.

Therefore, the selected aerosol generation method primarily impacts the particle size distribution, while the conversion temperature primarily impacts the surface area of the $MnO_x/C$ particles. However, the effect of conversion temperature on the surface area at temperatures below 300° C. is minimal. No significant changes were observed in the pore size distribution for the catalysts as a function of the preparation conditions. For all spray nozzle generated samples the average pore size was on the order of 20 nanometers, which indicates a secondary carbon support phase with no significant micro-porosity.

XPS analysis was also performed on the $MnO_x/C$ powders. XPS (X-ray Photoelectron Spectroscopy) analysis provides information about the surface composition and Mn oxidation state for the electrocatalysts. Three characteristics of the XPS spectra were analyzed for comparison of samples generated under different conditions:

1) Positions of the binding energy of Mn $2p_{3/2}$ photoelectrons which are indicative of the Mn oxidation state;

2) Relative intensities of Mn $2p_{3/2}$ vs. C 1s photoelectron peaks, directly compared between samples, for an indication of $MnO_x$ dispersion or for model-based calculations of the average particle size of the dispersed $MnO_x$; and 3) Ratios between different binding energies of O1s photoelectron peaks related to: $O_1$ bonded to the C support, $O_2$ bonded to Mn and $O_3$ bonded in the surfactant used in the precursor formulations.

Two commercial catalysts were evaluated for comparison to the powders of the present invention. Each were standard $MnO_x/C$ powders available from commercial manufacturers and used in zinc-air battery applications. Three standards were also analyzed to identify the Mn oxidation state in the electrocatalysts. ($MnO_2$ powder, $Mn_2O_3$ powder and $KMnO_4$ powder.)

The preparation conditions, recording of the spectra and data processing were identical for all samples. The samples were prepared for XPS analysis by pressing the powder into indium (In) foil (99.9%), previously cleaned in $HNO_3$ to remove C and O impurities at the surface.

The XPS spectra for three control samples ($Mn_2O_3$, $MnO_2$ and $KMnO_4$) and all electrocatalyst powders were recorded on an AXIS HSi (Kratos Analytical) spectrometer, working in $\Delta E$=constant mode at a pass energy of 80 eV, using an aluminum anode (Al $K_\alpha$=1486.7 eV, 225 W). The residual pressure in the analysis chamber was $1\times10^{-9}$ Torr. The peak positions were estimated relative to the binding energy of C 1s=284.6 eV. The following XPS peaks, designated by their electron levels, were recorded: Mn 2p, C 1s, O 1s and K 2p. One survey scan was acquired in the 75–1175 eV binding energy range for the control samples and electrocatalyst powders before the high resolution spectra were acquired. The experimental intensities were estimated from the areas of the corresponding peaks, measured on smoothed original peaks. The peak areas of Mn 2p and K 2p peaks include the areas of both $2p_{3/2}$ and $2p_{1/2}$ peaks.

Spectra were obtained for control samples and the results are illustrated in Table VI. The Mn $2p_{3/2}$ peak in the XPS spectra of $KMnO_4$ consists of two peaks and therefore two different oxidation states of Mn are present.

TABLE VI

XPS data for control samples

| Sample | Mn $2p_{3/2}$ (eV) | O 1s (eV) | K $2p_{3/2}$ (eV) | C 1s (eV) |
|---|---|---|---|---|
| $Mn_2O_3$ | 641.6 | 529.6 | — | 284.6 |
| $MnO_2$ | 641.8 | 529.4 | — | 284.6 |
| $KMnO_4$ | 641.5 | 529.8 | 290.8 | 284.6 |
| | 644.0 | | 293.0 | |

The literature data on the Mn $2p_{3/2}$ binding energy show that it depends on the oxidation state of Mn as follows:
Mn (II)–in MnO –640.6 eV
Mn (III)–in $Mn_2O_3$–641.6 eV
Mn (IV)–in $MnO_2$–642.6 eV An increase of the XPS binding energy with increasing oxidation state of the element is a generally observed trend for a variety of materials. Since the oxidation state of Mn in $Mn_2O_3$ is Mn (III) and in $MnO_2$ is Mn (IV), it is expected that the binding energy for the latter should be higher than for the former compound. However, the experimental data show identical binding energy (within the experimental error) for Mn $2p_{3/2}$ photoelectrons in $Mn_2O_3$ and $MnO_2$ control samples.

However, since $MnO_2$ is a strong oxidizing agent, it is not surprising that the average oxidation state of Mn near the surface is less than Mn (IV). Another possible reason is that X-ray induced reduction takes place for the $MnO_2$ powder under the X-ray beam exposure.

The foregoing XPS results suggest that Mn (III) and Mn (IV) oxidation states cannot be clearly distinguished. Still, a general trend for higher binding energy indicates a higher Mn oxidation state.

Table VII contains information on the binding energy of the Mn $2p_{3/2}$, O 1s and C 1s for two commercial electrocatalyst samples, samples 1A and 2A.

TABLE VII

XPS data for commercial electrocatalyst samples

| Sample | Mn $2p_{3/2}$ peak position (eV) | K $2p_{3/2}$ peak position (eV) | O 1s peak Position (eV) |
|---|---|---|---|
| 1A | 642.3 | 292.2 | 529.7 - 57% |
| | | | 532.1 - 43% |
| 2A | 642.4 | 292.7 | 529.8 - 62% |
| | | | 531.9 - 35% |
| | | | 534.6 - 3% |

The comparison of the Mn $2p_{3/2}$ binding energy, 642.3 eV for Sample 1A and 642.4 eV for Sample 2A does not show any significant difference. This binding energy is 0.7 eV higher than the binding energy of 641.6 eV observed for Mn (III) in the $Mn_2O_3$ control compound. The Mn $2p_{3/2}$ binding energy observed for both commercial electrocatalysts is very close to the position of 642.6 eV, which according to the literature data corresponds to Mn (IV) oxidation state. It is highly probable that X-ray induced reduction effect, observed for the $MnO_2$ control sample, is less expressed or not at all present for the electrocatalyst samples. It can be speculated that the $MnO_2$ species which are highly dispersed and in close contact with the conductive carbon surface are less likely to undergo an X-ray induced reduction than the highly crystalline $MnO_2$ compound.

Therefore, the average Mn oxidation state in the commercial electrocatalysts is between Mn (III) and Mn (IV)

and most probably is Mn (IV). The Mn $2p_{3/2}$ binding energy position can be used as a reference for achieving Mn oxidation state favorable for electrocatalytic activity when evaluating the electrocatalysts according to the present invention. The XPS measured Mn oxidation state may be slightly different from the oxidation state in actual conditions.

Table VIII contains a summary of the XPS data for electrocatalyst Examples 19A through 34B (Tables II and IV). XPS data for Example 30D (Example 30A further heated to 250° C. in air for 1 hour) and Example 33A (Example 30A further heated to 170° C. in air for 1 hour), are also included.

TABLE VIII

XPS data for electrocatalyst samples

| Example | Mn $2p_{3/2}$ peak position (eV) | K $2p_{3/2}$ peak position (eV) | O 1s peak position (eV) |
|---|---|---|---|
| 19A | 642.4 | 292.6 | 529.9 - 59% |
|  |  |  | 531.3 - 32% |
|  |  |  | 533.0 - 9% |
| 19B | 642.0 | 293.0 | 529.8 - 21% |
|  |  |  | 532.2 - 79% |
| 23A | 642.3 | 292.8 | 528.9 - 59% |
|  |  |  | 532.2 - 41% |
| 28D | 642.3 | 292.8 | 530.0 - 30% |
|  |  |  | 531.3 - 26% |
|  |  |  | 532.9 - 44% |
| 28E | 642.1 | 293.1 | 529.9 - 22% |
|  |  |  | 531.3 - 42% |
|  |  |  | 533.1 - 36% |
| 29B | 641.4 | 292.9 | — |
| 30A | 642.6 | 293.0 | 528.9 - 21% |
|  |  |  | 532.2 - 79% |
| 30C | 642.2 | 292.8 | 528.9 - 21% |
|  |  |  | 532.2 - 79% |
| 30D | 641.5 | 292.9 | — |
| 33A | 641.3 | 293.0 | — |
| 34B | 642.3 | 293.0 | — |

The Mn $2p_{3/2}$ peak position for the samples obtained with Mn(NO$_3$)$_2$ as a precursor (Examples 19B and 29B), are lower by 0.4–1.0 eV compared to the commercial electrocatalysts. The Mn $2p_{3/2}$ binding energy for the majority of electrocatalysts, 19A, 23A, 28D, 30A, 30C and 34B is similar to the position for the commercial samples. This result indicates that the Mn oxidation state in these samples is Mn (IV), while the Mn oxidation state in Examples 19B and 29B is closer to Mn (III), because the binding energy value is similar to that for the Mn$_2$O$_3$ control sample. Since Examples 19B and 29B originate from precursor formulations containing Mn(NO$_3$)$_2$ as opposed to KMnO$_4$, it is clear that different precursor formulations result in different MnO$_x$ surface species in the electrocatalysts, and therefore different catalytic activity. An average oxidation state close to Mn (IV) is likely most beneficial for the electrocatalytic activity of the samples as is discussed with the electrocatalytic activity data hereinbelow.

For Examples 30D and 33A, there is a shift of about 1.0 eV to a lower Mn $2p_{3/2}$ binding energy compared to their corresponding counterpart before the heat treatment (Example 30A). This is an indication that the post heat treatment leads to a reduction of Mn (IV) to Mn (III) oxidation state and therefore may be undesirable.

The O 1s spectra for Example 19A is characteristic of examples where the conversion of the precursor is complete. Therefore, the ratio of the different O 1s photoelectron peaks for each sample can be used to estimate the ratio of MnO$_x$ crystallite surface and the carbon support surface which is not covered by MnO$_x$ crystallites. Only 9% of the O 1s peak intensity can be related to the presence of oxygen from surfactant which was not reacted during the spray conversion. For the other limiting case, Example 19B, the O 1s peak at 532.2 eV, which accounts for about 80% of the O 1s peak intensity, corresponds to O in NO$_3$ species and its presence indicates non-complete conversion of the precursor. Example 19B demonstrates significantly lower electrocatalytic activity compared to Example 19A, as is discussed below.

The only difference in the preparation conditions between Examples 19A, 28D and 28E is the spray conversion temperature. Comparing the O 1s region, it is clear that while for Example 19A (400° C.) there is no significant O 1s peak associated with the presence of a surfactant, for Examples 28D (250° C.) and 28E (200° C.) that peak (533.2 eV) accounts for 30–40% of the O 1s intensity.

Therefore, the spray conversion temperature influences the presence of surfactant in the catalyst powders. Since the remaining surfactant is deposited either on top of the active MnO$_x$ species or on the carbon surface, it could potentially influence the catalytic activity of the samples. Therefore, in order to minimize eventual negative effect of the surfactant, either higher conversion temperatures should be used or the presence of surfactant in the spray solution should be minimized.

The XPS data also contain information on the dispersion of the MnO$_x$ species on the carbon support surface. This information is indirectly included in the relative intensities of I (Mn 2p)/I (C 1s). In order to extract the information on the dispersion, several other parameters are needed for the electrocatalysts such as the bulk composition of the samples, the BET surface area and the theoretically calculated relative intensities for monolayer distribution.

Table IX contains information about the bulk composition of the samples analyzed both by Atomic Absorption Spectroscopy (MS) and X-ray Fluorescence (XRF). XRF data generally show higher values for the Mn and K compared to the MS data. The results suggest that the electrocatalyst powders of the present invention have higher molar concentration of both Mn and K than the commercial samples. Absolute values for the weight percent concentration by MS for the electrocatalysts of the present invention closely match the expected values, based on the composition of the precursor solution.

TABLE IX

AAS/XRF data for the bulk composition

| Sample Or Example | Mn (wt. %) | K (wt. %) | Mn/C at. ratio × 10$^2$ | K/C at. ratio × 10$^2$ |
|---|---|---|---|---|
| 1A | 1.78/2.80 | 0.90/1.47 | 0.40/0.64 | 0.28/0.48 |
| 2A | 6.00/9.54 | 2.67/3.87 | 1.44/2.32 | 0.90/1.37 |
| 19A | 9.04/14.8 | 7.94/12.2 | 2.38/4.43 | 2.93/5.13 |
| 19B | 9.06/14.9 | 2.48/3.70 | 2.24/4.00 | 0.86/1.40 |

Table X contains data on the BET surface area, the theoretically calculated values for I (Mn 2p)/I (C 1s) relative intensities if the MnO$_x$ species were to be distributed as a monolayer and the I (Mn 2p)/I (C 1s) experimentally measured values.

Commercial Sample 2A includes a high-surface area activated carbon. All of the electrocatalyst powders of the present invention have an order of magnitude lower surface area, formed after the primary high surface area carbon support forms the secondary carbon support structures as described above. The high-surface area activated carbon support (Samples 1A and 2A) possess a significant degree of internal microporosity, while the spray converted secondary support formed in accordance with the foregoing examples has primarily mesoporosity.

TABLE X

XPS modeling data for $MnO_x$ particle size estimation

| Sample/ Example | I (Mn 2p)/ I (C 1s) (Experimental) | I (Mn 2p)/ I (C 1s) (monolayer) | Surface area (m²/g) | Estimated particle size (nm) | Voltage (V) at discharge current of 300 mA/cm² |
|---|---|---|---|---|---|
| 1A | 0.378 | 0.205 | 121 | Non-homogeneous distribution | — |
| 2A | 2.803 | 0.340 | 713 | Non-homogeneous distribution | 0.82 |
| 23A | 1.188 | 1.754 | 93 | 2 | 1.02 |
| 30A | 0.863 | 6.651 | 24 | 15 | 0.91 |
| 30C | 1.090 | 6.651 | 25 | 12 | 0.95 |
| 30D | 0.688 | 6.650 | 30 | 40 | 0.76 |

The information for the estimated average $MnO_x$ particle size is extracted by a comparison between the theoretical and experimental values for I (Mn 2p)/I (C 1s) relative intensities. The changes in XPS relative intensities and the comparison of the experimental data to the theoretical ones is based on the method of Kerkhof and Moulijn (F. P. J. M. Kerkhof and J. A. Moulijn, J. Phys. Chem. 83, (1979) 1612). This approach as previously applied to dispersed catalysts (P. Atanasova and T. Halachev, Applied Catalysis A: General 108 (1994) 123; P. Atanasova et al., Applied Catalysis A: General 161 (1997) 105) provides reliable information about the distribution of the active components on a dispersed support. When the experimental value for I (Mn 2p)/I (C 1s) relative intensities is close to but lower than theoretical, an estimate of the particle size is possible through this XPS model. When the experimental value for I (Mn 2p)/I (C 1s) relative intensities is higher than theoretical, no exact estimate of the particle size is possible through this XPS model. However, this is an indication for a non-homogeneous distribution of $MnO_x$ species preferentially on the external surface area of the carbon support.

For Samples 1A and 2A, the experimental values for the I (Mn 2p)/I (C 1s) relative intensities are significantly higher than theoretical. Therefore, the total surface area of the carbon support is not effectively utilized and the $MnO_x$ active species are localized mainly on the external surface area of the carbon support. The result is not surprising since the activated carbon surface area includes a significant degree of microporosity. During the wet processing used to form such powders, this porosity is not accessible for adsorption of precursors from the liquid phase due to wetting characteristics.

In contrast, the experimental values for the I (Mn 2p)/I (C 1s) relative intensities for the electrocatalysts of the present invention are lower than theoretical and from the deviation an average $MnO_x$ particle size was estimated for each sample, as is detailed in Table X. The estimated average particle size varies from 2 nanometers for Example 23A to 40 nanometers for Example 30D. The result for Example 23A indicates uniform deposition of the active species throughout the carbon support surface area and only a few monolayers of $MnO_x$ surface species. It is apparent that the dispersion varies depending on the preparation conditions, the relevant parameters being the type of spray generation and the spray conversion temperature. However, the XPS modeling data demonstrate uniform deposition throughout the carbon support surface area.

Table X also includes information on the electrocatalytic testing. The voltage attained by an electrode prepared with the electrocatalysts of the present invention in half-cell experiments at a discharge current of 300 mA/cm² was chosen as a parameter for comparison of the electrocatalytic activity of the catalysts.

Figure 58:
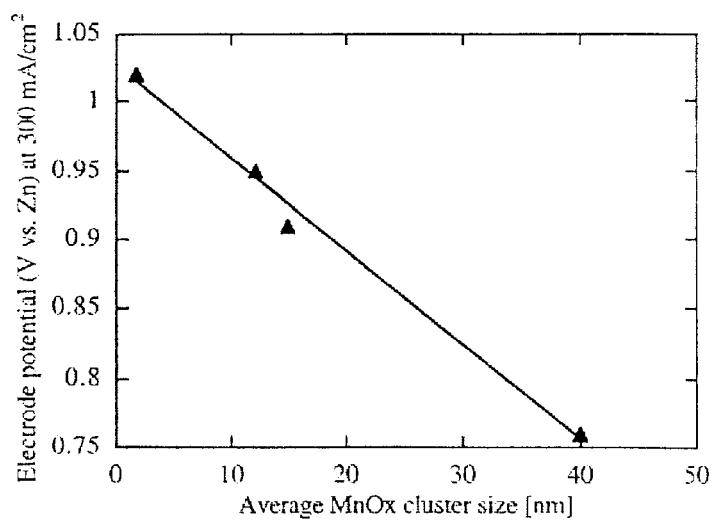

FIG. 58 illustrates the correlation between the electrocatalytic activity and XPS estimated average particle size from the data in Table X. There is a linear correlation between the electrocatalytic performance of the catalysts and the average $MnO_x$ crystallite size. It is important to note that all catalysts compared in FIG. 58 (except Example 30D) have identical Mn $2p_{3/2}$ binding energy, indicating an identical Mn oxidation state. Based on the XPS model, no estimation of the $MnO_x$ cluster size was possible for the commercial catalysts since they had a non-homogeneous distribution wherein $MnO_x$ was preferentially deposited on the outer support surface. However, if the electrocatalytic performance for the Sample 2A catalyst is compared to the data in FIG. 58, the corresponding $MnO_x$ size for this electrocatalyst is about 30 nanometers.

The combined information on the Mn oxidation state and $MnO_x$ dispersion derived from the XPS analysis is a valuable source for clarifying the $MnO_x$/C electrocatalyst structure and for predicting the electrocatalyst performance. Achieving a Mn oxidation state that is optimal for the electrocatalytic performance is probably the most critical requirement. However, forming the active species in a highly dispersed form is also important. The higher the dispersion, the higher the number of active centers exposed to the electrochemical reagents and catalyzing the reaction.

In order to confirm the XPS estimated average crystallite size, several other analytical techniques were used. An X-Ray Diffraction (XRD) spectrum of a control sample prepared by ultrasonic generation at 300° C. with $KMnO_4$ as a precursor to $MnO_x$ showed no indication of any crystalline structures. In general, this result indicates that either no such species are formed or that their concentration and/or size are too small to be detected by XRD. Typically, for dispersed oxides, the XRD detection limit is about a 40 to 50 nanometer crystallite size. For $Mn(NO_3)_2$ based catalyst (conversion temperature of 300° C.) an indication of some crystalline structures was observed. However, the features were too weak for identification and, as XPS data suggested, this could be related to the presence of non-converted $Mn(NO_3)_2$ in the catalysts.

A further increase in the conversion temperature produced more pronounced XRD peaks, the positions of which were related to the formation of crystalline $Mn_3O_4$ or $Mn_2O_3$. In general, this indicates that if the conversion temperature is too high (at otherwise identical residence time), the diffusion and agglomeration of the converted $MnO_x$ species leads to the formation of large crystallites that are XRD detectable. Once such low-dispersion structures are formed, no significant electrocatalytic activity is expected. Therefore, only a proper combination of several spray generation parameters such as the method of generation, the precursor composition and the temperature of conversion ensures proper kinetics of the conversion and diffusion of the active surface species that are optimal for the electrocatalytic performance.

The benefit of the XPS derived dispersion data relates to information averaged over a large number of catalyst particles. Transmission Electron Microscopy (TEM), which gives a high magnification image of the catalyst morphology, was used to confirm the data collected by XPS. For Example 23A, small 1 to 2 nanometer size amorphous $MnO_x$ species were observed on the primary carbon particle surface (d=30 nm). Energy Dispersive Spectroscopy (EDS) performed on the particle confirmed that the surface species are Mn containing and that these species are uniformly distributed throughout the particle.

TEM images of Sample 2A showed areas of higher contrast attributed to the $MnO_x$ particles deposited mainly on the external surface area of the carbon support. Higher magnification images showed that these $MnO_x$ species are 20 to 40 nanometers in size, they are crystalline and reside on the outside surface area of the carbon support. Therefore, the TEM. observations confirm the XPS derived data on the $MnO_x$ dispersion and deposition uniformity. Observations by TEM for Sample 1A yielded similar results.

TEM observations of Example 30D, which is a post heat-treated sample corresponding to Example 30A, were also made. As described in Table X, the XPS estimated particle size for Example 30A is approximately 10 to 15 nanometers, while for Example 30D it is approximately 40 nanometers. The TEM images indicated that in some areas of the carbon support, the $MnO_x$ clusters are highly dispersed while in other areas large crystallites of about 50 nanometers in size are formed. The larger clusters consist of $MnO_x$ crystallites which are about 10 to 15 nanometers in size.

This TEM observation is in excellent correlation with the XPS estimated average particle size of 40 nanometers. In addition, these results point to a very important detail of the structure of the electrocatalysts of the present invention—elevated temperature post treatment of the catalysts may lead to diffusion of $MnO_x$ crystallites, formation of large crystallites and significant decrease in the dispersion of the active phase. In combination with the change in the Mn oxidation state, observed by XPS, this is a clear explanation of why the electrocatalytic activity of a post heat-treated sample is significantly lower compared to the original spray converted counterpart.

The influence on the electrocatalytic activity of the spray conversion temperature, presence of surfactaht, precursor concentration and additives was systematically analyzed for Examples 41A through 47E. Based on the previous XPS findings the samples were characterized by the binding energy positions for Mn as an indication for the Mn oxidation state and the I (Mn)/I (C) relative intensities as a measure for the dispersion of the $MnO_x$ species. The relative intensities and type of O 1s XPS peaks were analyzed in relation to the presence of surfactant and its influence on the electrocatalytic activity.

Figure 59:
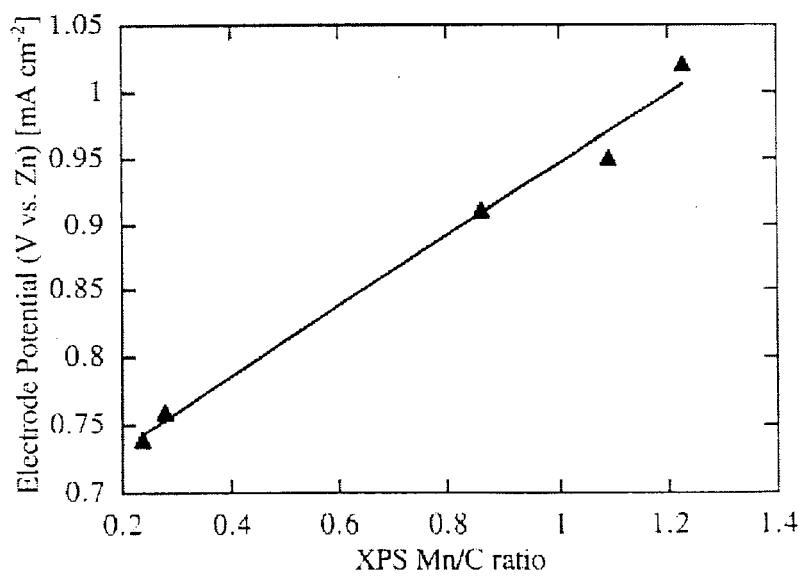

FIG. 59 illustrates the relationship between the electrocatalytic activity and the XPS relative intensities for Examples 19A through 30D. This dependence was used as a baseline for the further analysis of the influence of different spray conversion parameters on the electrocatalytic activity. For all spray nozzle generated samples, the BET surface areas are comparable and would not significantly influence the XPS model calculations of 10 the average $MnO_x$ cluster size. Therefore, a comparison of the XPS I (Mn)/I (C) relative intensities is an adequate measure of the dispersion of the active species. As can be seen from FIG. 59, the higher I (Mn)/I (C) relative intensities, the higher the electrocatalytic performance of the samples, if other characteristics of the catalyst (surface area and Mn oxidation state) are identical.

TABLE XI

XPS data for Examples 41A–47E

| Example | Spray conversion temperature (° C.) | Mn (wt. %) | Precursor Concentration (wt. %) | Mn $2p_{3/2}$ binding energy (eV) | I (Mn 2p)/ I (C 1s) (Experimental) | Voltage [V] at discharge current of 300 mA/cm$^2$ |
|---|---|---|---|---|---|---|
| 41A | 315 | 10 | 5 | 642.2 | 0.71 | 0.91 |
| 41B | 315 | 10 | 5 | 642.0 | 0.83 | 0.97 |
| 41C | 315 | 20 | 5 | 641.9 | 1.39 | 0.85 |
| 41D | 315 | 10 | 5 | 641.8 | 1.03 | 0.96 |
| 44C | 208 | 5 | 5 | 641.7 | 0.33 | 0.99 |
| 44D | 149 | 5 | 5 | 642.3 | 0.46 | 0.92 |
| 44E | 149 | 10 | 5 | 642.3 | 1.03 | 1.01 |
| 44F | 208 | 10 | 5 | 642.3 | 0.76 | 0.95 |
| 44G | 208 | 10 | 5 | 642.2 | 0.86 | 1.00 |
| 47D | 208 | 10 | 2.5 | 642.4 | 0.78 | 0.95 |
| 47E | 208 | 10 | 2.1 | 642.2 | 0.86 | 0.97 |

The Mn $2p_{3/2}$ binding energy for most of the samples is identical to the previously analyzed electrocatalysts (642.3±0.1 eV), which indicates a Mn (IV) oxidation state. Only for Examples 41C–44C does the binding energy deviate significantly from the above position and is 641.8±0.1 eV. Therefore, in the latter samples, the Mn oxidation state is lower and most likely a mixture of Mn (IV) and Mn (III) oxidation states.

Examples 41A through 41D illustrate the influence of variable amounts of surfactant in the spray solution, variation in the weight percent of Mn as well as the spray conversion temperature as compared to Examples 30A and 30C. A comparison between Examples 30C and 41A leads to the conclusion that a higher conversion temperature is not necessarily beneficial for the catalyst morphology and performance. Both the $MnO_x$ dispersion and the electrocatalytic activity are lower for Example 41A, which was made at a higher conversion temperature with all other parameters being kept constant.

It appears that the lower the amount of added surfactant, the better the dispersity and electrocatalytic performance (compare Example 41A to Example 41B). Doubling the Mn concentration does not lead to any improvement in the electrocatalytic performance. In contrast, it is the lowest in the series of spray nozzle generated samples. This result indicates that the surface coverage at 10 weight percent Mn and about 25 $m^2/g$ support surface area has the adequate balance of well-dispersed $MnO_x$ species and non-covered carbon surface area. Further increase in the Mn concentration, even if it ensures higher concentration of $MnO_x$ centers, does not improve the electrocatalytic performance.

The preparation conditions for Examples 41A and 41D are identical, except that for Example 41D a reduced flow in the spray reactor was employed. It appears that both the dispersion and the electrocatalytic activity are improved for Example 41D. This effect is significant (over 30%) for the dispersion and moderate for the electrocatalytic activity. It should be noted that the longer residence time leads to a lower oxidation state of Mn similar to the post heat-treated Example 30D. The higher residence time at elevated temperatures may lead to an undesirable reduction of the $MnO_x$ surface species.

Comparison between Examples 44C and 44D, both with 5 weight percent Mn concentration, shows that decreasing the conversion temperature from 208° C. to 149° C. produced a better dispersion of the active species but not necessarily better catalytic activity (Table XI). This observation is confirmed for 10 weight percent Mn catalysts, Example 44E (149° C.) and Example 44G (208° C.). The two examples have significantly different dispersion, the one for Example 44E being 30% higher, but identical electrocatalytic performance. An explanation for this deviation of the correlation higher dispersion-higher activity can be found in the O 1s XPS spectra.

It is clear from this XPS data that the higher concentration of $KMnO_4$ in the precursor solution for Example 44E had an oxidizing effect on the surfactant present in the solution. The relative intensity of the O 1s peak related to the surfactant (533.2 eV) for Example 44E is much lower compared to Example 44D. Thus, even though the conversion temperature is rather low (149° C.), the burnout of the surfactant is quite effective. Apparently, if the surfactant is still present at the catalyst surface, it blocks active centers and even though the $MnO_x$ dispersion is reasonable, the activity is lower than for Example 44D. Further comparison with the O 1s XPS spectra for Example 47D shows that if the added surfactant is completely eliminated, the O 1s peak related to the surfactant is further decreased in intensity.

Lowering the surfactant concentration in the precursor solution has a negative effect on the $MnO_x$ cluster dispersion (compare Example 30C and Example 47D). However, the benefit of less surfactant, which if present acts as a catalyst poison, outweighs the lower dispersion and the resulting catalytic activity is identical. Therefore, the amount of high molecular weight surfactants should be minimized in the precursor suspensions.

Example 44E prepared with spray nozzle generation has identically high performance to the ultrasonically generated Example 23A. Example 44E was prepared at the lowest conversion temperature of 149° C., with minimal addition of surfactant, 10 weight percent Mn and 5 weight percent solution concentration. Most likely these particular conditions (along with others such as residence time) ensure good kinetic conditions for the formation and distribution of the $MnO_x$ active species on the carbon support.

A higher surface area carbon support compared to the carbon support used for the previous spray conversion examples (surface area of 254 $m^2/g$) will provide higher support surface area available for the $MnO_x$ absorption. The surface area reduction after the spray conversion observed for the previous carbon support was on the order of about 10 times. Because of that reduction of the surface area, higher loading of $MnO_x$ was not beneficial for the electrocatalytic activity because of the lack of sufficient surface area to ensure high dispersion of the additional amounts of $MnO_x$. Therefore, carbon supports with higher starting surface area and different types of porosity were chosen to test their applicability for producing electrocatalysts with higher $MnO_x$ loading and high dispersion of the active $MnO_x$ species.

Electrocatalyst preparation was again conducted using ultrasonic and two-fluid jet nozzle aerosol generation and two types of high surface area carbons were used, KETJEN-BLACK (Akzo Nobel, Ltd, Amersfoort, Netherlands) and BLACKPEARLS 2000 (Cabot Corp., Alpharetta, Ga.). Each has a surface area of from about 1300 to 1500 $m^2/g$ although the KETJENBLACK carbon is more graphitic. KETJEN-BLACK samples were considerably more viscous and thus were diluted with water to reduce the carbon concentration to 2 weight percent. BLACKPEARLS samples were less viscous and were diluted with water to yield 4 weight percent carbon. In the samples with Mn/C ratios higher than 10%, $KMnO_4$ was added, being initially dissolved in the water used for sample dilution. All the samples were processed while varying the inlet temperature and $KMnO_4$ content. This resulted in the electrocatalyst samples listed in Table XII.

TABLE XII

High surface area carbon electrocatalyst examples

| Example | Carbon Black Source | Mn/C (wt. %) | Inlet T (° C.) | Weight (g) | Recovery (%) |
|---|---|---|---|---|---|
| 35A | Ketjenblack | 10 | 208 | 400 | 82 |
| 35B | Ketjenblack | 10 | 315 | 440 | 88 |
| 36A | Ketjenblack | 15 | 208 | 530 | 94 |
| 36B | Ketjenblack | 15 | 315 | 510 | 92 |
| 37A | Ketjenblack | 20 | 208 | 600 | 93 |
| 37B | Ketjenblack | 20 | 315 | 660 | 94 |
| 38A | Blackpearls | 10 | 208 | 490 | 98 |
| 38B | Blackpearls | 10 | 315 | 500 | 99 |
| 39A | Blackpearls | 15 | 208 | 570 | 97 |
| 39B | Blackpearls | 15 | 315 | 570 | 98 |
| 40A | Blackpearls | 20 | 208 | 610 | 96 |
| 40B | Blackpearls | 20 | 315 | 630 | 98 |

Examples were processed in the order listed in Table XII. The carrier gas pressure was 80 psi and the carbon suspension was delivered to the spray nozzle at a rate of 150 to 250 mumin.

Figure 60:
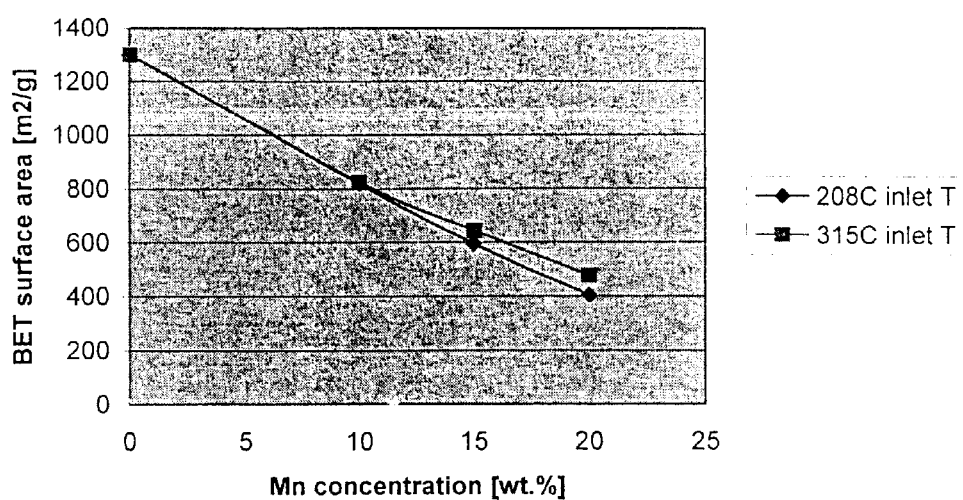
Figure 61:
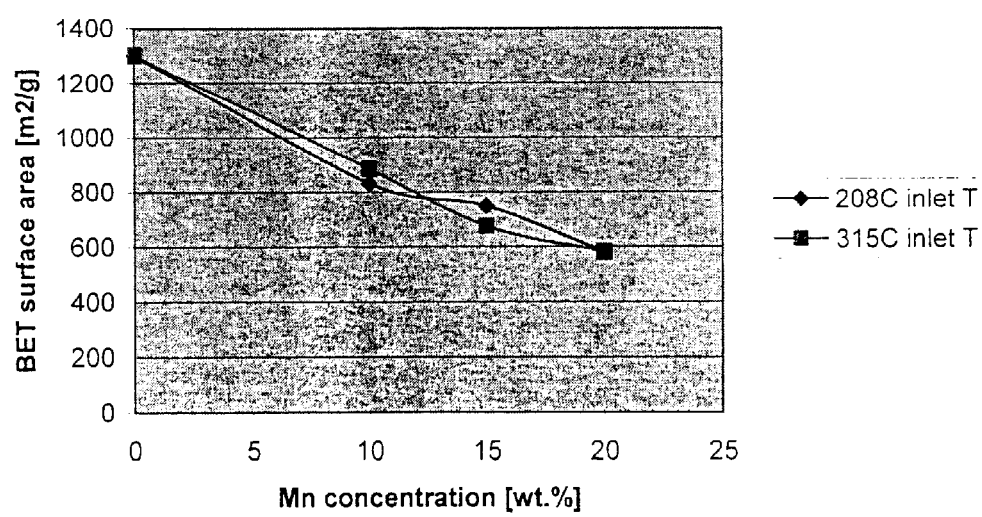

$MnO_x$ was successfully dispersed over both high-surface area carbon materials resulting in high surface area electrocatalytic powder. FIGS. 60 and 61 illustrate the dependencies of the surface area on the amount of Mn deposited on the carbon. Catalysts based on both types of carbon support can be obtained with BET surface areas from 850 to 600 $m^2/g$ when the Mn concentration is varied from 10 to 20 weight percent. The conversion temperature does not affect the surface area significantly. In all cases there is an apparent linearity in the dependencies that can be interpreted in terms of even distribution of the $MnO_x$ on the carbon carrier surface, resulting in additive blocking and agglomeration effects.

Table XIII contains the XPS data for the examples listed in Table XII.

TABLE XIII

XPS data for samples based on high-surface area carbon blacks

| Example | Spray drier inlet temperature (° C.) | Mn (wt. %) | Mn $2P_{3/2}$ binding energy (eV) | I (Mn 2p)/ I (C 1s) Experimental |
|---|---|---|---|---|
| 35A | 208 | 10 | l.r.* | 0.052 |
| 35B | 315 | 10 | 641.6 | 0.143 |
| 36A | 208 | 15 | 642.8 | 0.229 |
| 36B | 315 | 15 | 644.1 | 0.257 |
| 37A | 208 | 20 | l.r.* | 0.061 |
| 37B | 315 | 20 | 643.2 | 0.330 |
| 38A | 208 | 10 | 644.5 | 0.052 |
| 38 | 315 | 10 | l.r. | 0.000 |
| 39A | 208 | 15 | 643.1 | 0.269 |
| 39B | 315 | 15 | 642.6 | 0.141 |
| 40A | 208 | 20 | n.a. | n.a. |
| 40B | 315 | 20 | 642.2 | 0.244 |

*l.r. - low resolution

Figure 62:
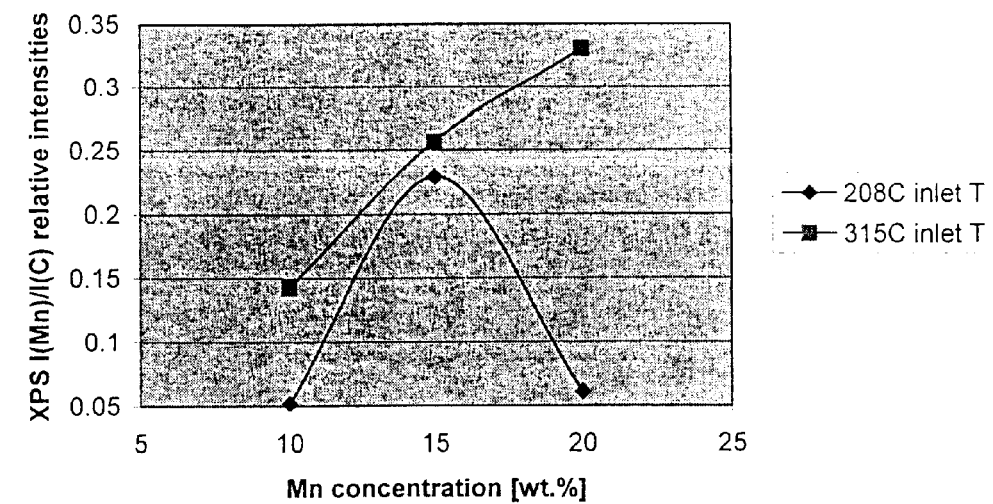
Figure 63:
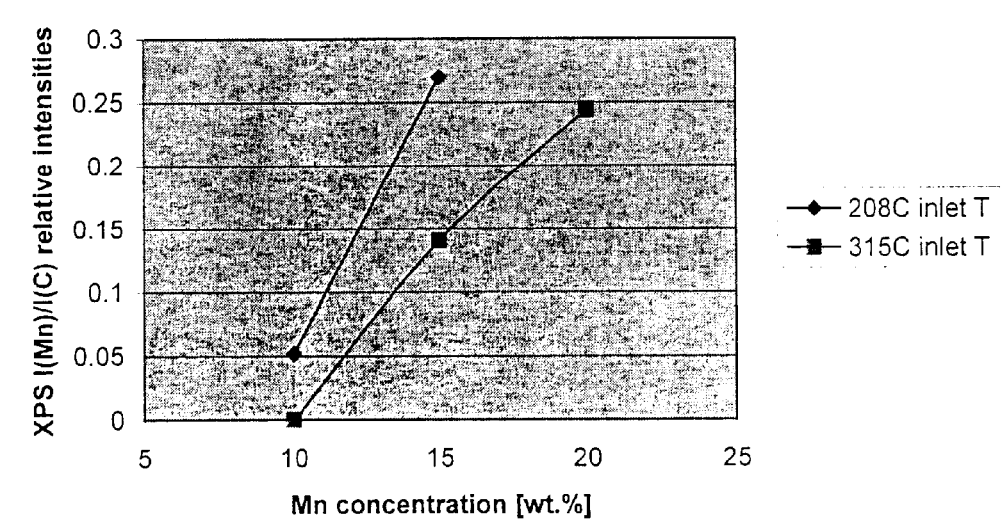

FIGS. 62 and 63 compare the dispersion of the $MnO_x$ species (followed by the changes in the XPS I (Mn)/I (C) relative intensities) as a function of the Mn loading and spray drier inlet temperature for KETJENBLACK (FIG. 62) and BLACKPEARLS (FIG. 63) supports. Since the sample surface area also changes as a function of the active species loading and the conversion inlet temperature, an accurate comparison of the dispersion requires application of the Kerkhof and Moulijn XPS model. However, for initial evaluation of the catalysts morphology and active phase distribution, the XPS I (Mn)/I (C) relative intensities will be used.

For both catalyst supports an inlet temperature of 315° C. produces samples with a linear increase of the XPS I (Mn)/I (C) relative intensities vs. Mn content. For an inlet temperature of 208° C., the results are very different for the two types of samples. While for the KETJENBLACK support the XPS values for an inlet temperature of 208° C. are lower than for 315° C. whereas, for the BLACKPEARLS support they are significantly higher. These results indicate that carbon support chemistry and morphology play a significant role in the formation of the active species and their distribution. In support of this statement are the XPS data for the Mn $2p_{3/2}$ binding energy positions (Table XII). Only for very few samples such as Examples 40B, 39B, and 36A is the binding energy similar to that of Mn (IV) oxidation state. For Example 35B it is closer to the Mn (III) oxidation state, while for all other samples it has significantly higher values. These higher values could be due either to the presence of non-converted precursor or the presence of converted $MnO_x$ species with higher than Mn (IV) oxidation state.

2. $NiCoO_x$ Bi-functional Electrocatalysts

Bi-functional catalysts for oxygen reduction/evolution are complex electrochemical catalyst systems. These electrocatalysts must possess at least two different types of catalytic active centers, based on the fact that oxygen evolution and oxygen electro-reduction are both irreversible reactions. Among several possible chemistries, the mixed oxide system NiO:CoO (1:2) was selected for evaluation. This is one of the least sophisticated bi-functional electrocatalyst, yet demonstrates exceptional activity and sufficient cycle life.

The cycle life of a bi-functional catalyst will be limited by the destruction of the carbon support during oxygen evolution (cell charging), the so called "electrochemical burning" of carbon. Graphitic carbons are more resistant to the electrochemical oxidation during oxygen evolution than amorphous carbons. NiO:CoO composite electrocatalysts are typically obtained by a conventional precipitation on activated carbon. A catalyst made by this method was used for comparison to the present invention.

Several samples of NiO:CoO electrocatalysts were synthesized both supported on various carbon materials and as individual composite powders (no supporting material used). The catalysts samples were prepared using ultrasonic aerosol generation and the resulting electrocatalyst powders exhibited surface areas of from about 2 to 90 $m^2/g$.

Electrochemical evaluation of the NiO:CoO bi-functional electrocatalysts included initial polarization curves in alkaline electrolyte for screening and incorporation into a laboratory test cell with a metal hydride (MH) anode to form a MH-air system and to test cycle life.

The bifunctional oxygen electrodes were made using a conventional dry-powder press technology. A hydrophobic layer of hydrophobized acetylene carbon black (35 TEFLON) was pressed at 300 $kg/cm^2$ at an elevated temperature of 340° C. on a nickel mesh current collector with a catalytic layer, loaded with approximately 1 $mg/cm^2$ of electrocatalyst. Electrodes with three types of catalyst were compared: dispersed NiO:CoO electrocatalyst; NiO:CoO electrocatalysts supported on carbon black; and a "standard" NiO:CoO electrocatalyst, made by a traditional precipitation procedure. All the electrodes were evaluated in a half-cell testing assembly using KOH as electrolyte.

Figure 64:
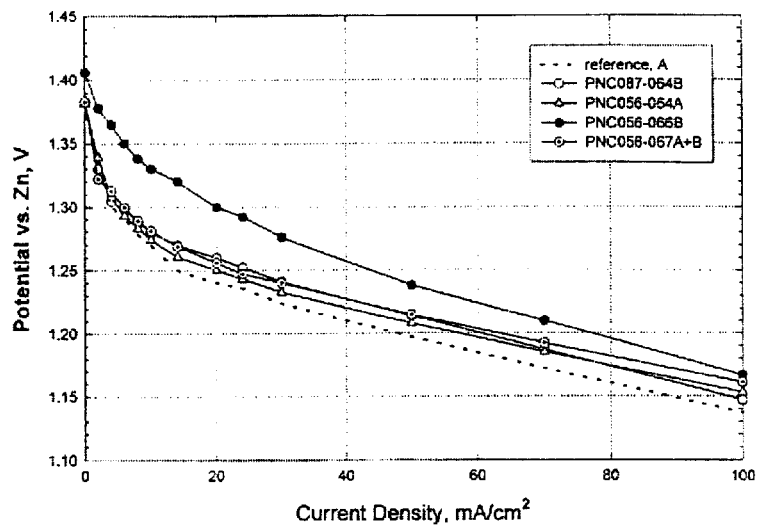
Figure 65:
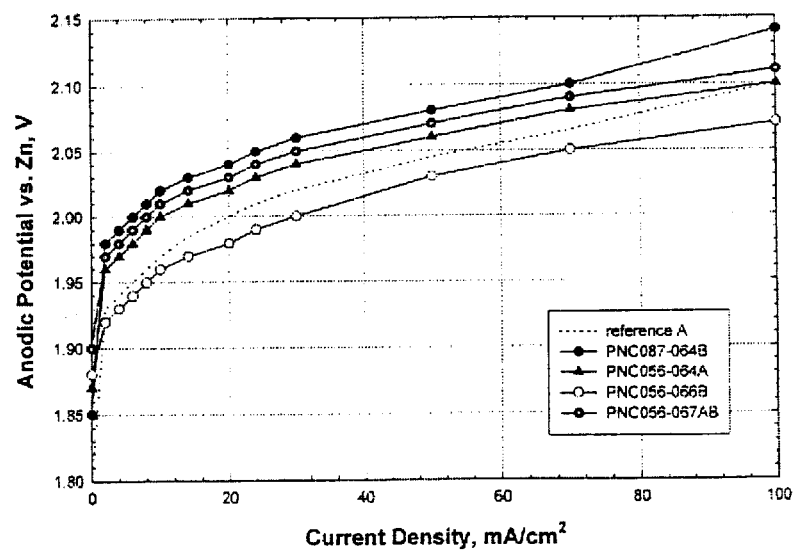
Figure 66:
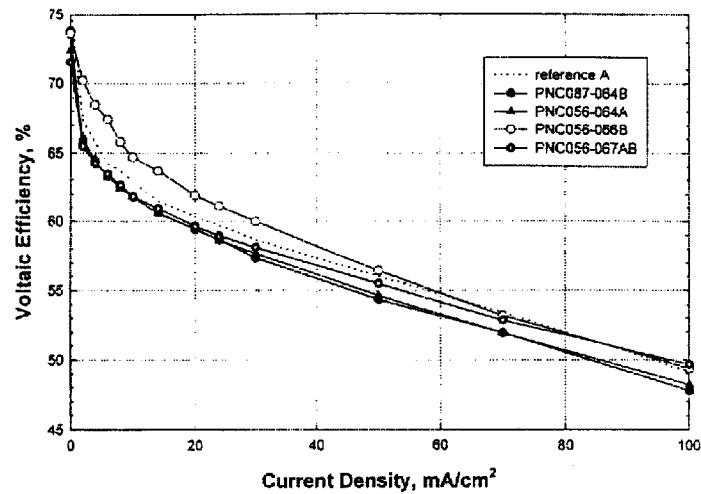
FIG. 66 illustrates the voltaic efficiency of a bi-functional electrocatalyst powder according to the present invention when applied for both oxygen reduction and oxygen evolution reaction.

FIG. 64 illustrates the polarization curves of the electrodes tested. The polarization curve of the electrode with a prior art catalyst is shown in FIGS. 64–66 by a dashed line and the remaining lines are catalysts produced according to the present invention. It can be seen that dispersed NiO:CoO electrocatalyst prepared according to the present invention demonstrates the most advantageous performance in oxygen reduction. The superiority of the same electrocatalyst is even more pronounced in the reaction of oxygen evolution, as illustrated in FIG. 65. In this case, the NiO:CoO electrocatalyst of the present invention allows evolution of the molecular oxygen at the lowest anodic potential.

Re-calculation of the results presented in FIG. 64 and FIG. 65, in terms of ratios of the cathodic/anodic voltages at a given current density (expressed in percent) is illustrated in FIG. 66. This figure presents the voltaic efficiency of the oxygen bi-functional electrodes which is directly associated with energy losses during the charge/discharge cycles of a cell.

Due to the superior performance of the NiO:CoO electrocatalyst of the present invention voltaic efficiency of the electrode made with this catalyst is from 62 to 65 percent within the expected range of operating current densities of 10 to 20 $mA/cm^2$. This is a very promising result since voltaic efficiencies above 55 percent are considered practical, and in commercial battery systems they usually do not exceed 60 percent. Based on these results, the dispersed unsupported NiO:CoO electrocatalyst was selected for further evaluation in a laboratory MH-air cell.

Two identical bifunctional oxygen gas diffusion electrodes (open area 5 cm$^2$) with NiO:CoO electrocatalyst were used in a symmetrical assembly. They were mounted in the walls of the testing cell.

The metal hydride electrode was prepared using the AB$_5$ metal alloy composition MmNi$_{4.1}$Co$_{0.4}$Mn$_{0.4}$Al$_{0.3}$ as the active species (where Mm is mischmetal). The electrode consisted of 0.1 g/cm$^2$ a mixture of the metal hydride alloy powder and hydrophobized carbon black (35 wt. % TEFLON) in a weight ratio of 1:1, pressed on the both sides of a nickel mesh. The working area of the electrodes was 5 cm$^2$.

The MH electrode was immersed between the two oxygen electrodes and the cell was filled in with a 31 wt. % KOH electrolyte. The overall thickness of the test cell is approximately 11 mm (1 mm per electrode and 4 mm for each electrolyte layer, the distance between the oxygen cathode and the MH anode). The central part of the cell was provided with two holes for filling the electrolyte and for a reference electrode used for independent measurements of the electrodes polarization during operation. The electrolyte volume in the cell was 10 cm$^3$.

Figure 67:
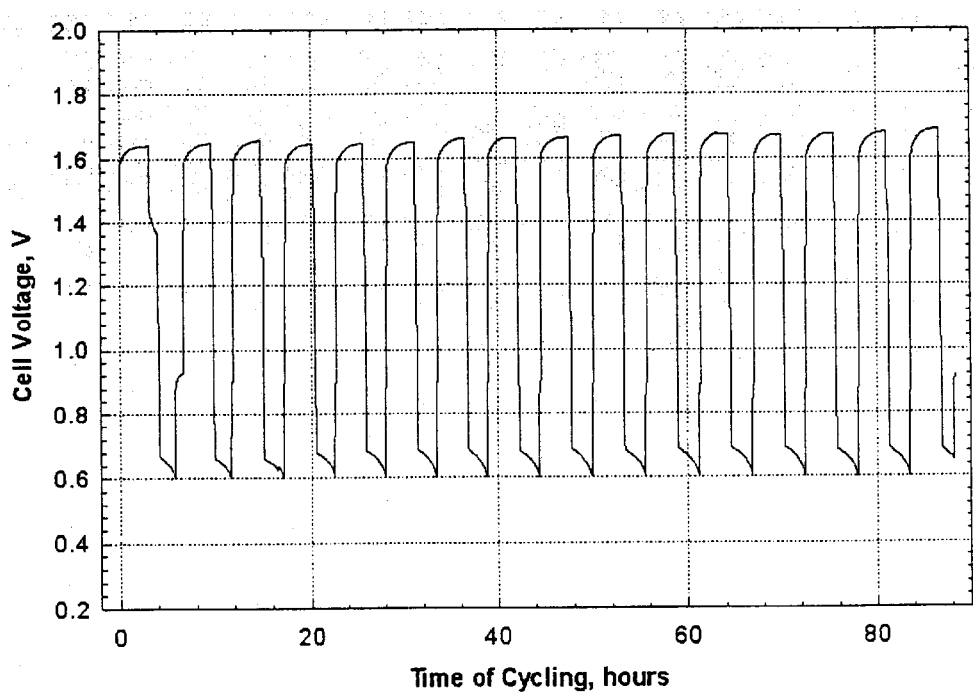
FIG. 67 illustrates the effect of cycling a metal hydride-air cell including a bi-functional electrocatalyst powder according to the present invention.

The MH-air testing cell was cycled at relatively high current densities of 13.5 mA/cm$^2$ at C/2 charge/discharge rate (total current approximately 110 mA). This regime was chosen to expose the oxygen electrodes to harsh conditions in order to reveal a potential malfunction in a considerably short time. FIG. 67 shows the voltage transients obtained during several days of such a high-load test. It can be seen from the figure that the cell performance did not deviate from uniformity through 16 charge/discharge cycles. There was no observation of the electrolyte darkening from eventual products of oxygen electrode degradation. The electrocatalyst has demonstrated superior electrochemical activity with respect to both reactions and contains no oxidizable carbon support.

Figure 68:
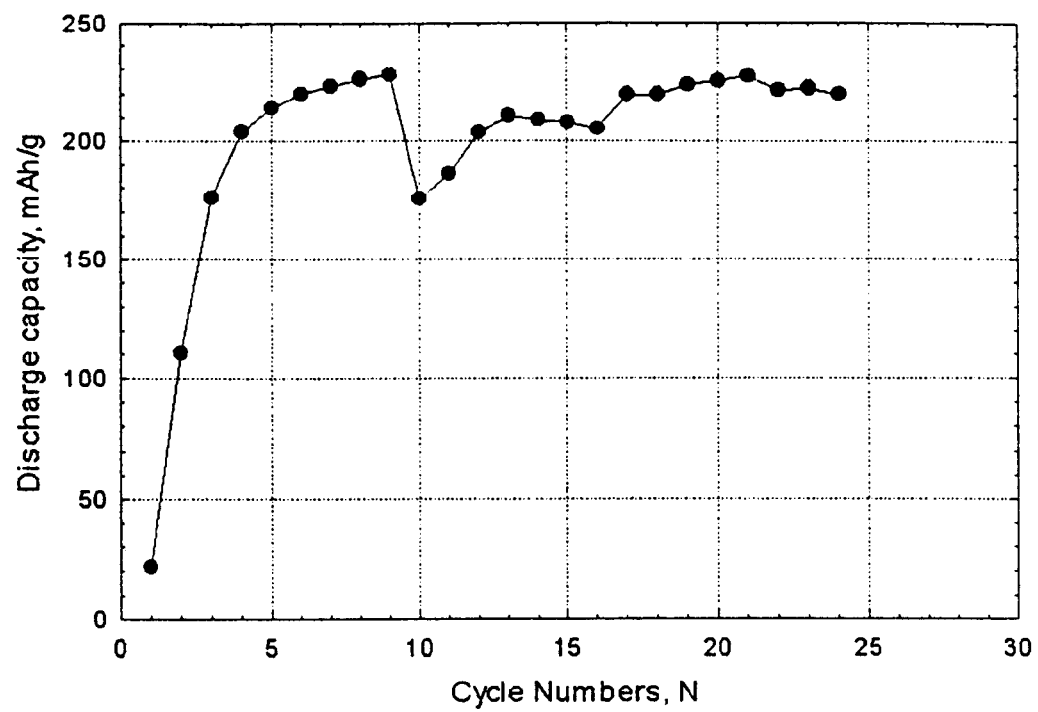
FIG. 68 illustrates the capacity of a metal hydride-air cell utilizing a bi-functional electrocatalyst powder according to the present invention.

Reproducibility and the effectiveness of the charge/discharge characteristics of the testing MH-air cell are illustrated also by FIG. 68, which shows the specific capacity as a function of 24 cycles. The curve reveals excellent initial cyclabilty of the cell demonstrated by the retention of the discharge capacity at 220 mAh/g (variations are associated with periodic additions of electrolyte). There is no declining trend after 15 to 20 cycles, which is frequently observed for other metal-air secondary battery systems. The gravimetric power density is about 35 W/kg and the volumetric power density is 70 W/L. The corresponding energy density is 80 Wh/kg and specific energy is 150 Wh/L.

3. Metal-carbon Composite Powders

Further examples in accordance with the present invention were prepared and are described in Table XIV. The powder batch examples were prepared by ultrasonic generation and the aerosol was heated in a tubular furnace reactor. All of the examples were prepared using GRAFO 1300 (Fuchs Lubricant Co., Harvey, Ill.) which is a suspension of carbon particles having an average particle size of 30 nanometers and a surface area of about 254 m$^2$/g. The corresponding amount of Pt precursor was dissolved and added to the carbon suspension to form the precursor. Table XIV describes the type of Pt precursor used, the carrier gas, the conversion temperature and targeted Pt nominal concentration in the final catalyst.

TABLE XIV

Conditions for ultrasonically generated Pt/C powder

| Example | Pt precursor | Pt (wt. %) | Furnace temperature (° C.) | Carrier gas |
|---|---|---|---|---|
| 27B | Pt(NH$_3$)$_4$(NO$_3$)$_2$ | 20 | 400 | Air |
| 31B | Pt(NH$_3$)$_4$(NO$_3$)$_2$ | 20 | 700 | Air |
| 31C | Pt(NH$_3$)$_4$(NO$_3$)$_2$ | 20 | 500 | Air |
| 32A | Pt(NH$_3$)$_4$(NO$_3$)$_2$ | 20 | 300 | Air |
| 32B | Pt(NH$_3$)$_4$(NO$_3$)$_2$ | 20 | 200 | Air |
| 33B | Pt(NH$_3$)$_4$(NO$_3$)$_2$ | 20 | 200 | N$_2$ |
| 33C | Pt(NH$_3$)$_4$(NO$_3$)$_2$ | 20 | 300 | N$_2$ |
| 36A | Pt(NH$_3$)$_4$(NO$_3$)$_2$ | 20 | 300 | N$_2$ |
| 36B | Pt(NH$_3$)$_4$(NO$_3$)$_2$ | 20 | 300 | N$_2$ |
| 36C | Pt(NH$_3$)$_4$(NO$_3$)$_2$ | 20 | 500 | N$_2$ |
| 37A | Pt(NH$_3$)$_4$(NO$_3$)$_2$ | 20 | 500 | N$_2$ |
| 37B | Pt(NH$_3$)$_4$(NO$_3$)$_2$ | 20 | 500 | N$_2$ |
| 37C | Pt(NH$_3$)$_4$(NO$_3$)$_2$ | 20 | 700 | N$_2$ |
| 37D | Pt(NH$_3$)$_4$(NO$_3$)$_2$ | 20 | 700 | N$_2$ |
| 37E | Pt(NH$_3$)$_4$(NO$_3$)$_2$ | 20 | 700 | N$_2$ |
| 38A | Pt(NH$_3$)$_4$(NO$_3$)$_2$ | 20 | 500 | N$_2$ |
| 38B | Pt(NH$_3$)$_4$(NO$_3$)$_2$ | 20 | 500 | Air |
| 39A | Pt(NH$_3$)$_4$(NO$_3$)$_2$ | 20 | 400 | Air |
| 39B | H$_2$Pt(OH)$_6$ | 10 | 400 | Air |
| 40C | H$_2$Pt(OH)$_6$ | 10 | 300 | Air |

Figure 69:
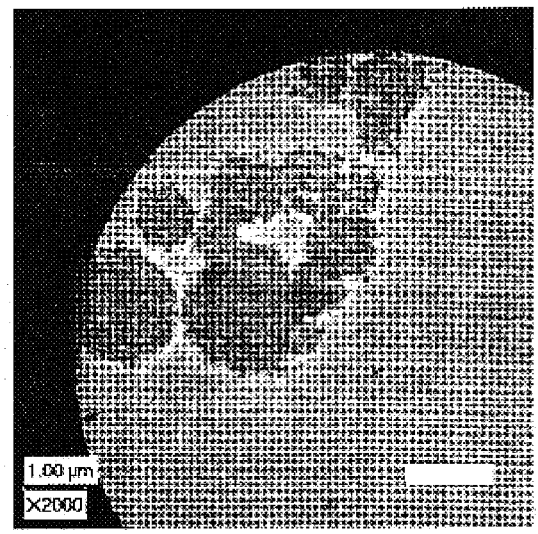
FIG. 69 illustrates a TEM photomicrograph of an electrocatalyst powder according to an embodiment of the present invention.
Figure 70:
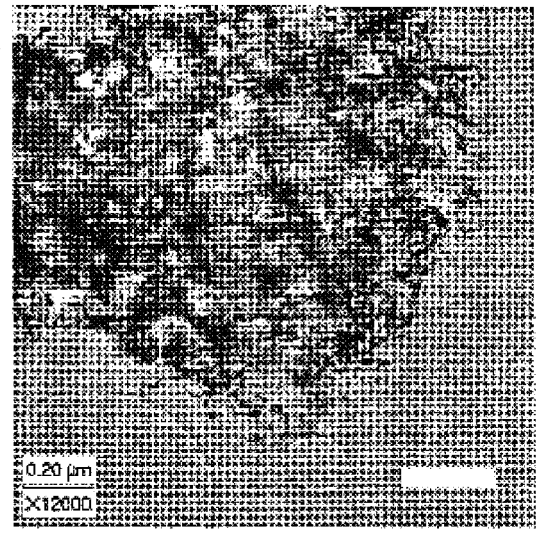
FIG. 70 illustrates a TEM photomicrograph of an electrocatalyst powder according to an embodiment of the present invention.

FIG. 69 illustrates a low magnification (2000×) TEM image of Example 31C, which is typical for the examples produced. The secondary carbon particles are substantially spherical with the particle size varying between 1 and 2 μm. The secondary particles (support phase) consist of primary carbon particles of about 30 nanometer diameter and various sizes of Pt particles and particle clusters dispersed thereon. FIG. 70 illustrates a higher magnification image (12,000×) of Example 31C. As can be seen from the TEM images, the secondary electrocatalyst particles have a highly porous structure.

Figure 71:
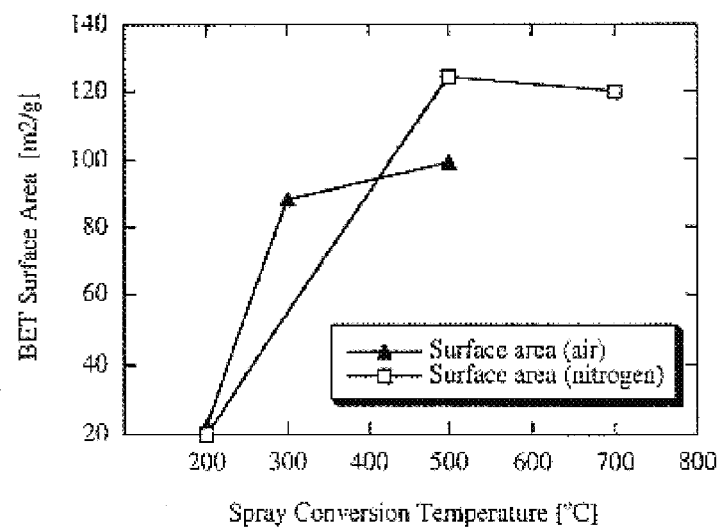
FIG. 71 illustrates the effect of spray conversion temperature on surface area of an electrocatalyst powder according to an embodiment of the present invention.

The BET nitrogen absorption method was used to analyze the surface area of the ultrasonically generated Pt/C catalyst powders according to the present invention. The results are summarized in FIG. 71. Both the conversion temperature and the carrier gas composition had an effect on the catalyst surface area. When air is used as a carrier gas, the surface area is higher at a conversion temperature of 300° C. (89 m$^2$/g) compared to 200° C. (22 m$^2$/g). However, a further increase of the conversion temperature to 400° C. did not lead to significant change in the surface area. In contrast, when nitrogen is used as carrier gas, the catalyst surface area increases to 125 m$^2$/g at 500° C. and a further increase of the conversion temperature to 700° C. also decreases the surface area.

Analysis of the changes in the surface area as a function of the spray conversion temperature and carrier gas composition led to the following conclusions:

when air is used as a carrier gas, spray conversion temperatures above 300° C. are not significantly beneficial for increasing the surface area;

when nitrogen is used as a carrier gas, the powder surface area is generally higher compared to powders generated with air as a carrier gas;

if nitrogen is used as a carrier gas, a conversion temperature of 500° C. is advantageous for producing a high surface area powder; and the surface area after spray conversion is at least three times lower than the surface area of the original carbon support.

XPS analysis was performed on the samples to provide information about the Pt oxidation state and dispersion in the catalysts. Three main characteristics of the XPS spectra were analyzed allowing comparison between the samples generated at different conditions: the positions of the binding energy of Pt $4f_{7/2}$ photoelectrons which indicates the Pt oxidation state; the relative intensities of Pt 4f vs. C 1s photoelectron peaks which indicates the level of Pt dispersion; and the appearance of N 1s photoelectron peak and its relative intensity vs. C 1s peak which indicate the level of impurities and the degree of conversion of the platinum precursor.

All preparation conditions, recording of the spectra and data processing were identical for all samples. The samples were prepared for XPS analysis by pressing them into indium foil (99.9%) which was previously cleaned in $HNO_3$ to remove impurities at the surface.

The XPS spectra for all of the catalysts were recorded on an AXIS HSi (Kratos Analytical) spectrometer, working in ΔE=constant mode at a pass energy of 80 eV, using a monochromated aluminum anode (Al $K_\alpha$=1486.7 eV, 225 W). The residual pressure in the analysis chamber was $1\times10^{-9}$ Torr (1 Torr=133.3 Pa). The peak positions were estimated relative to the binding energy of C 1s=284.6 eV. The following XPS peaks, designated by their electron levels, were recorded: Pt 4f, C 1s, O 1s and N 1s. One survey scan was acquired in the 75 to 1175 eV binding energy range before the high resolution spectra were acquired. The experimental intensities were estimated from the areas of the corresponding peaks, measured on smoothed original peaks. The area of the Pt 4f peak includes the areas of both Pt $4f_{7/2}$ and $4f_{5/2}$ peaks. The results are listed in Table XV.

As listed in Table XV, a Pt $4f_{7/2}$ binding energy of 71.2 eV was measured for the prior art catalyst (Sample 3A). The measured values for the Pt 4f binding energies, peak hwhm (half width at half maximum) and peak intensities closely match the theoretical and model XPS handbook values of Pt 4f peaks for Pt (0) oxidation state, i.e., for Pt metal. These values were further used for curve fitting of the Pt 4f peaks for the catalysts according to the present invention.

TABLE XV

XPS data for Pt/C Powders

| Example | Pt $4f_{7/2}$ peak position (eV) | I (Pt 4f)/I (C 1s) (relative intensities) | I (N 1s)/I (C 1s) (relative intensities) |
|---|---|---|---|
| Sample 3A* | 71.2 | 0.682 | 0.028 (1.5 at. %) |
| 27B | 71.2 (80%) 72.5 (20%) | 0.305 | 0.000 |
| 31C | 71.4 | 0.481 | 0.020 (1.0 at. %) |
| 32A | 72.1 (80%) 73.2 (20%) | 0.398 | 0.000 |
| 32B | 73.4 | 0.352 | 0.149 (5.6 at. %) |
| 33B | 73.3 | 0.406 | 0.165 (7.0 at. %) |
| 37C | 71.8 | 0.489 | 0.009 (0.4 at. %) |
| 38A | 71.6 | 0.525 | 0.000 |
| 39A | 71.7 | 0.327 | 0.000 |
| 39B | 71.6 | 0.234 | 0.022 (1.1 at. %) |
| 40C | 71.9 | 0.327 | 0.025 (1.3 at. %) |

*prior art

Table XV also contains information regarding the I (Pt 4f)/I (C 1s) relative intensities, which can be used to measure the dispersion of the Pt clusters on the carbon support. Since almost all of the catalysts of the examples contain an identical amount of Pt as Example 3A (20 wt. % Pt), the relative intensities I (Pt 4f)/I (C 1s) can be used for direct comparison of their Pt dispersion relative to the one for the commercial catalyst. This is mostly accurate for the catalysts of the present invention that have comparable surface area to the commercial catalyst, e.g., those prepared at spray conversion temperatures of 300° C. and above in nitrogen and at 400° C. and above in air.

Table XV also lists the relative intensities I (N 1s)/I (C 1s) and the surface concentration of nitrogen in atomic percent for all catalysts analyzed by XPS. Example 3A (prior art) contains small impurities of nitrogen, which could indicate the use of nitrogen-containing reagents in the preparation of the catalyst or the presence of a nitrogen-containing surfactant.

As can be seen from the Pt 4f spectrum for Example 27B, the curve fit for the Pt 4f peaks cannot be accomplished using only the doublet related to Pt(0) oxidation state. A second doublet of Pt 4f peaks is needed with binding energy of 72.5 eV for the Pt $4f_{7/2}$ peak. This Pt $4f_{7/2}$ binding energy can be related to Pt (II) oxidation state indicating that the conversion of the Pt precursor to Pt metal is not complete in Example 27B. The relative intensity of the second doublet related to Pt (II) oxidation state accounts for approximately 20% of the total Pt 4f peak area and therefore up to 20% of the Pt in the Example 27B is not converted to Pt (0) oxidation state, indicating that spray conversion in air at 400° C. does not completely reduce the Pt precursor to Pt(0) and does not produce good dispersion of Pt clusters on the carbon support. The value of the relative intensity I (Pt 4f)/I (C 1s) for Example 27B is more than two times lower compared to the one for the commercial catalyst. No nitrogen impurities, however, were detected for Example 27B.

It should be noted that for Pt-based fuel cell catalysts, supported on carbon, highly dispersed Pt metal clusters are required for achieving high catalytic activity. Therefore, achieving high dispersion of Pt in the Pt (0) state can be used as criteria for the prediction of catalytic performance of the fuel cell catalysts.

In order to find optimal spray conversion conditions for achieving complete Pt reduction and high dispersion, the changes in these characteristics as a function of the spray conversion temperature and the carrier gas composition were analyzed. In general, a shift in the position of the Pt $4f_{7/2}$ peak towards higher than 71.2 eV binding energies was considered an indication of a non-complete reduction to Pt metal. Simultaneously, a relative intensity I (Pt 4f)/I (C 1s) lower than the commercial sample is indicative of lower Pt cluster dispersion, corresponding to higher average size of Pt clusters. For Example 38A, the XPS analysis was repeated in order to estimate the accuracy of the measurements. A comparison between the two analyses shows excellent reproducibility for the XPS peak positions and less than 2% difference in the XPS relative intensities.

Figure 72:
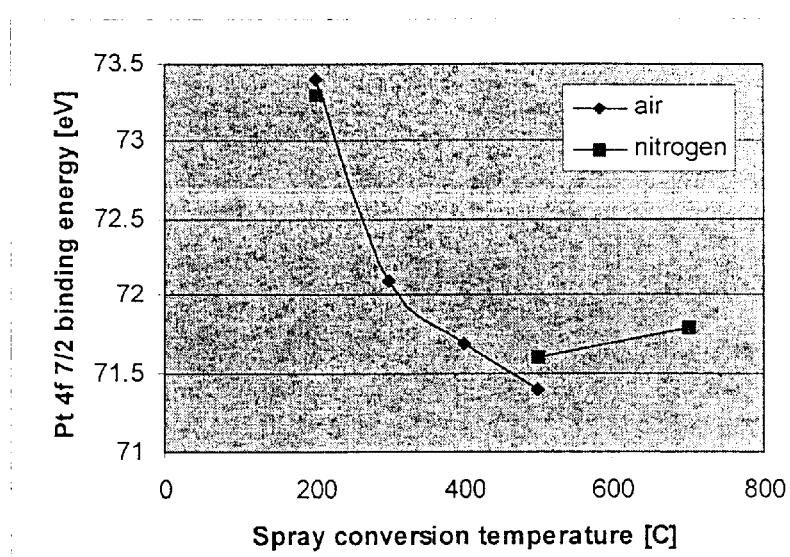
FIG. 72 illustrates the effect of spray conversion temperature on platinum metal binding energy for an electrocatalyst powder according to an embodiment of the present invention.

FIG. 72 illustrates the dependence of the Pt $4f_{7/2}$ binding energy position for the catalysts (formed from $Pt(NH_3)_4(NO_3)_2$ precursor) as a function of the spray conversion temperature and the carrier gas composition. A conversion temperature of at least 500° C. is necessary with air as a carrier gas to achieve a reasonably high degree of conversion to the Pt (0) oxidation state. There are no significant differences observed when nitrogen is used as a carrier gas. An increase of the conversion temperature to 700° C. does not lead to improved results. Therefore, when $Pt(NH_3)_4(NO_3)_2$ precursor is used in the formulations, a temperature of at least about 500° C. seems adequate for achieving complete conversion of the precursor and formation of Pt metal species.

In support of that conclusion are the high-resolution XPS spectra which were measured for Example 32B and Example 33B. Both catalysts were made at a conversion temperature of 200° C., Example 32B with air as a carrier gas and Example 33B with nitrogen as a carrier gas. In addition to the peaks at 73.2 eV for Pt(II) oxidation state, e.g., partially converted precursor, another Pt 4f peak doublet appears with Pt $4f_{7/2}$ binding energy of approximately 75.6 eV which is very close to the value for the Pt (IV) oxidation state. In the N 1s region peaks at 404.2 eV and 406.5 eV are observed and related to $NO_2$ and $NO_3$ species, which confirms the conclusion for non-complete precursor conversion. This non-complete conversion results in a concentration of nitrogen in these catalysts of up to 7 atomic percent.

An increase in the conversion temperature to 300° C. (Example 32A) leads to a significant decrease of the nitrogen impurities. However, even though the precursor conversion is more complete, approximately 20% of the Pt in the Ft(II) oxidation state.

Figure 73:
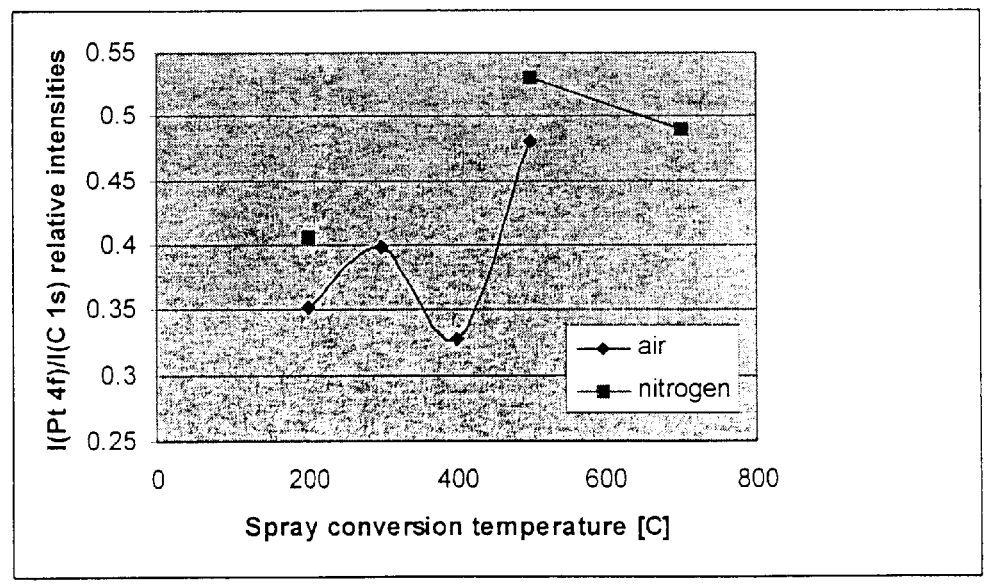
FIG. 73 illustrates the effect of spray conversion temperature on metal dispersion for composite electrocatalyst powders according to an embodiment of the present invention.

As mentioned above, the dispersion of the Pt clusters is of significant importance for achieving high catalytic activity. FIG. 73 illustrates the dependence of the relative intensities I (Pt 4f)/I (C 1s) as a function of spray conversion temperature. In general, at identical spray conversion temperatures, the catalysts made with nitrogen as a carrier gas show higher relative intensities I (Pt 4f)/I (C 1s) and therefore have better dispersion of Pt on the support surface. An increase of the spray conversion temperature up to 500° C. leads to improved Pt dispersion for both air and nitrogen as the carrier gases. Increasing the spray conversion temperature to 700° C. is not beneficial for the Pt dispersion. The highest I (Pt 4f)/I (C 1s) relative intensity value is observed for Example 38A, which was prepared at 500° C. conversion temperature in nitrogen. The relative intensity I (Pt 4f)/I (C 1s) of 0.525 for Example 38A is still lower than the one measured for Sample 3A, which suggests lower dispersion. However, no nitrogen impurities are detected for Example 38A, while about 1.5 atomic percent impurities were detected for Sample 3A.

Two of the samples listed in Table XV were synthesized with a different Pt precursor ($H_2Pt(OH)_6$), with only 10 weight percent Pt. The XPS data for Examples 39B and 40C illustrate that a reaction temperature of at least 400° C. in air is necessary for achieving the Pt (0) oxidation state from this precursor. The Pt has higher dispersion for Example 40C, which was prepared at 300° C. compared to Example 39B, prepared at 400° C. This result is in contrast with the XPS data for samples based on $Pt(NH_3)_4(NO_3)_2$ precursor, for which higher conversion temperatures led to better Pt dispersion. This result suggests that $H_2Pt(OH)_6$ precursor converts at lower temperatures compared to $Pt(NH_3)_4(NO_3)_2$, and undesirable diffusion and agglomeration of Pt clusters occurs at higher conversion temperatures.

XPS analysis of the electrocatalyst powders provides information regarding important characteristics of the catalysts such as Pt oxidation state and dispersion, which influence the catalytic activity of the powders. However, other characteristics of the catalysts such as Pt cluster size distribution may have significant impact on the catalytic activity as well. Since XPS data gives only an estimate of the average metal dispersion, other methods such as TEM and hydrogen chemisorption can be employed for further information about the Pt/C catalyst structure.

Figure 74:
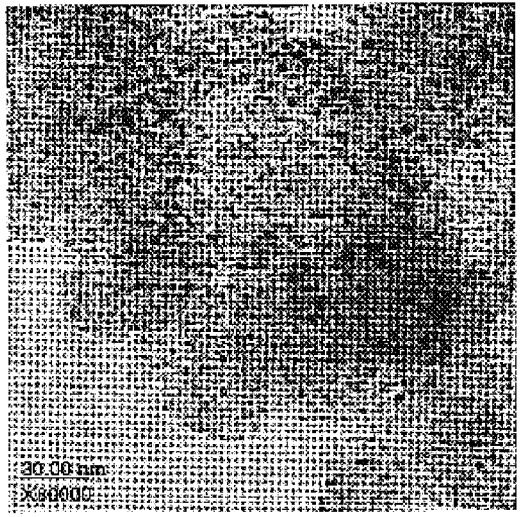
FIG. 74 illustrates a TEM photomicrograph of a prior art electrocatalyst powder.
Figure 75:
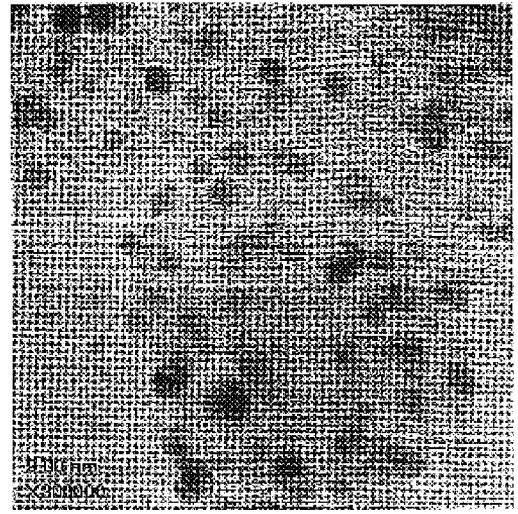
FIG. 75 illustrates a TEM photomicrograph of a prior art electrocatalyst powder.

FIGS. 74 and 75 illustrate high magnification TEM images for Example 3A (prior art). The catalyst has good overall uniformity of the distribution of Pt clusters on the carbon support particles. The Pt cluster size distribution is very narrow and most of Pt clusters have a diameter between about 3 and 5 nanometers.

Figure 76:
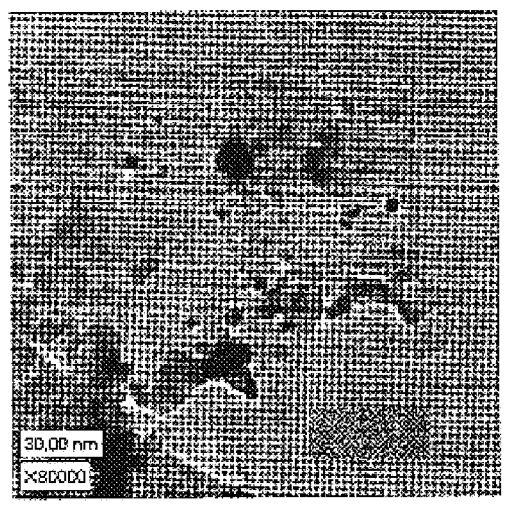
FIG. 76 illustrates a TEM photomicrograph of an electrocatalyst powder according to an embodiment of the present invention.
Figure 77:
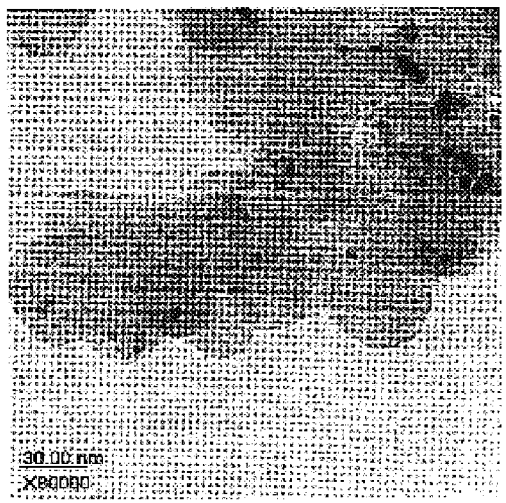
FIG. 77 illustrates a TEM photomicrograph of an electrocatalyst powder according to an embodiment of the present invention.

In contrast, the overall cluster size distribution for the Pt/C electrocatalyst powders of the present invention is not as uniform. FIGS. 76 and 77 illustrate high resolution TEM images for Example 31C (FIG. 76) and Example 38A (FIG. 77). For both samples, Iagglomeration of the Pt clusters is observed in some area of the catalysts, while low coverage with Pt clusters is observed in other areas. This apparently leads to the lower overall dispersion of Pt as found by XPS analysis.

However, the overall distribution for Example 38A (FIG. 77), which was spray converted at 500° C. in nitrogen, is significantly better compared to Example 31C (FIG. 76), which was spray converted at 500° C. in air. This observation is in agreement with the XPS data for Pt dispersion and confirms that carrier gas has influence on the catalyst formation and Pt dispersion in particular.

Figure 78:
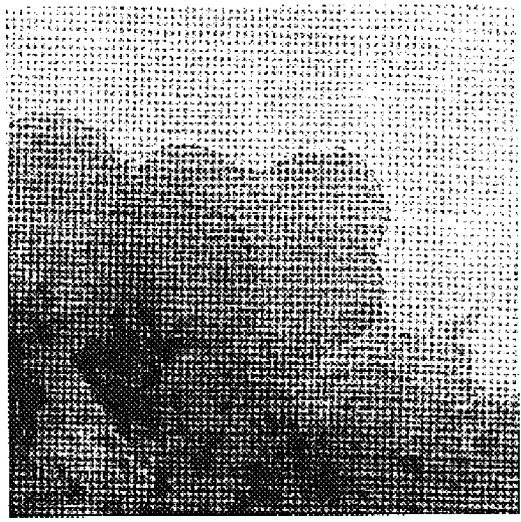
FIG. 78 illustrates a TEM photomicrograph of an electrocatalyst powder according to an embodiment of the present invention.
Figure 79:
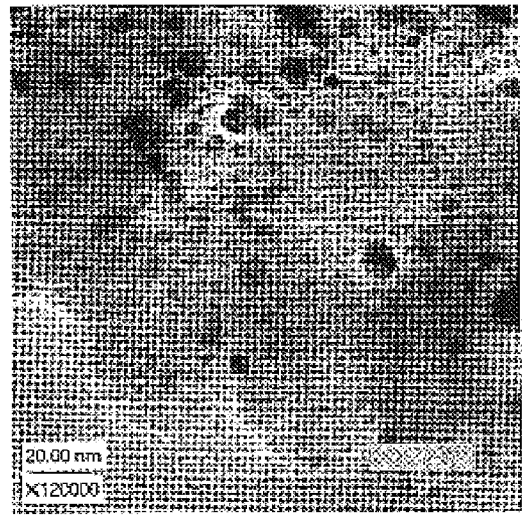
FIG. 79 illustrates a TEM photomicrograph of an electrocatalyst powder according to an embodiment of the present invention.

FIGS. 78 and 79 illustrate that Pt cluster size distribution for catalysts of the present invention is much broader than for Sample 3A, with Pt cluster diameter varying between 1 and 10 nanometers. However, a significant number of Pt clusters with a size below 3 nanometers are observed. Comparison between FIG. 74 (Sample 3A) and FIG. 78 (Example 39A) illustrates that for Example 39A, Pt clusters of about 1 to 2 nanometers are observed.

Figure 80:
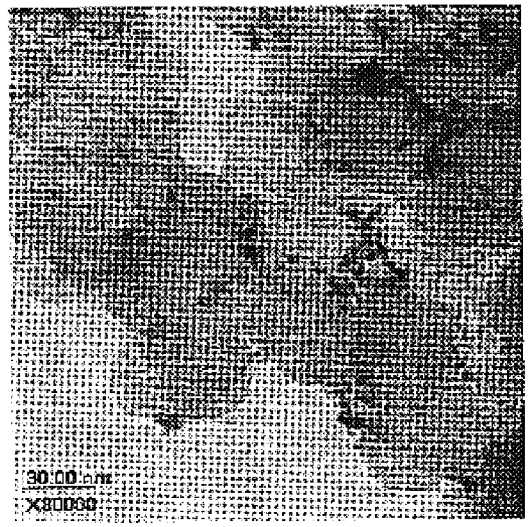
FIG. 80 illustrates a TEM photomicrograph of an electrocatalyst powder according to an embodiment of the present invention.
Figure 81:
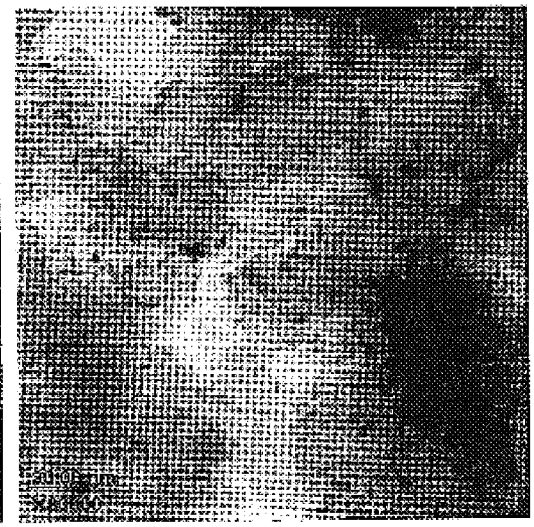
FIG. 81 illustrates a TEM photomicrograph of an electrocatalyst powder according to an embodiment of the present invention.

FIGS. 80 and 81 illustrate high magnification images of Example 39B, synthesized with $H_2Pt(OH)_6$ precursor. Comparing FIG. 78 and FIG. 80, which were prepared with two different precursors at identical conversion temperatures the degree of non-uniform deposition is significant for Example 39B. When $H_2Pt(OH)_6$ precursor was used, the degree of agglomeration of Pt clusters is much higher, likely due to enhanced diffusion of the Pt clusters. Since the decomposition temperature for the $H_2Pt(OH)_6$ precursor is lower, the Pt clusters are formed earlier in the spray conversion process and have a longer time to diffuse and form agglomerates.

Samples of the Pt/C electrocatalysts were evaluated in PEM fuel cells and the results of the electrochemical characterization were compared to two commercially available electrocatalysts. The Examples which were electrochemically characterized are Examples 37C, 38A, 39A and 39B.

Gas diffusion cathodes were fabricated by the catalyst ink method. The Pt/C catalyst was dispersed in a Nafion/alcohol/water solution to give a stable ink suspension. Specifically, 1 g of the electrocatalyst was mixed in 2 ml i-propanol (after being wetted with a small amount of water to avoid pyrogenic effects), and suspended in 10 ml of stock Nafion solution (5 wt. % of polymer in water/i-propanol mix). This ink yields a CatalystiNafion ratio of 2:1, which is to remain during the electrode preparation in order to incorporate the electrocatalyst particles into the Nafion polymer electrolyte membrane.

The gas diffusion electrode is prepared by brush application of a suspension of non-porous acetylene carbon black (Shawinigan Black, Chevron Chem. Co., Houston, Tex.), and TEFLON emulsion (DuPont) to give a 35 to 40 weight percent TEFLON/carbon ratio onto a carbon cloth. The gas-diffusion electrode, soaked with the TEFLON/carbon suspension, is heat treated at 300° C. to 350° C. for 1 hour. This temperature range is near the glass-transition point of the TEFLON material.

The Pt/Carbon electrocatalyst ink is applied on the impregnated cloth by a brush when the electrode is mounted on a hot plate at 90 to 100° C. The electrode is then treated at 155° C. in air for 20 to 30 minutes, which is close to the melting point of Nafion material. The catalyst loading is determined from the electrode weight.

The platinum loading of the cathodes was 0.20±0.01 mg/cm² which is considered low by industrial standards for oxygen electrocatalysts. All hydrogen electrodes (anodes)

were loaded with 0.05 mg/cm² of platinum using a 10% Pt/C commercial catalyst.

Membrane electrodes assemblies (MEAs) were fabricated by hot pressing electrodes symmetrically (catalyst side facing the membrane) onto both sides of a Nafion 112 (CG Processing, Inc.) PEM at 200° C., to allow melting of the membrane and the Nafion material from the catalytic layers. The performance evaluation of MEAs was carried out in test cell with a working area of 50 cm² between ribbed graphite plates and copper end plates at 50° C. and an atmospheric pressure of humidified reactant gases.

Figure 82:
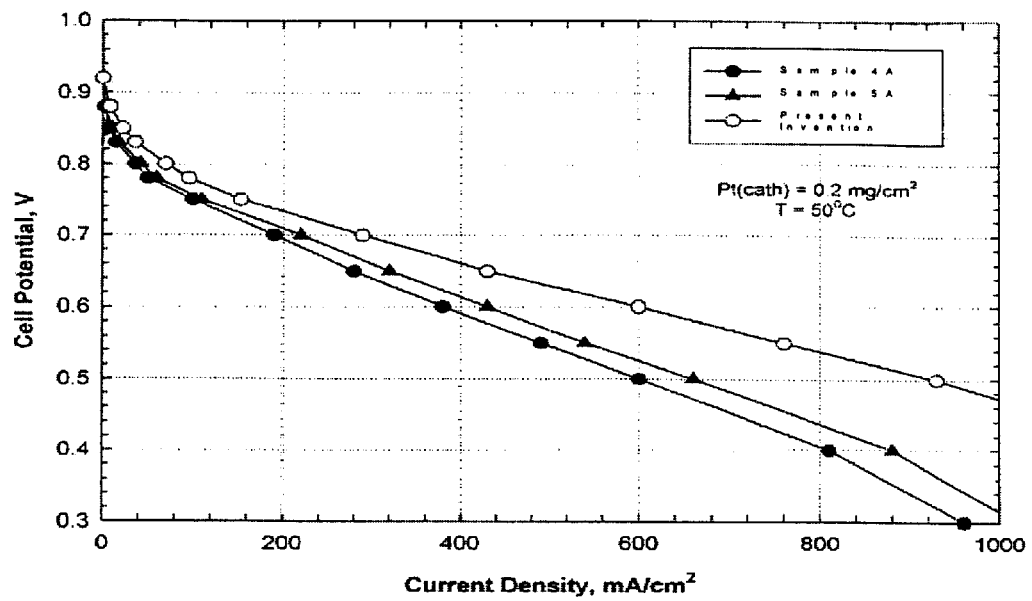
FIG. 82 illustrates the performance of membrane electrode assemblies in accordance with an embodiment of the present invention.

FIG. 82 illustrates a comparison of voltamograms (cell potential vs. current density plots) for MEAs comprising different commercial catalysts (Samples 4A and 5A) and a catalyst according to the present invention, prepared and measured under identical conditions. The results were obtained with electrocatalysts containing 20 weight percent platinum on an identical carbon black support. It is evident from these curves that the electrocatalyst of the present invention demonstrates superior performance in the MEA. Numerical expression of this superiority can be derived from the current density correspond ing to a cell potential of 0.6 V. Both prior a rt electrived prom the vide about 400 mAcm² while the electrocatalyst of the present invention provides 600 mA/cm², a 50% improvement of MEA performance at a cell potential of 0.6 V.

FIG. 82 illustrates that the electrode fabricated with the electrocatalyst of the present invention demonstrates overall higher current densities within the entire investigated range of potentials. At the same time, the polarization curve is characterized by lower dependence of the current on the potential (lower negative slope of the curve in its "linear" portion), which indicates lower ohmic resistance of the catalytic layer. The dependence of the potential on current density remains practically linear even at high current densities, indicating that there is no expression of any diffusion limitations in the investigated current density range.

Figure 83:
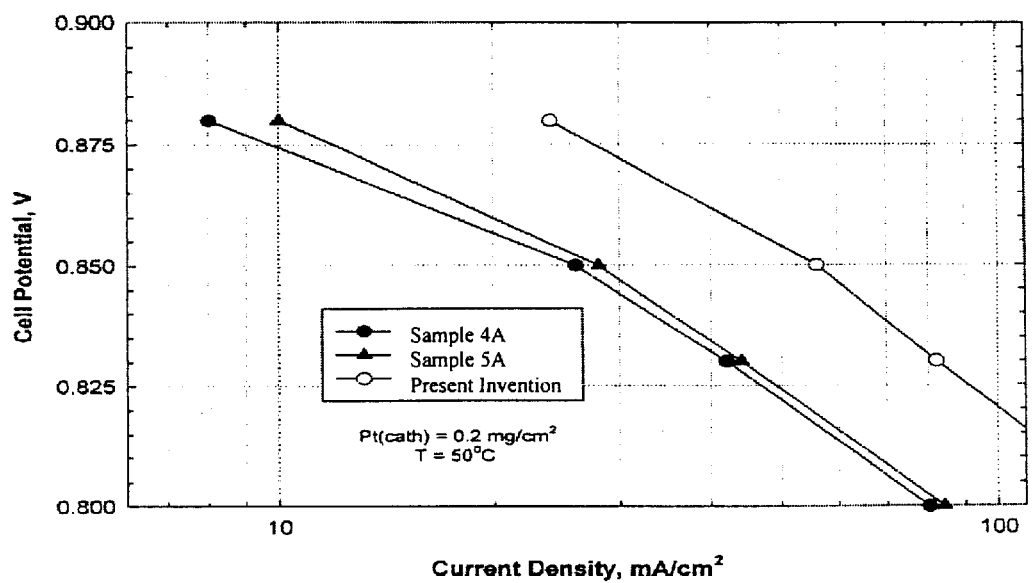
FIG. 83 illustrates the performance of membrane electrode assemblies in accordance with an embodiment of the present invention.

FIG. 83 is a Tafel plot of the data from the low current density region of FIG. 82. A Tafel plot is a semi-logarithmic data representation used to establish the mechanism of the reaction (from the negative slope of the linearized dependencies) and to reveal the catalytic effects expressed as the position of the intercepts on the current density axis. The off-gas from the reactor, or a portion thereof, can advantageously be recycled to conserve gas quantities. The recycled gas can be treated to remove unwanted components and fresh $H_2$. FIG. 83 illustrates that the advantageous performance of the catalyst generally revealed in FIG. 82 is due to higher catalytic activity. All three curves are linear (in semi-logarithmic coordinates) with the same negative slope, suggesting a uniform mechanism of oxygen reduction. The curve corresponding to the electrocatalyst of the present invention, however, is shifted toward higher current densities with a positive difference in the current density axis cutoff of approximately 30 mA/cm². Both prior art samples demonstrate practically identical catalytic activity.

The improvement in catalytic activity of the electrocatalyst of the present invention when compared to the prior art samples can be explained by the platinum cluster size and its distribution on the carbon surface. SEM microphotographs of the electrocatalysts of the present invention compared to the prior art electrocatalyst show that the catalyst of the present invention possesses a significant amount of smaller size platinum clusters (1–2 nm) compared to the prior art samples. This results in an increased platinum utilization and a larger reaction interface in the active layer of the oxygen electrode.

Figure 84:
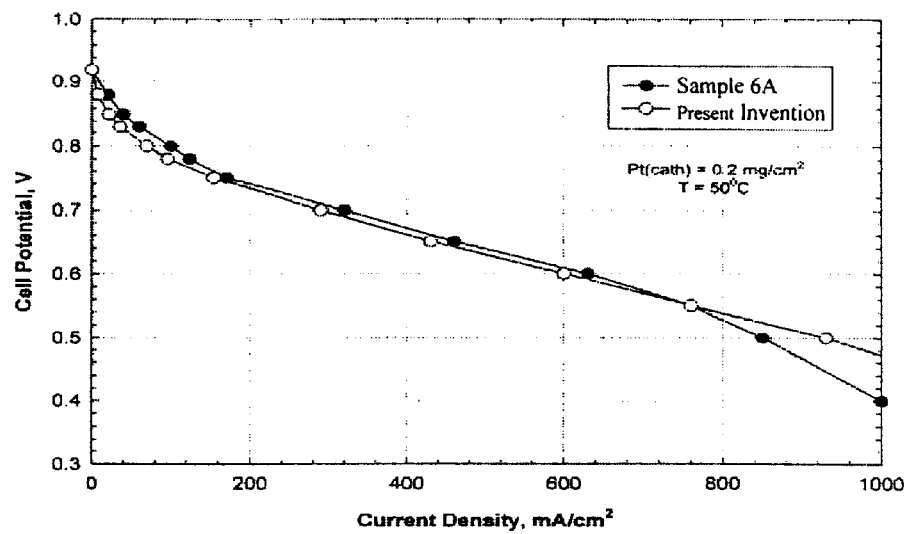
FIG. 84 illustrates the performance of membrane electrode assemblies in accordance with an embodiment of the present invention.

FIG. 84 is a comparison of the polarization curves obtained with a Pt/C catalyst of the present invention (20 weight percent Pt) with the best performing research sample known to the present inventors, a Pt-Co-Cr/C composite electrocatalyst (Sample 6A). This catalyst is applied to the electrode surface to give identical loading, measured as Pt metal per cm². Due to the amount of Pt in the electrocatalyst of the present invention, the electrode is loaded with 3-times less catalyst than the Sample 6A. The polarization curves of both electrodes practically coincide demonstrating unique matching of the performance of an advanced tri-metal composite catalyst by the simpler Pt electrocatalyst of the present invention.

Figure 85:
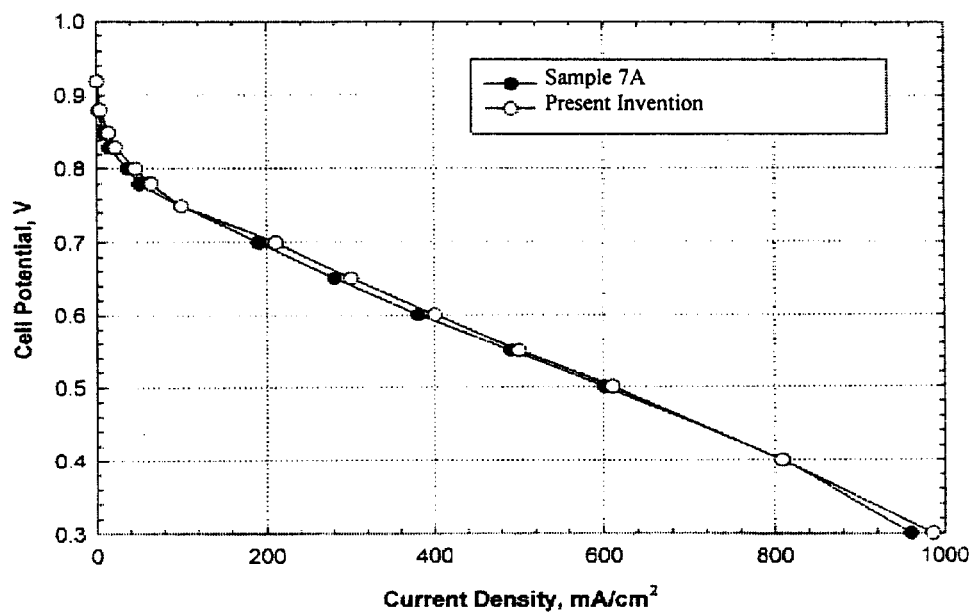
FIG. 85 illustrates the performance of membrane electrode assemblies in accordance with an embodiment of the present invention.

FIG. 85 compares the polarization curve obtained with another prior art electrocatalyst (Sample 7A) with an example of the present invention with the same Pt content. The curves are obtained with different Pt loadings of 0.21 mg/cm² for Sample 7A and 0.11 mg/cm² for the electrocatalyst of the present invention. Coinciding curves are observed when the Pt loading of the electrocatalyst of the present invention is about half of the amount of the commercial catalyst. This clearly indicates a significant commercial advantage of the present invention: the Pt/Carbon catalyst meets the same performance achieved with half of the amount of the catalyst material, thus significantly reducing the amount of Pt used with no loss in performance.

Figure 86:
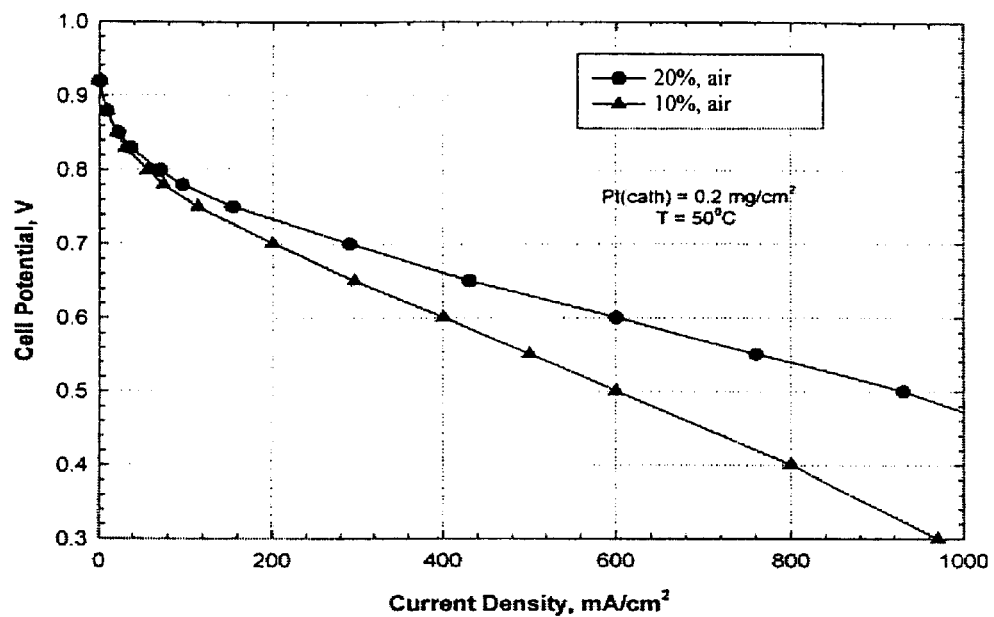
FIG. 86 illustrates the performance of membrane electrode assemblies in accordance with an embodiment of the present invention.

FIG. 86 illustrates the performance of two examples of the present invention with different Pt content when ambient air is used to feed the oxygen gas diffusion electrode in the cell. As expected, the electrocatalyst with the lower Pt content (10% Pt/Carbon) provides lower current densities compared to the one with higher metal content (20% Pt/Carbon). It should be noted, however, that the curves are obtained with electrodes that have been prepared with identical total amount of Pt. Thus, the lower Pt content sample has been applied in an amount doubling the use of the catalyst. Reduction of the electrochemical performances however, is still to the level of those obtained with the prior art electrocatalysts (compare FIG. 86 and FIG. 82). The 10% Pt/Carbon sample curve of the present invention overlaps with the 20% Pt/Carbon prior art samples.

Figure 87:
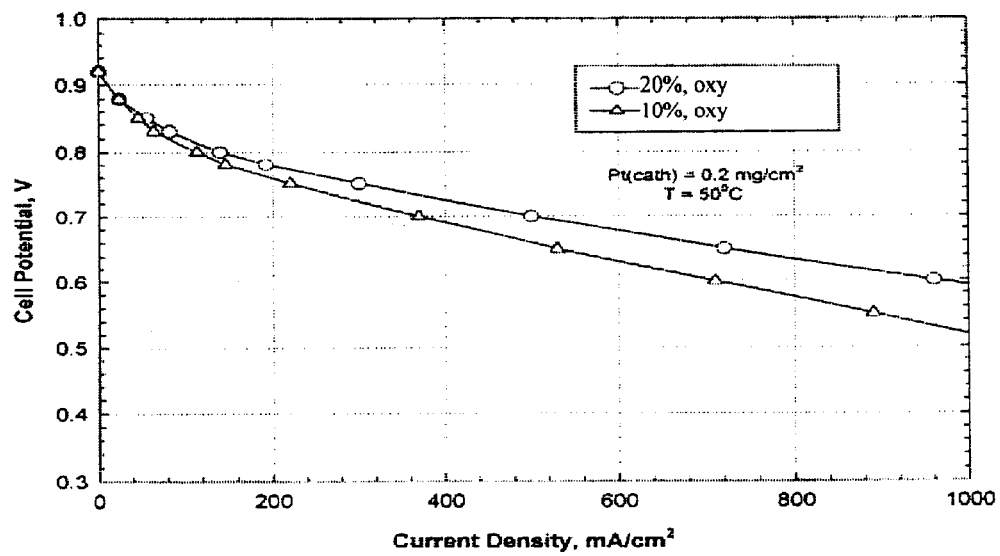
FIG. 87 illustrates the performance of membrane electrode assemblies in accordance with an embodiment of the present invention.
Figure 88:
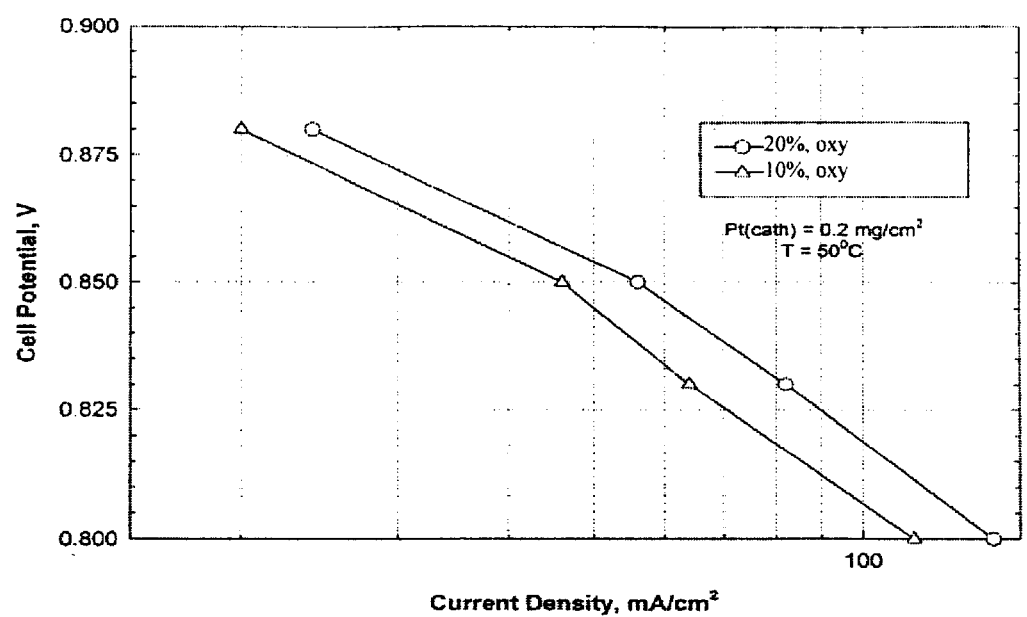
FIG. 88 illustrates the performance of membrane electrode assemblies in accordance with an embodiment of the present invention.

FIG. 87 is obtained with the same MEA as FIG. 87 and illustrates the performance of the electrocatalysts of the present invention with different Pt content when pure oxygen is used to feed the oxygen gas diffusion electrode in the cell. Flowing pure oxygen through the electrode largely eliminates the mass transport limitations, especially those associated with macro-diffusion processes. The curve obtained from the electrocatalysts with lower Pt content (10% Pt/Carbon) is shifted to approximate the one obtained from the catalyst with higher metal content (20% Pt/Carbon). Thus, FIG. 87 demonstrates that lower performance of the 10% sample (as illustrated in FIG. 86) is associated with the thickness of the catalytic layer formed when double the amount of material is used. This is confirmed by the Tafel plot of the data at low current densities (where the catalytic performance is not masked by the transport processes) as illustrated in FIG. 88.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A battery comprising an anode and a cathode, wherein said cathode comprises:
   a) a gas diffusion layer;
   b) a current collector disposed on said gas diffusion layer;
   c) a carbon conductor layer disposed on said current collector wherein said carbon conductor layer comprises carbon particles dispersed in hydrophobic matrix; and
   d) an electrocatalyst layer comprising electrocatalyst particles dispersed throughout a matrix having a lower hydrophobicity than said hydrophobic matrix,
      wherein said current collector, said carbon conductor layer and said electrocatalyst layer have a total average thickness of not greater than about 100 μm.

2. A battery as recited in claim 1, wherein said battery is a metal-air battery.

3. A battery as recited in claim 1, wherein said battery is a zinc-air battery.

4. A battery as recited in claim 1, wherein said gas diffusion layer comprises a porous tetrafluoroethylene fluorocarbon polymer.

5. A battery as recited in claim 1, wherein said current collector comprises elongated strips of a metal.

6. A battery as recited in claim 1, wherein said current collector comprises elongated strips of a metal having an average width of not greater than about 100 μm.

7. A battery as recited in claim 1, wherein said carbon particles have an average size of not greater than about 10 μm and a substantially spherical morphology.

8. A battery as recited in claim 1, wherein said hydrophobic matrix comprises a tetrafluoroethylene fluorocarbon polymer.

9. A battery as recited in claim 1, wherein said electrocatalyst particles comprise Ni—Co—O particles.

10. A battery as recited in claim 1, wherein said electrocatalyst particles comprise carbon composite particles.

11. A battery as recited in claim 1, wherein said electrocatalyst particles have an average particle size of not greater than about 10 μm and a substantially spherical morphology.

12. A battery as recited in claim 1, wherein said electrocatalyst particles have an average size of not greater than about 5 μm.

13. A battery comprising an anode and a cathode, wherein said cathode comprises:
   a) a gas diffusion layer;
   b) a current collector disposed on said gas diffusion layer;
   c) a gradient functional layer disposed over said current collector; and
   d) a separator;
      wherein said gradient functional layer comprises carbon particles and electrocatalyst particles, wherein the concentration of carbon particles relative to electrocatalyst particles through said gradient functional layer decreases from said current collector to said separator.

14. A battery as recited in claim 13, wherein said battery is a metal-air battery.

15. A battery as recited in claim 13, wherein said battery is a zinc-air battery.

16. A battery as recited in clai 13, wherein said gas diffusion layer comprises a porous tetrafluoroethylene fluorocarbon polymer.

17. A battery as recited in claim 13, wherein said current collector comprises elongated strips of a metal.

18. A battery as recited in claim 13, wherein said current collector comprises elongated strips of a metal having an average width of not greater than about 100 μm.

19. A battery as recited in claim 13, wherein said carbon particles have an average size of not greater than about 10 μm and a substantially spherical morphology.

20. A battery as recited in claim 13, wherein said gradient layer comprises a tetrafluoroethylene fluorocarbon polymer.

21. A battery as recited in claim 13, wherein said electrocatalyst particles comprise Ni—Co—O particles.

22. A battery as recited in claim 13, wherein said electrocatalyst particles comprise carbon composite particles.

23. A battery as recited in claim 13, wherein said electrocatalyst particles have an average particle size of not greater than about 10 μm and a substantially spherical morphology.

24. A battery as recited in claim 13, wherein said current collector and said gradient layer have a total average thickness of not greater than about 50 μm.

25. A battery comprising an anode and a cathode, wherein said cathode comprises:
   a) a gas diffusion layer;
   b) a current collector disposed on said gas diffusion layer;
   c) an electrocatalyst layer disposed over said current collector; and
   d) a separator;
      wherein said electrocatalyst layer comprises electrocatalyst particles in intimate electrical contact with said current collector and wherein said current collector and said electrocatalyst layer have a total average thickness of not greater than about 30 μm.

26. A battery as recited in claim 25, wherein said battery is a metal-air battery.

27. A battery as recited in claim 25, wherein said battery is a zinc-air battery.

28. A battery as recited in claim 25, wherein said gas diffusion layer comprises a porous tetrafluoroethylene fluorocarbon polymer.

29. A battery as recited in claim 25, wherein said current collector comprises elongated strips of a metal.

30. A battery as recited in claim 25, wherein said current collector comprises elongated strips of a metal wherein said elongated strips have an average width of not greater than about 100 μm.

31. A battery as recited in claim 25, wherein said electrocatalyst layer comprise a tetrafluoroethylene fluorocarbon polymer matrix.

32. A battery as recited in claim 25, wherein said electrocatalyst particles comprise Ni—Co—O particles.

33. A battery as recited in claim 25, wherein said electrocatalyst particles have an average particle size of not greater than about 10 μm and a substantially spherical morphology.

* * * * *